US008513717B2

(12) United States Patent
Masuoka et al.

(10) Patent No.: US 8,513,717 B2
(45) Date of Patent: Aug. 20, 2013

(54) SEMICONDUCTOR DEVICE AND METHOD FOR MANUFACTURING THE SAME

(75) Inventors: Fujio Masuoka, Tokyo (JP); Hiroki Nakamura, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 102 days.

(21) Appl. No.: 13/328,574

(22) Filed: Dec. 16, 2011

(65) Prior Publication Data

US 2012/0181618 A1    Jul. 19, 2012

Related U.S. Application Data

(60) Provisional application No. 61/433,665, filed on Jan. 18, 2011.

(51) Int. Cl.
*H01L 29/76* (2006.01)
*H01L 31/062* (2012.01)
*H01L 29/94* (2006.01)
*H01L 31/113* (2006.01)
*H01L 31/119* (2006.01)

(52) U.S. Cl.
USPC .... 257/288; 257/350; 257/376; 257/E21.006; 257/E21.058; 257/E21.231; 257/E21.248; 257/E21.275; 257/E21.37; 257/E21.378

(58) Field of Classification Search
USPC ............... 257/288, 204, 350, 341, 344, 369, 257/372, 376, 607, E21.006, E21.058, E21.231, 257/E21.248, E21.275, E21.37, E21.378
See application file for complete search history.

(56) References Cited

U.S. PATENT DOCUMENTS

| 6,198,139 | B1 * | 3/2001 | Ishida ........................... 257/372 |
| 6,809,336 | B2 * | 10/2004 | Kunikiyo et al. ............... 257/66 |
| 2003/0045064 | A1 * | 3/2003 | Kunikiyo et al. ............. 438/309 |
| 2008/0224196 | A1 | 9/2008 | Higashino et al. |

FOREIGN PATENT DOCUMENTS

| EP | 2239771 A1 | 10/2010 |
| JP | 02-071556 A | 3/1990 |
| JP | 02-188966 A | 7/1990 |

(Continued)

OTHER PUBLICATIONS

Kawasaki, H. et al., "Demonstration of Highly Scaled FinFET SRAM Cells with High-κ/Metal Gate and Investigation of Characteristic Variability for the 32 nm node and beyond," IEDM, IEEE, 2008, pp. 237-240.

*Primary Examiner* — David Nhu
(74) *Attorney, Agent, or Firm* — Brinks Hofer Gilson & Lione

(57) ABSTRACT

A first driver transistor includes a first gate insulating film that surrounds a periphery of a first island-shaped semiconductor, a first gate electrode having a first surface that is in contact with the first gate insulating film, and first and second first-conductivity-type high-concentration semiconductors disposed on the top and bottom of the first island-shaped semiconductor, respectively. A first load transistor includes a second gate insulating film having a first surface that is in contact with a second surface of the first gate electrode, a first arcuate semiconductor formed so as to be in contact with a portion of a second surface of the second gate insulating film, and first and second second-conductivity-type high-concentration semiconductors disposed on the top and bottom of the first arcuate semiconductor, respectively. A first gate line extends from the first gate electrode and is made of the same material as the first gate electrode.

24 Claims, 62 Drawing Sheets

(56) References Cited

FOREIGN PATENT DOCUMENTS

| | | |
|---|---|---|
| JP | 03-145761 A | 6/1991 |
| JP | 03-225873 A | 10/1991 |
| JP | 2008-205168 A | 9/2008 |
| JP | 2008-227344 A | 9/2008 |
| JP | 2009-182317 A | 8/2009 |
| JP | 2010-245293 A | 10/2010 |
| JP | 2010-283351 A | 12/2010 |
| WO | WO 2009/060934 A1 | 5/2009 |
| WO | WO 2009/095998 A1 | 8/2009 |
| WO | WO 2009/122579 A1 | 10/2009 |

* cited by examiner

SEMICONDUCTOR DEVICE AND METHOD FOR MANUFACTURING THE SAME

RELATED APPLICATIONS

Pursuant to 35 U.S.C. §119(e), this application claims the benefit of the filing date of Provisional U.S. Patent Application Ser. No. 61/433,665 filed on Jan. 18, 2011. The entire content of this application is hereby incorporated by reference.

BACKGROUND OF THE INVENTION

1. Field of the Invention

The present invention relates to a semiconductor device.

2. Description of the Related Art

The degree of integration of semiconductor integrated circuits, namely, integrated circuits using metal oxide semiconductor (MOS) transistors, has been increasing. The increasing degree of integration of such integrated circuits results in MOS transistors used therein having small sizes reaching nano-scale dimensions. Inverter circuits are fundamental circuits of digital circuits, and the increasing decrease in the size of MOS transistors included in inverter circuits causes difficulty in suppressing leak currents, leading to problems of reduced reliability due to hot carrier effects and of the reduction in the area of the circuits being prevented because of the requirements of the secure retention of necessary currents. To overcome the above problems, a surrounding gate transistor (SGT) having a structure in which a source, gate, and drain are arranged vertically with respect to a substrate and in which the gate surrounds an island-shaped semiconductor layer has been proposed (for example, Japanese Unexamined Patent Application Publications No. 2-71556, No. 2-188966, and No. 3-145761).

Further, an SGT manufacturing method has been proposed (Japanese Unexamined Patent Application Publication No. 2009-182317) which includes, in sequence, forming a pillar-shaped semiconductor layer, depositing a gate conductive film over the pillar-shaped semiconductor layer, planarizing the gate conductive film, etching back the gate conductive film to a desired length by using hard mask as a planarization stopper; forming an insulating film sidewall, patterning a gate line, and etching the gate conductive film. A hard mask is used as a planarization stopper, which can result in the uniformity of the gate length across a wafer surface. In this SGT manufacturing method which enables high yield with a high degree of integration and high performance, the upper surface of a gate electrode of an SGT is positioned lower than the upper surface of a pillar-shaped semiconductor layer.

Meanwhile, a complementary metal oxide semiconductor (CMOS) structure for increasing the degree of integration in a CMOS inverter has been proposed in which a gate electrode is formed around an island-shaped semiconductor to construct an n-channel MOS (NMOS) transistor and a cylindrical semiconductor layer is further formed around the gate electrode to construct a p-channel MOS (PMOS) transistor (Japanese Unexamined Patent Application Publication No. 3-225873). In the CMOS structure disclosed in Japanese Unexamined Patent Application Publication No. 3-225873, since the gate electrode is surrounded by the island-shaped semiconductor and the cylindrical semiconductor layer, a gate line made of the same material as the gate electrode is provided over the cylindrical semiconductor layer to apply voltage to the gate electrode. Therefore, as depicted in FIG. 6 in Japanese Unexamined Patent Application Publication No. 3-225873, the upper surface of the gate electrode is positioned higher than the upper surface of the cylindrical semiconductor layer. That is, it is difficult to use the manufacturing method disclosed in Japanese Unexamined Patent Application Publication No. 2009-182317 described above.

It is also known that in a static memory cell, the current driving force of a driver transistor is made double the current driving force of an access transistor to ensure operational stability (H. Kawasaki, M. Khater, M. Guillorn, N. Fuller, J. Chang, S. Kanakasabapathy, L. Chang, R. Muralidhar, K. Babich, Q. Yang, J. Ott, D. Klaus, E. Kratschmer, E. Sikorski, R. Miller, R. Viswanathan, Y. Zhang, J. Silverman, Q. Ouyang, A. Yagishita, M. Takayanagi, W. Haensch, and K. Ishimaru, "Demonstration of Highly Scaled FinFET SRAM Cells with High-κ/Metal Gate and Investigation of Characteristic Variability for the 32 nm node and beyond", IEDM, pp. 237-240, 2008).

To construct a static memory cell using an NMOS SGT access transistor and also using a CMOS structure in which a gate electrode is formed around an island-shaped semiconductor layer to construct an NMOS SGT driver transistor and a cylindrical semiconductor layer is further formed around the gate electrode to construct a PMOS load transistor, two driver transistors are used because the gate width needs to be doubled in order to make the current driving force of a driver transistor double the current driving force of an access transistor to ensure operational stability. This leads to an increase in memory cell area.

Additionally, the increasing decrease in the size of static memory cells reduces the gate capacitance or diffusion layer capacitance of a MOS transistor to be connected to a storage node because of the reduction in dimensions. In this case, if the static memory cell is irradiated with radiation from the outside, electron-hole pairs are generated in a semiconductor substrate along the path of radiation, and at least the electrons or holes of the electron-hole pairs flow into a diffusion layer that forms the drain, causing data inversion. Thus, a soft-error phenomenon occurs in that data cannot be correctly held. The soft-error phenomenon has become a serious problem in recent static memory cells whose sizes have been reduced because as the decrease in the size of memory cells increases, the reduction in the gate capacitance or diffusion layer capacitance of the MOS transistor to be connected to the storage node becomes more noticeable than the electron-hole pairs generated by radiation. Therefore, it has been reported that a capacitor is formed in a storage node of a static memory cell to ensure sufficient electrical charges in the storage node so that the occurrence of soft errors can be avoided to ensure operational stability (Japanese Unexamined Patent Application Publication No. 2008-227344).

SUMMARY OF THE INVENTION

Accordingly, the present invention provides a high-degree-of-integration, operational stability-secured static memory cell using an SGT.

In an aspect of the present invention, a semiconductor device includes a first inverter disposed in a first row and a first column, a second inverter disposed in a second row and a second column, a second access transistor disposed in the first row and the second column, and a first access transistor disposed in the second row and the first column. The first inverter includes a first driver transistor, a first load transistor, and a first gate line. The first driver transistor includes a first gate insulating film that surrounds a periphery of a first island-shaped semiconductor; a first gate electrode having a first surface that is in contact with the first gate insulating film; a first first-conductivity-type high-concentration semiconductor disposed on the top of the first island-shaped semiconductor; and a second first-conductivity-type high-concentration semiconductor disposed on the bottom of the first island-shaped semiconductor. The first load transistor includes a second gate insulating film having a first surface that is in contact with a second surface of the first gate electrode; a first arcuate semiconductor which is arcuate when viewed in plan and which is formed so as to be in contact with a portion of a second surface of the second gate insulating film; a first second-conductivity-type high-concentration semiconductor disposed on the top of the first arcuate semiconductor; and a second second-conductivity-type high-concentration semiconductor disposed on the bottom of the first arcuate semiconductor. The first gate line extends from the first gate electrode and is made of a material that is the same as a material of the first gate electrode. The second inverter includes a second driver transistor, a second load transistor, and a second gate line. The second driver transistor includes a third gate insulating film that surrounds a periphery of a second island-shaped semiconductor; a second gate electrode having a first surface that is in contact with the third gate insulating film; a third first-conductivity-type high-concentration semiconductor disposed on the top of the second island-shaped semiconductor; and a fourth first-conductivity-type high-concentration semiconductor disposed on the bottom of the second island-shaped semiconductor. The second load transistor includes a second arcuate semiconductor which is arcuate when viewed in plan and which is formed so as to be in contact with a portion of a second surface of a fourth gate insulating film having a first surface that is in contact with a second surface of the second gate electrode; a third second-conductivity-type high-concentration semiconductor disposed on the top of the second arcuate semiconductor; and a fourth second-conductivity-type high-concentration semiconductor disposed on the bottom of the second arcuate semiconductor. The second gate line extends from the second gate electrode and is made of a material that is the same as a material of the second gate electrode. The second access transistor includes a fifth gate insulating film provided around a periphery of a third island-shaped semiconductor, the fifth gate insulating film being in contact with at least a portion of the periphery of the third island-shaped semiconductor; a third gate electrode, a portion of which is in contact with the fifth gate insulating film; a fifth first-conductivity-type high-concentration semiconductor disposed on the top of the third island-shaped semiconductor; and a sixth first-conductivity-type high-concentration semiconductor disposed on the bottom of the third island-shaped semiconductor. The first access transistor includes a sixth gate insulating film provided around a periphery of a fourth island-shaped semiconductor, the sixth gate insulating film being in contact with at least a portion of the periphery of the fourth island-shaped semiconductor; a fourth gate electrode, a portion of which is in contact with the sixth gate insulating film; a seventh first-conductivity-type high-concentration semiconductor disposed on the top of the fourth island-shaped semiconductor; and an eighth first-conductivity-type high-concentration semiconductor disposed on the bottom of the fourth island-shaped semiconductor. An upper surface of the first gate line is positioned lower than an upper end of the first second-conductivity-type high-concentration semiconductor. An upper surface of the second gate line is positioned lower than an upper end of the third second-conductivity-type high-concentration semiconductor. A length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor.

Preferably, a chord of the first arcuate semiconductor has a length equal to or shorter than a diameter of the first gate electrode, and a chord of the second arcuate semiconductor has a length equal to or shorter than a diameter of the second gate electrode.

Preferably, a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor.

Preferably, a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

Preferably, a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

Preferably, the first, second, third, and fourth gate electrodes are of equal length from upper ends to lower ends thereof.

Preferably, an upper end of the second first-conductivity-type high-concentration semiconductor of the first driver transistor and an upper end of the fourth first-conductivity-type high-concentration semiconductor of the second driver transistor are positioned higher than an upper end of the eighth first-conductivity-type high-concentration semiconductor of the first access transistor and an upper end of the sixth first-conductivity-type high-concentration semiconductor of the second access transistor.

Preferably, a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

Preferably, an upper end of the second first-conductivity-type high-concentration semiconductor of the first driver transistor and an upper end of the fourth first-conductivity-type high-concentration semiconductor of the second driver transistor are positioned higher than an upper end of the eighth first-conductivity-type high-concentration semiconductor of the first access transistor and an upper end of the sixth first-conductivity-type high-concentration semiconductor of the second access transistor. Further, preferably, a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

Preferably, a peripheral length of the fourth island-shaped semiconductor of the first access transistor and a peripheral length of the third island-shaped semiconductor of the second access transistor are shorter than a peripheral length of the first island-shaped semiconductor of the first driver transistor and a peripheral length of the second island-shaped semiconductor of the second driver transistor.

Preferably, the second gate insulating film surrounds the first arcuate semiconductor, and the first gate electrode surrounds the second gate insulating film. Further, preferably, the forth gate insulating film 112 surrounds the second arcuate semiconductor, and the second gate electrode surrounds the fourth gate insulating film 112.

Preferably, a chord of the first arcuate semiconductor has a length equal to or shorter than a diameter of the first gate electrode, and a chord of the second arcuate semiconductor has a length equal to or shorter than a diameter of the second gate electrode.

Preferably, a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor.

Preferably, a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor.

Preferably, a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

Preferably, a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

Preferably, the first, second, third, and fourth gate electrodes are of equal length from upper ends to lower ends thereof.

Preferably, an upper end of the second first-conductivity-type high-concentration semiconductor of the first driver transistor and an upper end of the fourth first-conductivity-type high-concentration semiconductor of the second driver transistor are positioned higher than an upper end of the eighth first-conductivity-type high-concentration semiconductor of the first access transistor and an upper end of the sixth first-conductivity-type high-concentration semiconductor of the second access transistor.

Preferably, a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

Preferably, an upper end of the second first-conductivity-type high-concentration semiconductor of the first driver transistor and an upper end of the fourth first-conductivity-type high-concentration semiconductor of the second driver transistor is positioned higher than an upper end of the eighth first-conductivity-type high-concentration semiconductor of the first access transistor and an upper end of the sixth first-conductivity-type high-concentration semiconductor of the second access transistor. Further, preferably, a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

Preferably, a peripheral length of the fourth island-shaped semiconductor of the first access transistor and a peripheral length of the third island-shaped semiconductor of the second access transistor are shorter than a peripheral length of the first island-shaped semiconductor of the first driver transistor and a peripheral length of the second island-shaped semiconductor of the second driver transistor.

Preferably, the first inverter further includes, in addition to the first driver transistor including the first island-shaped semiconductor, a third driver transistor including a third arcuate semiconductor which is arcuate when viewed in plan. Further, preferably, the second inverter further includes, in addition to the second driver transistor including the second island-shaped semiconductor, a fourth driver transistor including a fourth arcuate semiconductor which is arcuate when viewed in plan.

In another aspect of the present invention, a method for manufacturing the above semiconductor device includes, in sequence, fowling the second first-conductivity-type high-concentration semiconductor of the first driver transistor and the fourth first-conductivity-type high-concentration semiconductor of the second driver transistor, and forming the eighth first-conductivity-type high-concentration semiconductor of the first access transistor and the sixth first-conductivity-type high-concentration semiconductor of the second access transistor.

In another aspect of the present invention, a method for manufacturing the above semiconductor device includes forming the first first-conductivity-type high-concentration semiconductor of the first driver transistor and the third first-conductivity-type high-concentration semiconductor of the second driver transistor, and forming the seventh first-conductivity-type high-concentration semiconductor of the first access transistor and the fifth first-conductivity-type high-concentration semiconductor of the second access transistor, wherein energy of ion implantation for forming the first first-conductivity-type high-concentration semiconductor of the first driver transistor and the third first-conductivity-type high-concentration semiconductor of the second driver transistor is higher than energy of ion implantation for forming the seventh first-conductivity-type high-concentration semiconductor of the first access transistor and the fifth first-conductivity-type high-concentration semiconductor of the second access transistor.

According to the present invention, a static memory cell is constructed using an NMOS SGT access transistor and also using a CMOS structure in which a gate electrode is formed around an island-shaped semiconductor to construct an NMOS SGT driver transistor and an arcuate semiconductor that is arcuate when viewed in plan is further formed around the gate electrode to construct a PMOS load transistor. Therefore, a high-degree-of-integration static memory cell can be provided. Since the upper surface of a first gate line can be positioned lower than the upper end of a first second-conductivity-type high-concentration semiconductor and the upper surface of a second gate line can be positioned lower than the upper end of a third second-conductivity-type high-concentration semiconductor, the manufacturing method disclosed in Japanese Unexamined Patent Application Publication No. 2009-182317 can be used. Also, a hard mask is used as a planarization stopper, which can result in the uniformity of the gate length across a wafer surface. Additionally, the channel length of the driver transistor can be made shorter than the channel length of the access transistor, and an operational stability-secured static memory cell and a method for manufacturing the same can be provided.

DETAILED DESCRIPTION OF THE PREFERRED EMBODIMENTS

Embodiments of the present invention will be described hereinafter with reference to the drawings. It is to be understood that the present invention is not to be limited to the following embodiments.

Figure 1:
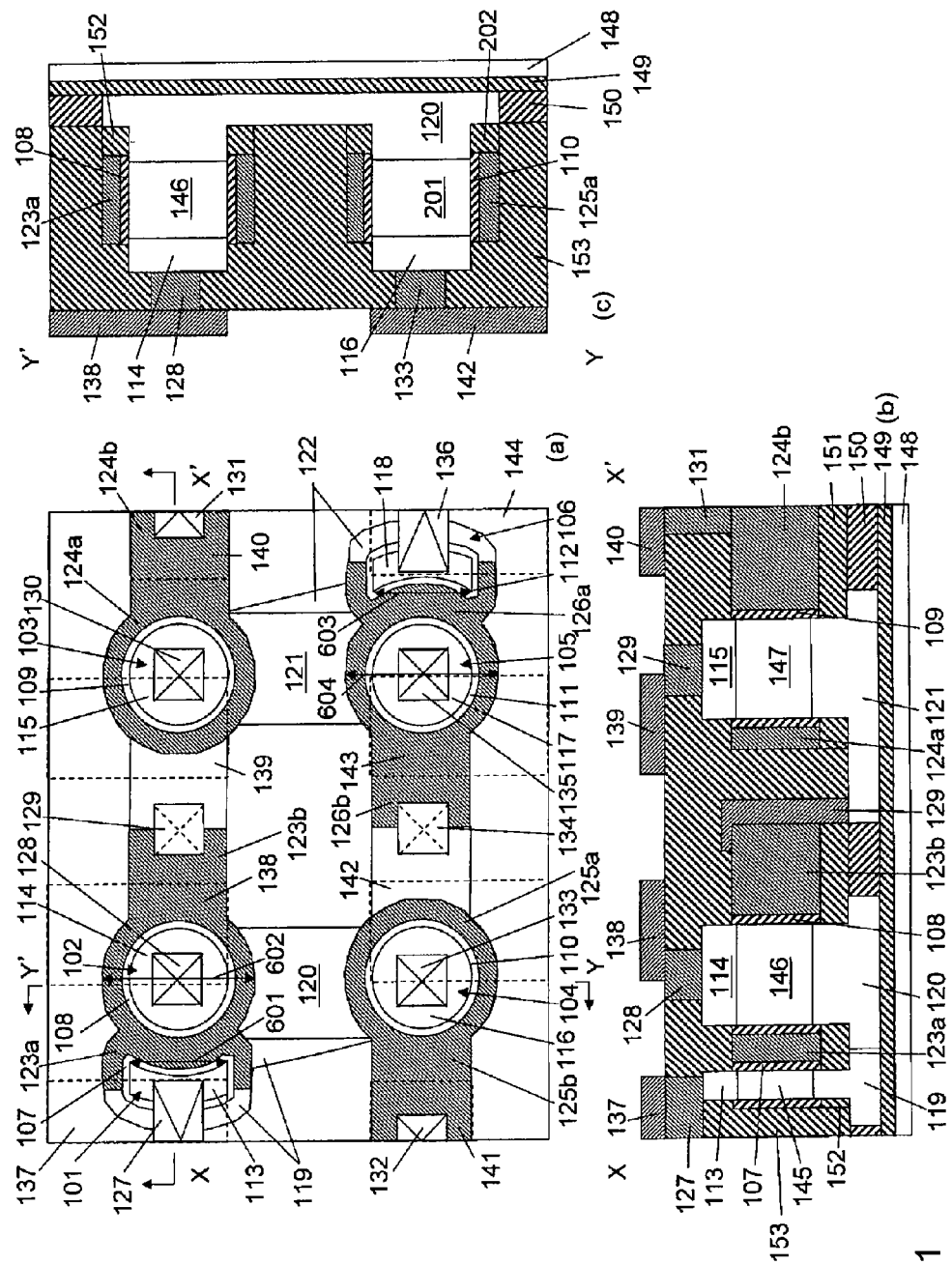
FIG. 1A is a plan view of a static memory cell according to an embodiment of the present invention.
FIG. 1B is a cross-sectional view taken along line X-X' in FIG. 1A.
FIG. 1C is a cross-sectional view taken along line Y-Y' in FIG. 1A.

FIG. 1A is a plan view of a static memory cell according to an embodiment of the present invention, FIG. 1B is a cross-sectional view taken along line X-X' in FIG. 1A, and FIG. 1C is a cross-sectional view taken along line Y-Y' of the static memory cell illustrated in FIG. 1A.

The static memory cell illustrated in FIGS. 1A to 1C includes a first inverter disposed in a first row and a first column, a second inverter disposed in a second row and a second column, a second access transistor 103 disposed in the first row and the second column, and a first access transistor 104 disposed in the second row and the first column. The first inverter includes a first driver transistor 102, a first load transistor 101, and a first gate line 123b. The first driver transistor 102 includes a first gate insulating film 108 that surrounds the periphery of a first island-shaped silicon layer 146; a first gate electrode 123a having a first surface that is in contact with the first gate insulating film 108; a first n+ silicon layer 114 disposed on the top of the first island-shaped silicon layer 146; and a second n+ silicon layer 120 disposed on the bottom of the first island-shaped silicon layer 146. The first load transistor 101 includes a second gate insulating film 107 having a first surface that is in contact with a second surface of the first gate electrode 123a; a first arcuate silicon layer 145 which is arcuate when viewed in plan and which is formed so as to be in contact with a portion of a second surface of the second gate insulating film 107; a first p+ silicon layer 113 disposed on the top of the first arcuate silicon layer 145; and a second p+ silicon layer 119 disposed on the bottom of the first arcuate silicon layer 145. The first gate line 123b extends from the first gate electrode 123a and is made of the same material as the first gate electrode 123a. The second inverter includes a second driver transistor 105, a second load transistor 106, and a second gate line 126b. The second driver transistor 105 includes a third gate insulating film 111 that surrounds the periphery of a second island-shaped silicon layer; a second gate electrode 126a having a first surface that is in contact with the third gate insulating film 111; a third n+ silicon layer 117 disposed on the top of the second island-shaped silicon layer; and a fourth n+ silicon layer 121 disposed on the bottom of the second island-shaped silicon layer. The second load transistor 106 includes a second arcuate silicon layer which is arcuate when viewed in plan and which is formed so as to be in contact with a portion of a second surface of a fourth gate insulating film 112 having a first surface that is in contact with a second surface of the second gate electrode 126a; a third p+ silicon layer 118 disposed on the top of the second arcuate silicon layer; and a fourth p+ silicon layer 122 disposed on the bottom of the second arcuate silicon layer. The second gate line 126b extends from the second gate electrode 126a and is made of the same material as the second gate electrode 126a. The second access transistor 103 includes a fifth gate insulating film 109 provided around the periphery of a third island-shaped silicon layer 14, the fifth gate insulating film 109 being in contact with at least a portion of the periphery of the third island-shaped silicon layer 147; a third gate electrode 124a, a portion of which is in contact with the fifth gate insulating film 109; a fifth n+ silicon layer 115 disposed on the top of the third island-shaped silicon layer 147; and a sixth n+ silicon layer 121 disposed on the bottom of the third island-shaped silicon layer 147. The first access transistor 104 includes a sixth gate insulating film 110 provided around the periphery of a fourth island-shaped silicon layer 201, the sixth gate insulating film 110 being in contact with at least a portion of the periphery of the fourth island-shaped silicon layer 201; a fourth gate electrode 125a, a portion of which is in contact with the sixth gate insulating film 110; a seventh n+ silicon layer 116 disposed on the top of the fourth island-shaped silicon layer 201; and an eighth n+ silicon layer 120 disposed on the bottom of the fourth island-shaped silicon layer 201. An upper surface of the first gate line 123b is positioned lower than an upper end of the first p+ silicon layer 113, and an upper surface of the second gate line 126b is positioned lower than an upper end of the third p+ silicon layer 118.

A static memory cell is constructed using an NMOS SGT access transistor and also using a CMOS structure in which a gate electrode is formed around an island-shaped silicon layer to construct an NMOS SGT driver transistor and an arcuate silicon layer is further formed around the gate electrode to construct a PMOS load transistor. Therefore, a high-degree-of-integration static memory cell can be provided. This is because since the arcuate silicon layer can be produced using a self-aligning process from the shape of the island-shaped silicon layer, the arcuate silicon layer and the island-shaped silicon layer can be disposed in close proximity to each other. Further, since the upper surface of the first gate line 123b can be positioned lower than the upper end of the first p+ silicon layer 113, and the upper surface of the second gate line 126b can be positioned lower than the upper end of the third p+ silicon layer 118, the manufacturing method disclosed in Japanese Unexamined Patent Application Publication No. 2009-182317 can be used. Also, a hard mask is used as a planarization stopper, which can result in the uniformity of the gate length across a wafer surface.

Furthermore, the length 601 of the chord of the first arcuate silicon layer 145 is made equal to or shorter than the diameter 602 of the first gate electrode 123a, and the length 603 of the chord of the second arcuate silicon layer is made equal to or shorter than the diameter 604 of the second gate electrode 126a. Thus, the maximum widths of the first inverter and the second inverter are equal to or shorter than the diameter of the first gate electrode 123a and the diameter of the second gate electrode 126a, respectively. This prevents the lengths of the first inverter and the second inverter at least in the column direction or the row direction from being larger than the diameter 602 of the first gate electrode 123a and the diameter 604 of the second gate electrode 126a, respectively, which has significant influence on the reduction in the size of a static random access memory (SRAM) cell.

A gate line 125b extends from the fourth gate electrode 125a and is made of the same material as the fourth gate electrode 125a, and a gate line 124b extends from the third gate electrode 124a and is made of the same material as the third gate electrode 124a. The upper surfaces of the gate lines 124b and 125b are also positioned lower than the upper end of the first p+ silicon layer 113 and the upper end of the third p+ silicon layer 118, respectively. Therefore, the manufacturing method disclosed in Japanese Unexamined Patent Application Publication No. 2009-182317 can be used. Also, a hard mask is used as a used as a planarization stopper, which can result in the uniformity of the gate length across a wafer surface.

Figure 6:
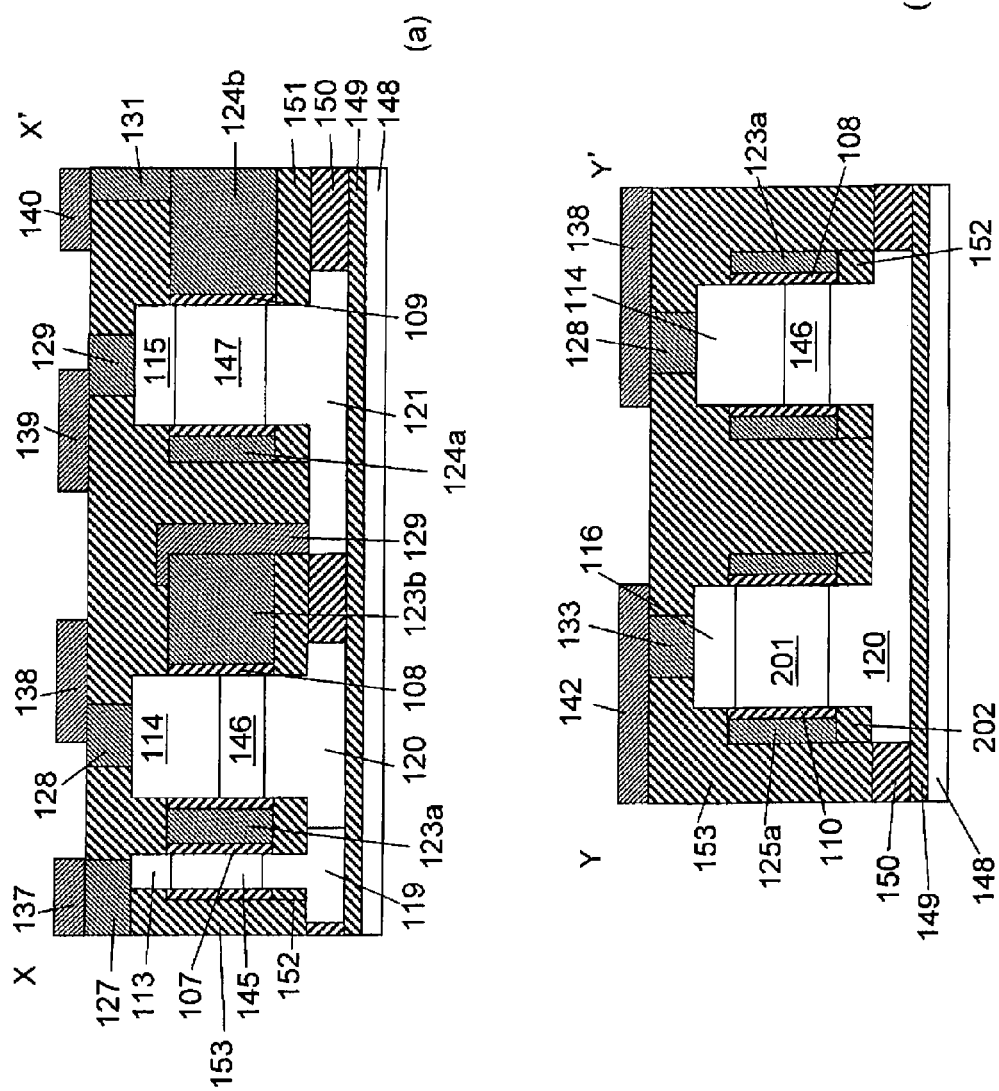
FIG. 6A is a cross-sectional view taken along line X-X' of a static memory cell according to an embodiment of the present invention.
FIG. 6B is a cross-sectional view taken along line Y-Y' of the static memory cell according to the embodiment of the present invention.

Furthermore, as illustrated in FIG. 1B, the n+ silicon layer 120 and the p+ silicon layer 119 adjoin each other in a portion where no gate electrode or gate line exists. Adjoining each other in a portion where no gate electrode or gate line exists, the n+ silicon layer 120 and the p+ silicon layer 119 are connected via a silicide layer (not illustrated). In FIG. 6 in Japanese Unexamined Patent Application Publication No. 3-225873, due to the cylindrical shape, it is difficult to connect a lower n+silicon layer and a lower p+silicon layer via a silicide layer. Also, the n+ silicon layer 121 and the p+ silicon layer 122 are connected via a silicide layer (not illustrated).

Further, the gate line 123b and the n+ silicon layer 121 are connected via a contact 129. Preferably, the upper surface of the contact 129 is located at a position lower than the lower surfaces of metal lines 138 and 139. Because of being positioned lower than the lower surfaces of the metal lines 138 and 139, the contact 129 and the metal lines 138 and 139 are disconnected from each other. Thus, the metal lines 138 and 139 can be placed adjacent to each other. Further, the gate line 126b and the n+ silicon layer 120 are connected via a contact 134.

A contact 127 is formed on the p+ silicon layer 113. Preferably, the contact 127 is also connected to the p+ silicon layer of an adjacent cell in order to reduce the number of contacts. A contact 136 is formed on the p+ silicon layer 118.

A contact 128 is formed on the n+ silicon layer 114, and a contact 135 is formed on the n+ silicon layer 117. A contact 130 is formed on the n+ silicon layer 115, and a contact 133 is formed on the n+ silicon layer 116. A contact 131 is formed on the gate line 124b, and a contact 132 is formed on the gate line 125b.

A metal line 137 is formed on the contact 127, and the metal line 138 is formed on the contact 128. The metal line 139 is formed on the contact 129, and a metal line 140 is formed on the contact 131. A metal line 141 is formed on the contact 132, and a metal line 142 is formed on the contact 133. A metal line 143 is formed on the contact 135, and a metal line 144 is formed on the contact 136. Here, the contact 128 is connected to the metal line 138 by an amount equal to half the area of the upper surface of the contact 128. The contact 130 is connected to the metal line 139 by an amount equal to half the area of the upper surface of the contact 130. This increases the density of metal lines, and enables an increase in the degree of integration.

An element separation film 150 is formed between elements, and insulating films 152, 151, and 202 are formed underneath the gate electrodes 123a, 126a, 124a, and 125a and the gate lines 123b, 126b, 124b, and 125b. An interlayer film 153 is further formed.

Figure 2:
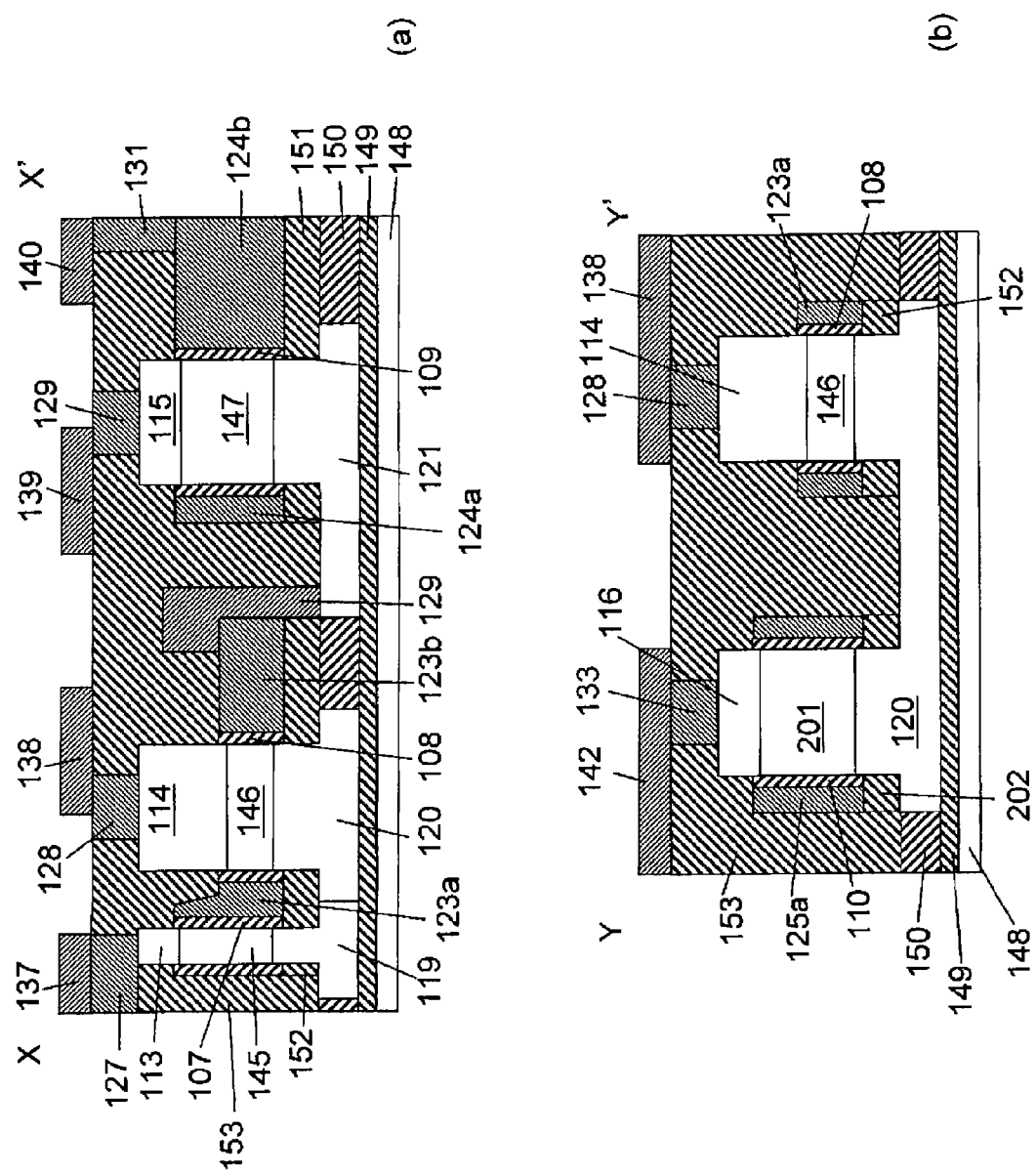
FIG. 2A is a cross-sectional view taken along line X-X' of a static memory cell according to an embodiment of the present invention.
FIG. 2B is a cross-sectional view taken along line Y-Y' of the static memory cell according to the embodiment of the present invention.

FIGS. 2A and 2B are cross-sectional views of a static memory cell according to a second embodiment of the present invention. Since the plan view of this embodiment is the same as the plan view (FIG. 1A) of the first embodiment, the plan view of this embodiment is not illustrated. FIG. 2A is a cross-sectional view taken line X-X' in the plan view (not illustrated), and FIG. 2B is a cross-sectional view taken line Y-Y' in the plan view (not illustrated).

In this embodiment, the length of a portion between the first n+ silicon layer 114 and the second n+ silicon layer 120 of the first driver transistor 102 and the length of a portion between the third n+ silicon layer 117 and the fourth n+ silicon layer 121 of the second driver transistor 105 are shorter than the length of a portion between the seventh n+ silicon layer 116 and the eighth n+ silicon layer 120 of the first access transistor 104 and the length of a portion between the fifth n+ silicon layer 115 and the sixth n+ silicon layer 121 of the second access transistor 103.

Therefore, the channel length of a driver transistor can be made shorter than the channel length of an access transistor without increasing the area, resulting in an operational stability-secured static memory cell being provided. In the second embodiment, the height of the gate electrode 123a and the gate line 123b of the driver transistor 102 is lower than that of the gate electrodes 125a and 124a and the gate line 124b. The above shape can be formed using the manufacturing method disclosed in Japanese Unexamined Patent Application Publication No. 2009-182317, by using a hard mask as a planarization stopper, making the gate length uniform across a wafer surface, and then etching portions of the gate electrode 123a and the gate line 123b near the driver transistor 102. In addition, the gate length of a driver transistor can be made shorter than the gate length of a load transistor.

Figure 3:
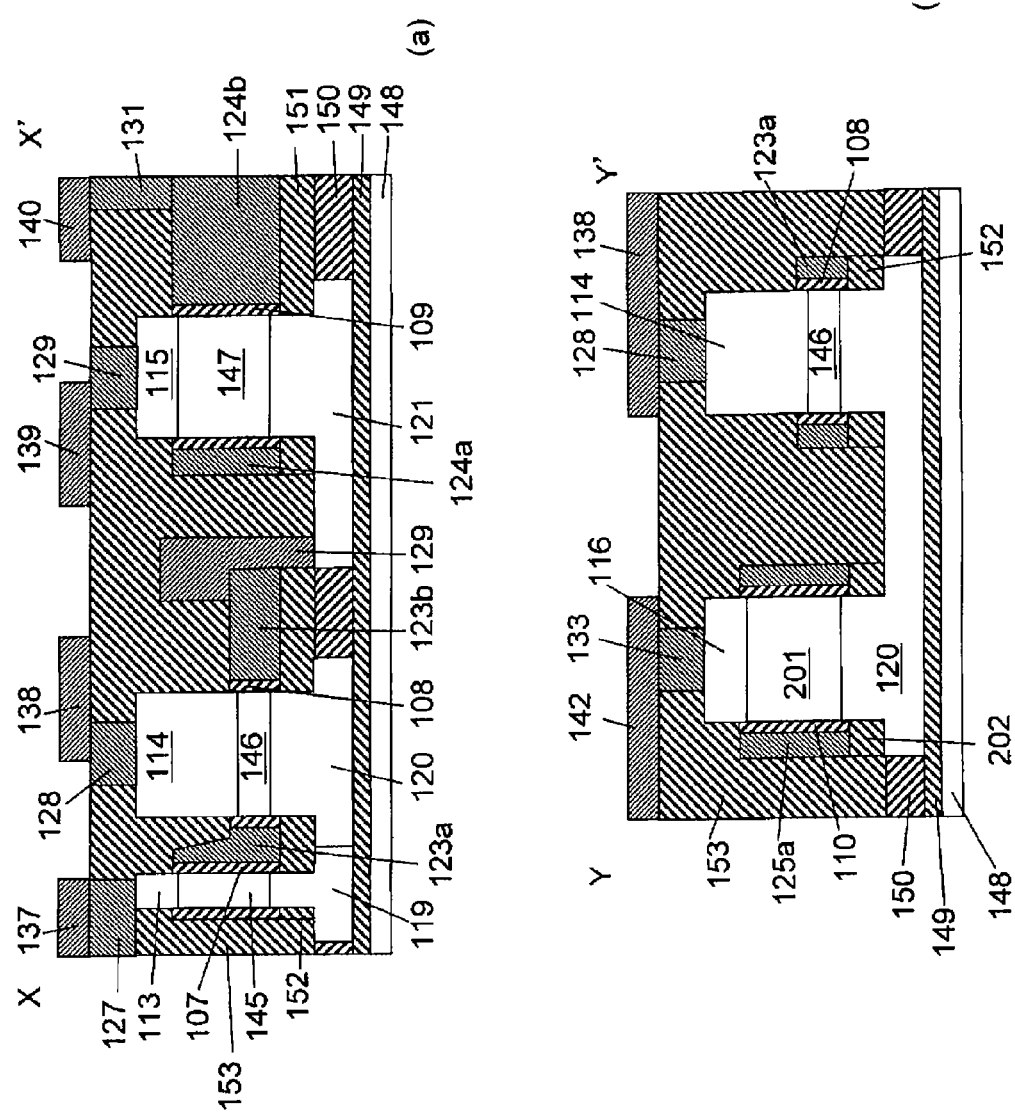
FIG. 3A is a cross-sectional view taken along line X-X' of a static memory cell according to an embodiment of the present invention.
FIG. 3B is a cross-sectional view taken along line Y-Y' of the static memory cell according to the embodiment of the present invention.

FIGS. 3A and 3B are cross-sectional views of a static memory cell according to a third embodiment of the present invention. Since the plan view of this embodiment is the same as the plan view (FIG. 1A) of the first and second embodiments, the plan view of this embodiment is not illustrated. FIG. 3A is a cross-sectional view taken along line X-X' in the plan view (not illustrated), and FIG. 3B is a cross-sectional view taken along line Y-Y' in the plan view (not illustrated).

In this embodiment, the length of a portion between the seventh n+ silicon layer 116 and the eighth n+ silicon layer 120 of the first access transistor 104 and the length of a portion between the fifth n+ silicon layer 115 and the sixth n+ silicon layer 121 of the second access transistor 103 are three times the length of a portion between the first n+ silicon layer 114 and the second n+ silicon layer 120 of the first driver transistor 102 and the length of a portion between the third n+ silicon layer 117 and the fourth n+ silicon layer 121 of the second driver transistor 105. In addition, the gate length of a load transistor is three times the gate length of a driver transistor.

Figure 4:
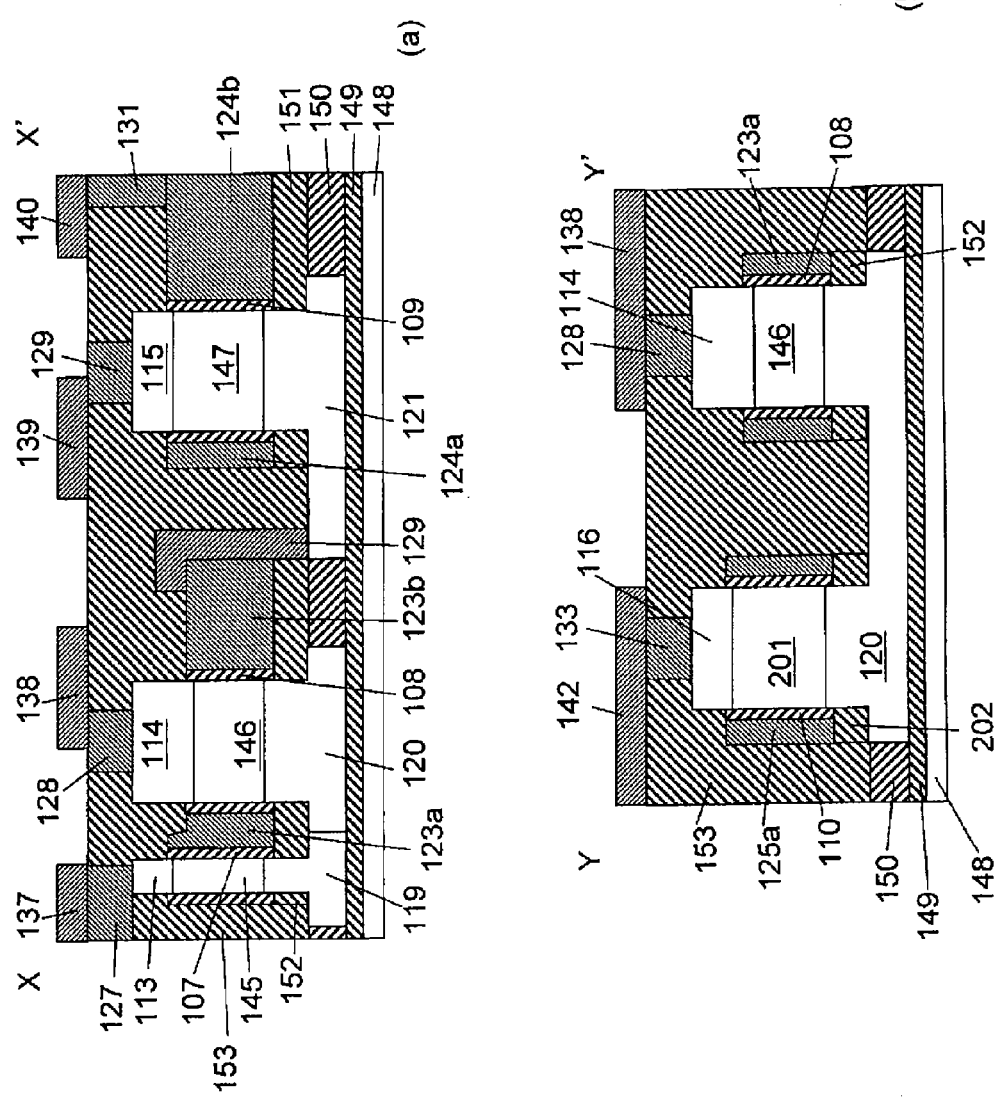
FIG. 4A is a cross-sectional view taken along line X-X' of a static memory cell according to an embodiment of the present invention.
FIG. 4B is a cross-sectional view taken along line Y-Y' of the static memory cell according to the embodiment of the present invention.

FIGS. 4A and 4B are cross-sectionals views of a static memory cell according to a fourth embodiment of the present invention. Since the plan view of this embodiment is the same as the plan view (FIG. 1A) of the first to third embodiments, the plan view of this embodiment is not illustrated. FIG. 4A is a cross-sectionals view taken along line X-X' in the plan view (not illustrated), and FIG. 4B is a cross-sectionals view taken along line Y-Y' in the plan view (not illustrated).

In this embodiment, the length of a portion between the seventh n+ silicon layer 116 and the eighth n+ silicon layer 120 of the first access transistor 104 and the length of a portion between the fifth n+ silicon layer 115 and the sixth n+ silicon layer 121 of the second access transistor 103 are 1.3 times the length of a portion between the first n+ silicon layer 114 and the second n+ silicon layer 120 of the first driver transistor 102 and the length of a portion between the third n+ silicon layer 117 and the fourth n+ silicon layer 121 of the second driver transistor 105. In addition, the gate length of a load transistor is 1.3 times the gate length of a driver transistor.

As the channel length of a driver transistor decreases, operational stability can be ensured, whereas if the channel length is short, the short-channel effects arise, which prevents the transistor from being cut off. Therefore, appropriate selection may be made based on anticipated demand.

Figure 5:
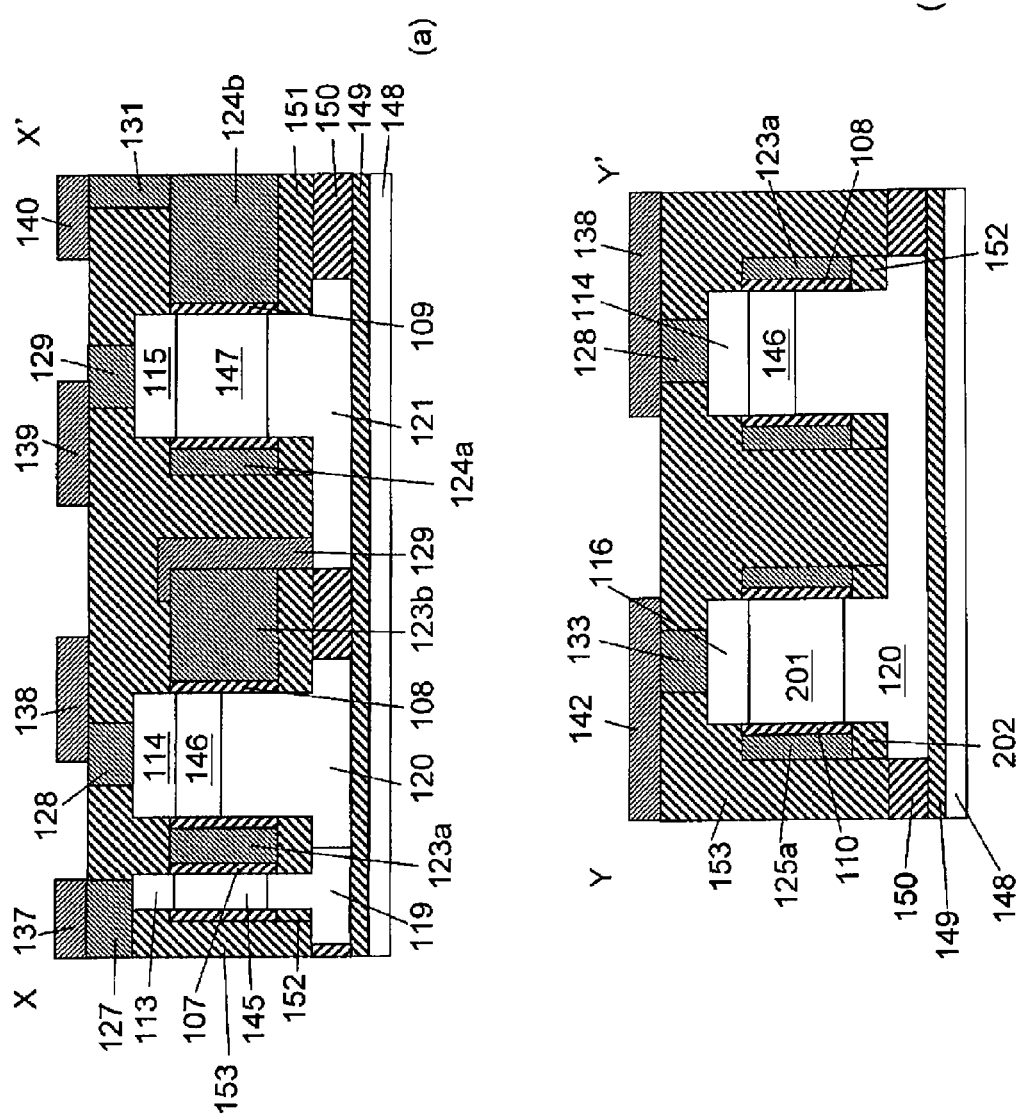
FIG. 5A is a cross-sectional view taken along line X-X' of a static memory cell according to an embodiment of the present invention.
FIG. 5B is a cross-sectional view taken along line Y-Y' of the static memory cell according to the embodiment of the present invention.

FIGS. 5A and 5B are cross-sectional views of a static memory cell according to a fifth embodiment of the present invention. Since the plan view of this embodiment is the same as the plan view (FIG. 1A) of the first to fourth embodiments, the plan view of this embodiment is not illustrated. FIG. 5A is a cross-sectional view taken along line X-X' in the plan view (not illustrated), and FIG. 5B is a cross-sectional view taken along line Y-Y' in the plan view (not illustrated).

In this embodiment, the gate electrodes 123a, 124a, 125a, and 126a are of equal physical gate length. Since the lengths from the lower ends to the upper ends of gates, that is, the physical gate lengths, are equal, the SGT manufacturing method described above can be used, which includes, after forming an island-shaped semiconductor layer, depositing a gate conductive film over the island-shaped silicon layer, planarizing the gate conductive film, and etching back the gate conductive film to a desired length. In general, reducing the channel length is equivalent to reducing the physical gate length. If the physical gate length is reduced, the gate capacitance is reduced. If the gate capacitance is reduced, a soft error occurs, resulting in operational stability not being ensured.

In FIGS. 5A and 5B, in contrast, the physical gate lengths are equal while only the channel length of a driver transistor is reduced. Therefore, the gate capacitance is not reduced although the current driving force of the driver transistor is doubled. That is, the current driving force of the driver transistor can be made double the current driving force of an access transistor, resulting in operational stability being ensured. Furthermore, the occurrence of soft errors can be avoided to ensure operational stability.

In addition, the upper end of the n+ silicon layer 120 of the first driver transistor 102 and the upper end of the n+ silicon layer 121 of the second driver transistor 105 are positioned higher than the upper end of the n+ silicon layer 120 of the first access transistor 104 and the upper end of the n+ silicon layer 121 of the second access transistor 103. This enables the driver transistors 102 and 105 to increase the overlap capacitance between the gate electrode 123a and the n+ silicon layer 120 and the overlap capacitance between the gate electrode 126a and the n+ silicon layer 121, respectively. During the cut-off of a driver transistor, the overlap capacitance between the gate electrode and the n+ silicon layer becomes a parasitic capacitance parasitic to a storage node. Since the overlap capacitance is large, the occurrence of soft errors can further be avoided to ensure operational stability.

FIGS. 6A and 6B are cross-sectional views of a static memory cell according to a sixth embodiment of the present invention. Since the plan view of this embodiment is the same as the plan view (FIG. 1A) of the first to fifth embodiments, the plan view of this embodiment is not illustrated. FIG. 6A is a cross-sectional view taken along line X-X' in the plan view (not illustrated), and FIG. 6B is a cross-sectional view taken along line Y-Y' in the plan view (not illustrated).

The lower end of the n+ silicon layer 114 of the first driver transistor 102 and the lower end of the n+ silicon layer 117 of the second driver transistor 105 are positioned lower than the lower end of the n+ silicon layer 116 of the first access transistor 104 and the lower end of the n+ silicon layer 115 of the second access transistor 103. Also in this embodiment, the physical gate lengths are equal while only the channel length of a driver transistor is reduced. Therefore, the gate capacitance is not reduced although the current driving force of the driver transistor is doubled. Thus, the current driving force of the driver transistor can be made double the current driving force of an access transistor, resulting in operational stability being ensured. Furthermore, the occurrence of soft errors can be avoided to ensure operational stability.

However, further advantages of the fifth embodiment (FIGS. 5A and 5B), that is, the advantages that during the cut-off of a driver transistor, the overlap capacitance between the gate electrode and the n+ silicon layer becomes a parasitic capacitance parasitic to a storage node and that since the overlap capacitance is large, the occurrence of soft errors can further be avoided to ensure operational stability, are not achievable. However, if a storage node is designed to be located above a transistor, the advantage of further avoiding the occurrence of soft errors can be achieved. As described below with respect to a manufacturing method, the production of the shape illustrated in FIGS. 5A and 5B requires a comparatively long heat treatment to be performed after ion implantation for the formation of an n+ silicon layer on the bottom of an island-shaped semiconductor of a driver transistor. When an n+ silicon layer on the top of an island-shaped semiconductor of a driver transistor is to be formed by ion implantation, the energy of the implantation is increased or phosphorus with a long diffusion length is used, thus enabling the lower end of the n+ silicon layer on the top of the island-shaped semiconductor of the driver transistor to be positioned lower than the lower end of an n+ silicon layer on the top of an island-shaped semiconductor of an access transistor. That is, the duration of heat treatment can be shorter than that in FIGS. 5A and 5B or the temperature of heat treatment can be lower than that in FIGS. 5A and 5B.

Figure 7:
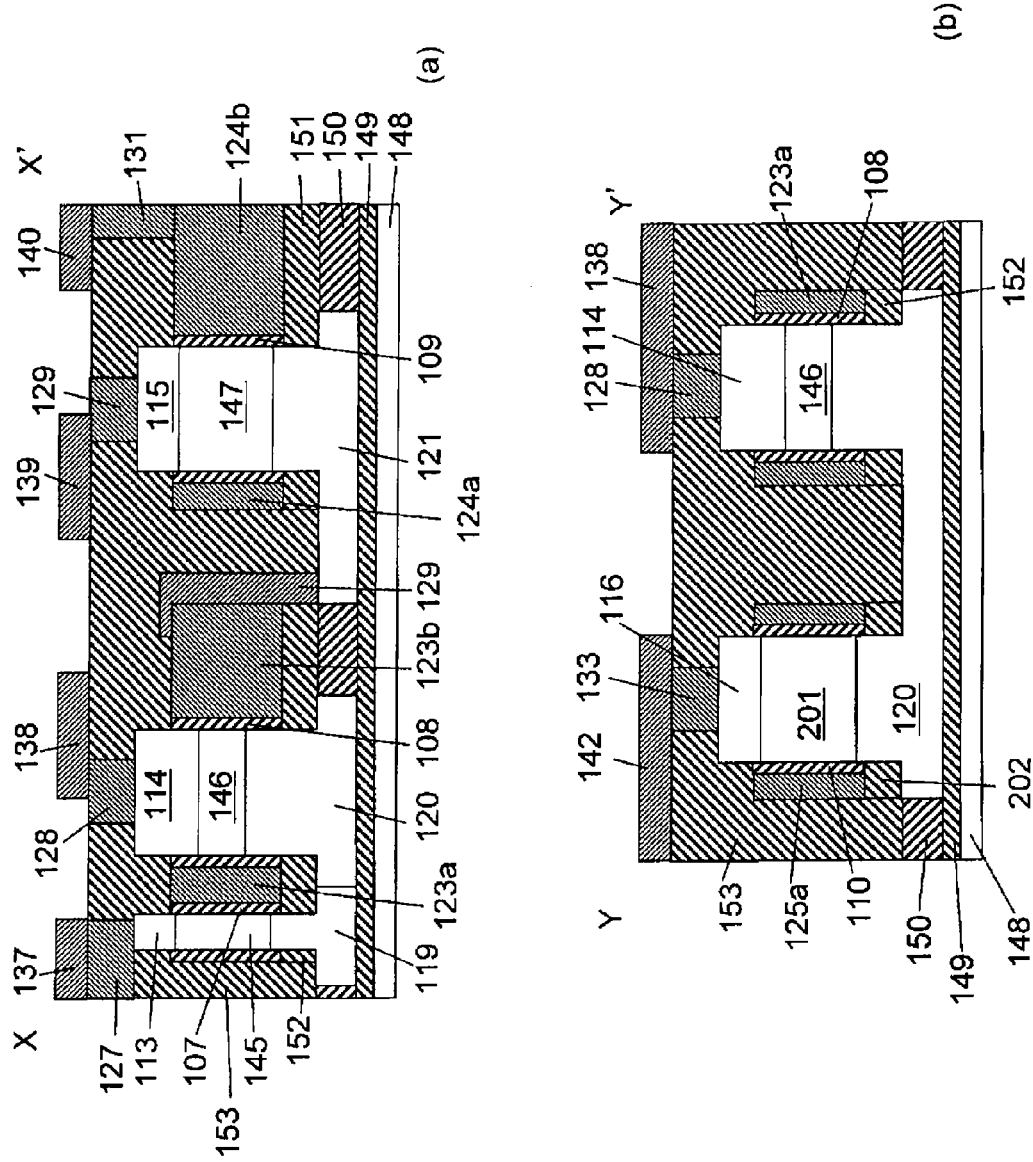
FIG. 7A is a cross-sectional view taken along line X-X' of a static memory cell according to an embodiment of the present invention.
FIG. 7B is a cross-sectional view taken along line Y-Y' of the static memory cell according to the embodiment of the present invention.

FIGS. 7A and 7B are cross-sectional views of a static memory cell according to a seventh embodiment of the present invention. Since the plan view of this embodiment is the same as the plan view (FIG. 1A) of the first to fifth embodiments, the plan view of this embodiment is not illustrated. FIG. 7A is a cross-sectional view taken along line X-X' in the plan view (not illustrated), and FIG. 7B is a cross-sectional view taken along line Y-Y' in the plan view (not illustrated).

The upper end of the n+ silicon layer 120 of the first driver transistor 102 and the upper end of the n+ silicon layer 121 of the second driver transistor 105 are positioned higher than the upper end of the n+ silicon layer 120 of the first access transistor 104 and the upper end of the n+ silicon layer 121 of the second access transistor 103, and the lower end of the n+ silicon layer 114 of the first driver transistor 102 and the lower end of the n+ silicon layer 117 of the second driver transistor 105 are positioned lower than the lower end of the n+ silicon layer 116 of the first access transistor 104 and the lower end of the n+ silicon layer 115 of the second access transistor 103.

Also in this embodiment, the channel length of a driver transistor is made shorter than the channel length of an access transistor, thus enabling operational stability to be ensured. Additionally, the advantage illustrated in FIGS. 5A and 5B, that is, the advantage of avoiding the occurrence of soft errors, can also be achieved. Since the diffusion length of an n+ silicon layer on the bottom of an island-shaped semiconductor of a driver transistor is short, the heat treatment reduced compared to that required to produce the shape illustrated in FIGS. 5A and 5B is required for formation. When an n+ silicon layer on the top of an island-shaped semiconductor of a driver transistor is to be formed by ion implantation, the energy of the implantation is increased or phosphorus with a diffusion length is used, thus enabling the lower end of the n+ silicon layer on the top of the island-shaped semiconductor of the driver transistor to be positioned lower than the lower end of an n+ silicon layer on the top of an island-shaped semiconductor of an access transistor. That is, the duration of heat treatment can be shorter than that required in FIGS. 5A and 5B or the temperature of heat treatment can be lower than that in FIGS. 5A and 5B, and the occurrence of soft errors can also be avoided. However, the number of steps in the manufacturing process is increased compared to that required to produce the shape illustrated in FIGS. 5A and 5B or the shape illustrated in FIGS. 6A and 6B.

Figure 8:
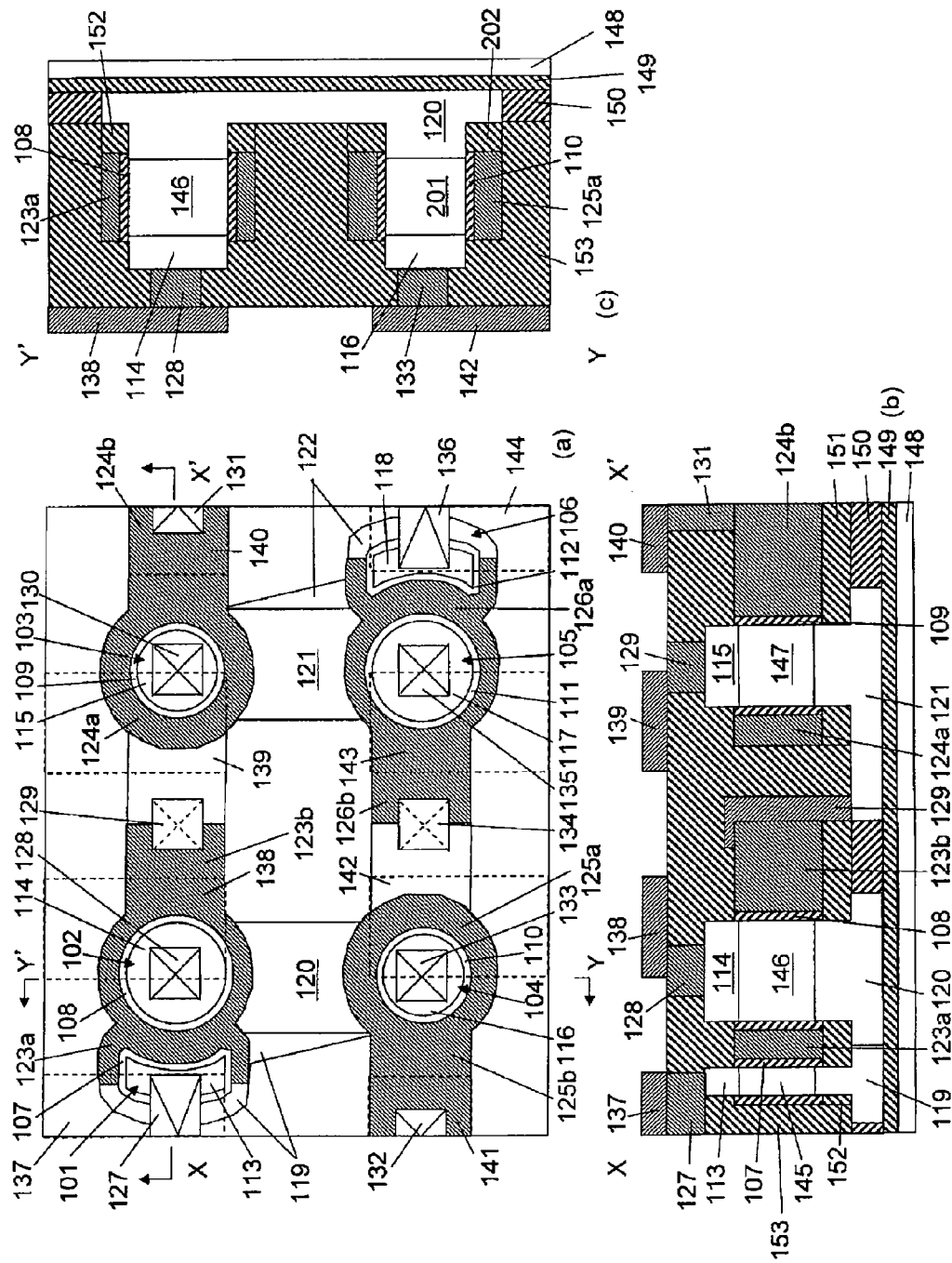
FIG. 8A is a plan view of a static memory cell according to an embodiment of the present invention.
FIG. 8B is a cross-sectional view taken along line X-X' in FIG. 8A.
FIG. 8C is a cross-sectional view taken along line Y-Y' in FIG. 8A.

FIG. 8A is a plan view of a static memory cell according to an eighth embodiment of the present invention, FIG. 8B is a cross-sectional view taken along line X-X' in FIG. 8A, and FIG. 8C is a cross-sectional view taken along line Y-Y' in FIG. 8A.

In FIGS. 8A to 8C, the peripheral length of the fourth island-shaped silicon layer 201 of the first access transistor 104 and the peripheral length of the third island-shaped silicon layer 147 of the second access transistor 103 are shorter than the peripheral length of the first island-shaped silicon layer 146 of the first driver transistor 102 and the peripheral length of the second island-shaped silicon layer of the second driver transistor 105. Therefore, the gate width of a driver transistor can be made shorter than the gate width of an access transistor without increasing the area, resulting in an operational stability-secured static memory cell being provided.

Figure 9:
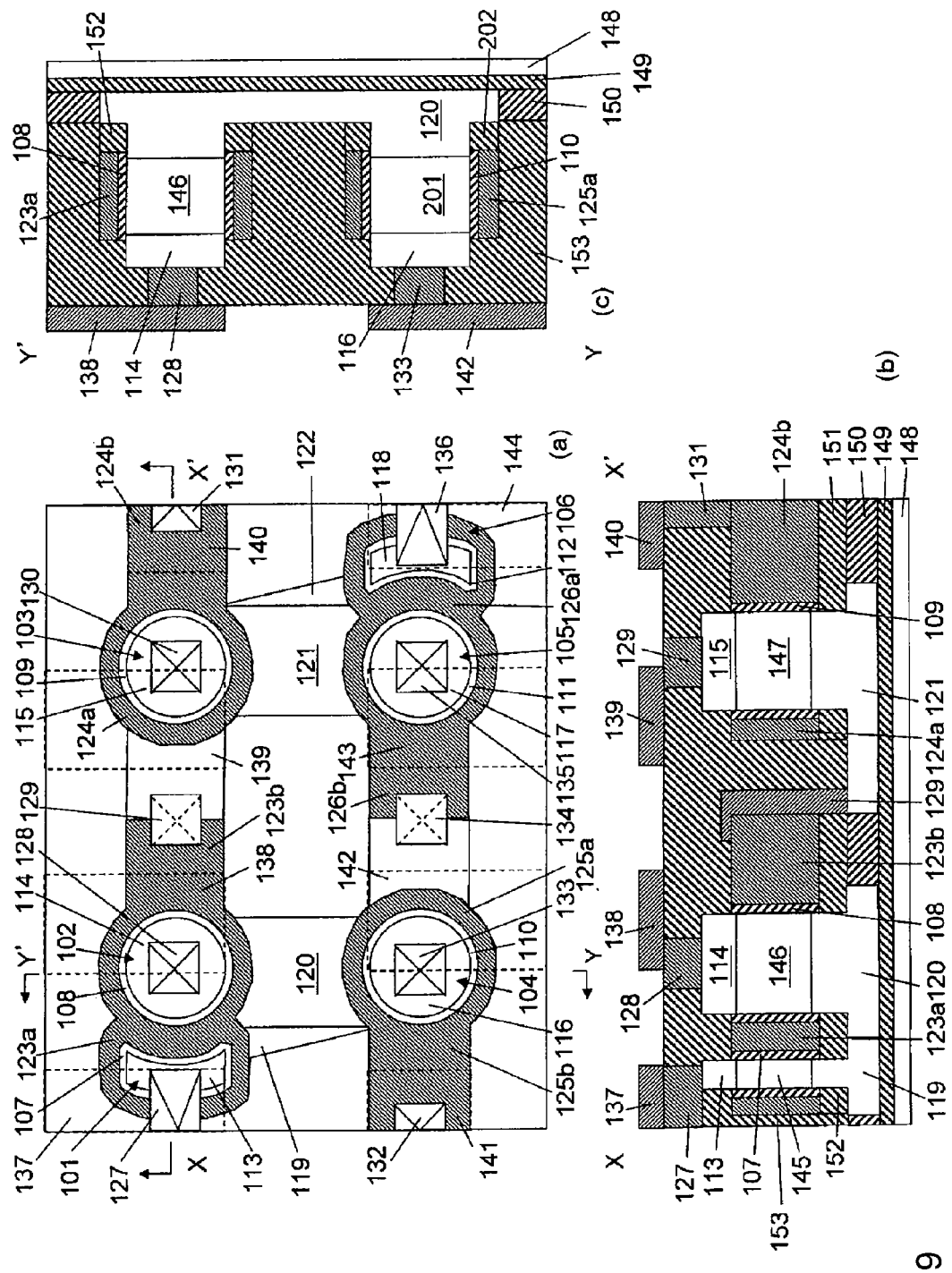
FIG. 9A is a plan view of a static memory cell according to an embodiment of the present invention.
FIG. 9B is a cross-sectional view taken along line X-X' in FIG. 9A.
FIG. 9C is a cross-sectional view taken along line Y-Y' in FIG. 9A.

FIG. 9A is a plan view of a static memory cell according to a ninth embodiment of the present invention, FIG. 9B is a cross-sectional view taken along line X-X' in FIG. 9A, and FIG. 9C is a cross-sectional view taken along line Y-Y' in FIG. 9A.

In FIGS. 9A to 9C, the second gate insulating film 107 surrounds the first arcuate silicon layer 145, and the first gate electrode 123a surrounds the second gate insulating film 107. Further, the fourth gate insulating film 112 surrounds the second arcuate silicon layer, and the second gate electrode 126a surrounds the fourth gate insulating film 112. The structure in which a gate electrode surrounds an arcuate silicon layer leads to an increase of the cut-off characteristic of a load transistor. Furthermore, because the step of removing a portion of a gate electrode is no longer required, the number of production steps can be reduced. To reduce the current driving force of a load transistor, the embodiment illustrated in FIGS. 1A to 1C may be selected. To increase the current driving force of a load transistor, the embodiment illustrated in FIGS. 9A to 9C may be selected.

Figure 10:
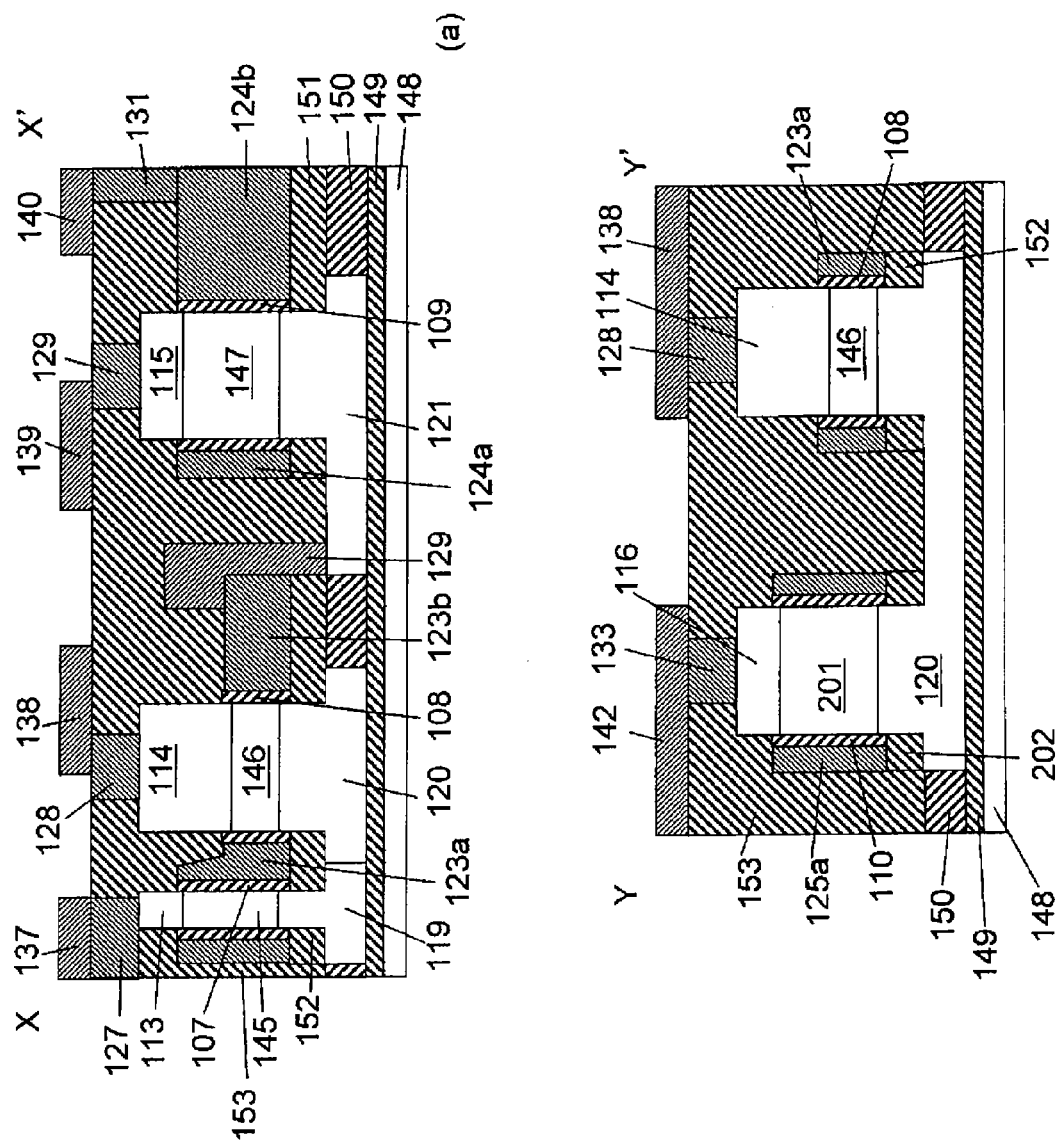
FIG. 10A is a cross-sectional view taken along line X-X' of a static memory cell according to an embodiment of the present invention.
FIG. 10B is a cross-sectional view taken along line Y-Y' of the static memory cell according to the embodiment of the present invention.

FIGS. 10A and 10B are cross-sectional views of a static memory cell according to a tenth embodiment of the present invention. Since the plan view of this embodiment is the same as the plan view (FIG. 9A) of the ninth embodiment, the plan view of this embodiment is not illustrated. FIG. 10A is a cross-sectional view taken along line X-X' in the plan view (not illustrated), and FIG. 10B is a cross-sectional view taken along line Y-Y' in the plan view (not illustrated).

The length of a portion between the first n+ silicon layer 114 and the second n+ silicon layer 120 of the first driver transistor 102 and the length of a portion between the third n+ silicon layer 117 and the fourth n+ silicon layer 121 of the second driver transistor 105 are shorter than the length of a portion between the seventh n+ silicon layer 116 and the eighth n+ silicon layer 120 of the first access transistor 104 and the length of a portion between the fifth n+ silicon layer 115 and the sixth n+ silicon layer 121 of the second access transistor 103. Therefore, the channel length of a driver transistor can be made shorter than the channel length of an access transistor without increasing the area, resulting in an operational stability-secured static memory cell being provided. In FIGS. 10A and 10B, the height of the gate electrode 123a and the gate line 123b of the driver transistor 102 is lower than that of the gate electrodes 125a and 124a and the gate line 124b. The above shape can be formed using the manufacturing method disclosed in Japanese Unexamined Patent Application Publication No. 2009-182317, by using a hard mask as a planarization stopper, making the gate length uniform across a wafer surface, and then etching portions of the gate electrode 123a and the gate line 123b near the driver transistor 102. In addition, the gate length of a driver transistor may be made shorter than the gate length of a load transistor.

Figure 11:
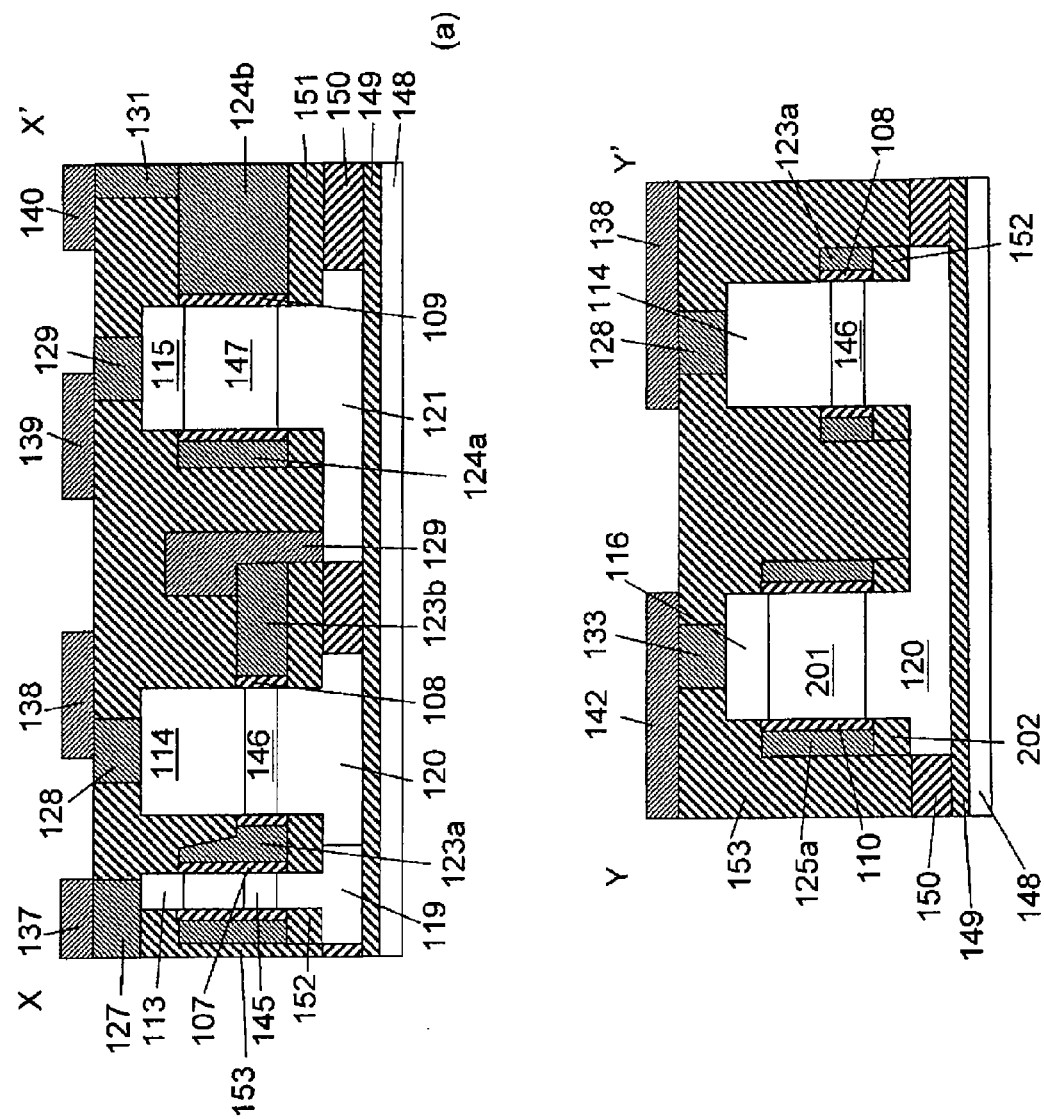
FIG. 11A is a cross-sectional view taken along line X-X' of a static memory cell according to an embodiment of the present invention.
FIG. 11B is a cross-sectional view taken along line Y-Y' of the static memory cell according to the embodiment of the present invention.

FIGS. 11A and 11B are cross-sectional views of a static memory cell according to an eleventh embodiment of the present invention. Since the plan view of this embodiment is the same as the plan view (FIG. 9A) of the ninth embodiment, the plan view of this embodiment is not illustrated. FIG. 11A is a cross-sectional view taken along line X-X' in the plan view (not illustrated), and FIG. 11B is a cross-sectional view taken along line in the plan view (not illustrated).

The length of a portion between the seventh n+ silicon layer 116 and the eighth n+ silicon layer 120 of the first access transistor 104 and the length of a portion between the fifth n+ silicon layer 115 and the sixth n+ silicon layer 121 of the second access transistor 103 are three times the length of a portion between the first n+ silicon layer 114 and the second n+ silicon layer 120 of the first driver transistor 102 and the length of a portion between the third n+ silicon layer 117 and the fourth n+ silicon layer 121 of the second driver transistor 105. In addition, the gate length of a load transistor is three times the gate length of a driver transistor.

Figure 12:
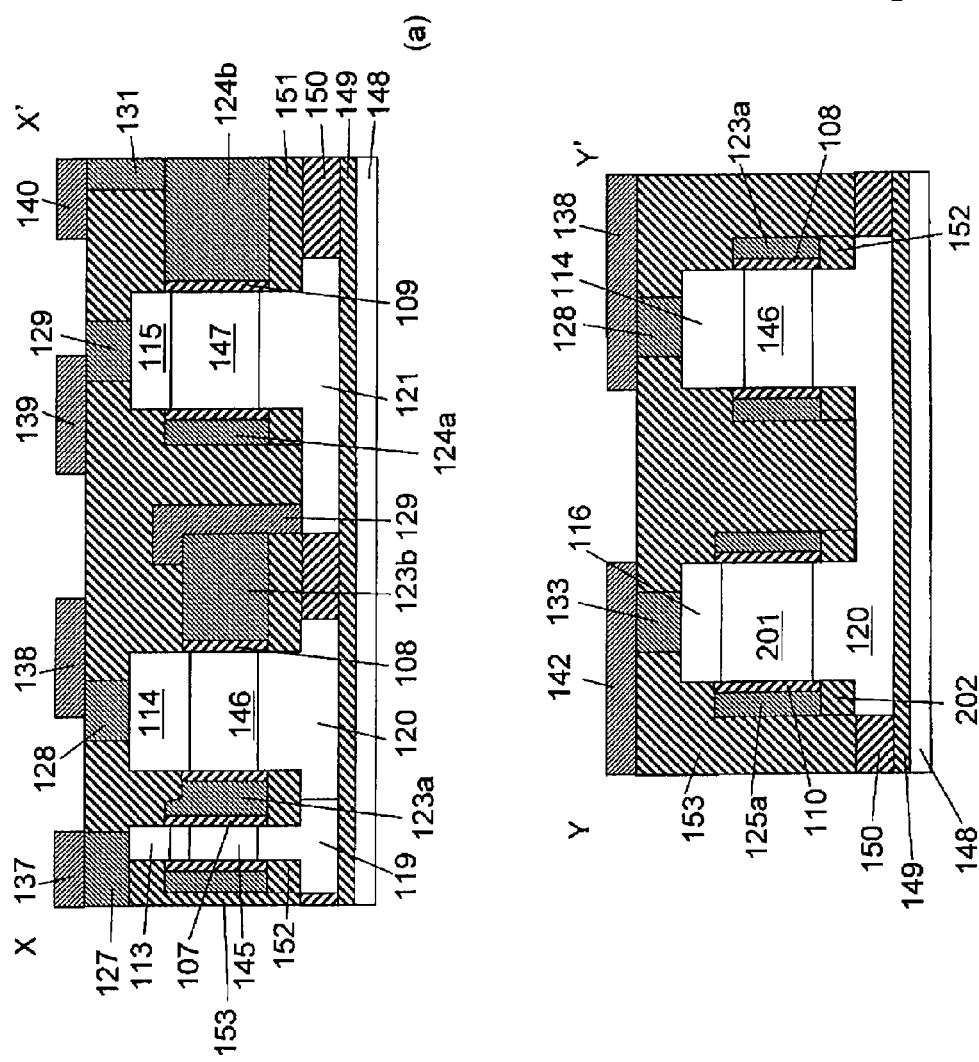
FIG. 12A is a cross-sectional view taken along line X-X' of a static memory cell according to an embodiment of the present invention.
FIG. 12B is a cross-sectional view taken along line Y-Y' of the static memory cell according to the embodiment of the present invention.

FIGS. 12A and 12B are cross-sectional views of a static memory cell according to a twelfth embodiment of the present invention. Since the plan view of this embodiment is the same as the plan view (FIG. 9A) of the ninth embodiment, the plan view of this embodiment is not illustrated. FIG. 12A is a cross-sectional view taken along line X-X' in the plan view (not illustrated), and FIG. 12B is a cross-sectional view taken along line Y-Y' in the plan view (not illustrated).

The length of a portion between the seventh n+ silicon layer 116 and the eighth n+ silicon layer 120 of the first access transistor 104 and the length of a portion between the fifth n+ silicon layer 115 and the sixth n+ silicon layer 121 of the second access transistor 103 are 1.3 times the length of a portion between the first n+ silicon layer 114 and the second n+ silicon layer 120 of the first driver transistor 102 and the length of a portion between the third n+ silicon layer 117 and the fourth n+ silicon layer 121 of the second driver transistor 105. In addition, the gate length of a load transistor is 1.3 times the gate length of a driver transistor.

As the channel length of a driver transistor decreases, operational stability can be ensured, whereas if the channel length is short, the short-channel effects arise, which prevents the transistor from being cut off. Therefore, appropriate selection may be made based on anticipated demand.

Figure 13:
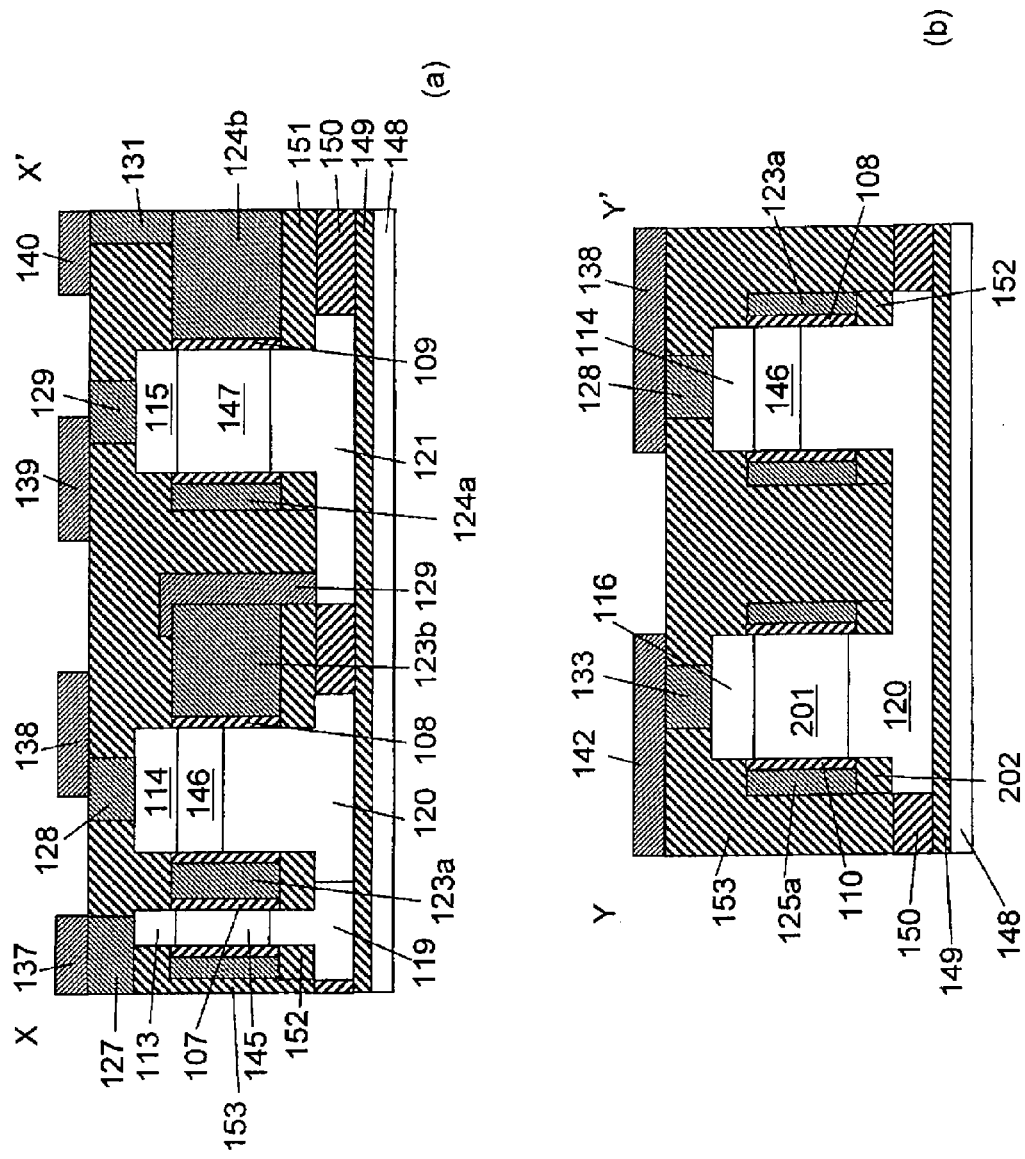
FIG. 13A is a cross-sectional view taken along line X-X' of a static memory cell according to an embodiment of the present invention.
FIG. 13B is a cross-sectional view taken along line Y-Y' of the static memory cell according to the embodiment of the present invention.

FIGS. 13A and 13B are cross-sectional views of a static memory cell according to a thirteenth embodiment of the present invention. Since the plan view of this embodiment is the same as the plan view (FIG. 9A) of the ninth embodiment, the plan view of this embodiment is not illustrated. FIG. 13A is a cross-sectional view taken along line X-X' in the plan view (not illustrated), and FIG. 13B is a cross-sectional view taken along line Y-Y' in the plan view (not illustrated).

In this embodiment, the gate electrodes 123a, 124a, 125a, and 126a are of equal physical gate length. Since the lengths from the lower ends to the upper ends of gates, that is, the physical gate lengths, are equal, the SGT manufacturing method described above can be used, which includes, after forming an island-shaped silicon layer, depositing a gate conductive film over the island-shaped silicon layer, planarizing the gate conductive film, and etching back the gate conductive film to a desired length. In general, reducing the channel length is equivalent to reducing the physical gate length. If the physical gate length is reduced, the gate capacitance is reduced. If the gate capacitance is reduced, a soft error occurs, resulting in operational stability not being ensured.

In FIGS. 13A and 13B, in contrast, the physical gate lengths are equal while only the channel length of a driver transistor is reduced. Therefore, the gate capacitance is not reduced although the current driving force of the driver transistor is doubled. That is, the current driving force of the driver transistor can be made double the current driving force of an access transistor, resulting in operational stability being ensured. Furthermore, the occurrence of soft errors can be avoided to ensure operational stability.

In addition, the upper end of the n+ silicon layer 120 of the first driver transistor 102 and the upper end of the n+ silicon layer 121 of the second driver transistor 105 are positioned higher than the upper end of the n+ silicon layer 120 of the first access transistor 104 and the upper end of the n+ silicon layer 121 of the second access transistor 103. This enables the driver transistors 102 and 105 to increase the overlap capacitance between the gate electrode 123a and the n+ silicon layer 120 and the overlap capacitance between the gate electrode 126a and the n+ silicon layer 121, respectively. During the cut-off of a driver transistor, the overlap capacitance between the gate electrode and the n+ silicon layer becomes a parasitic capacitance parasitic to a storage node. Since the overlap capacitance is large, the occurrence of soft errors can further be avoided to ensure operational stability.

Figure 14:
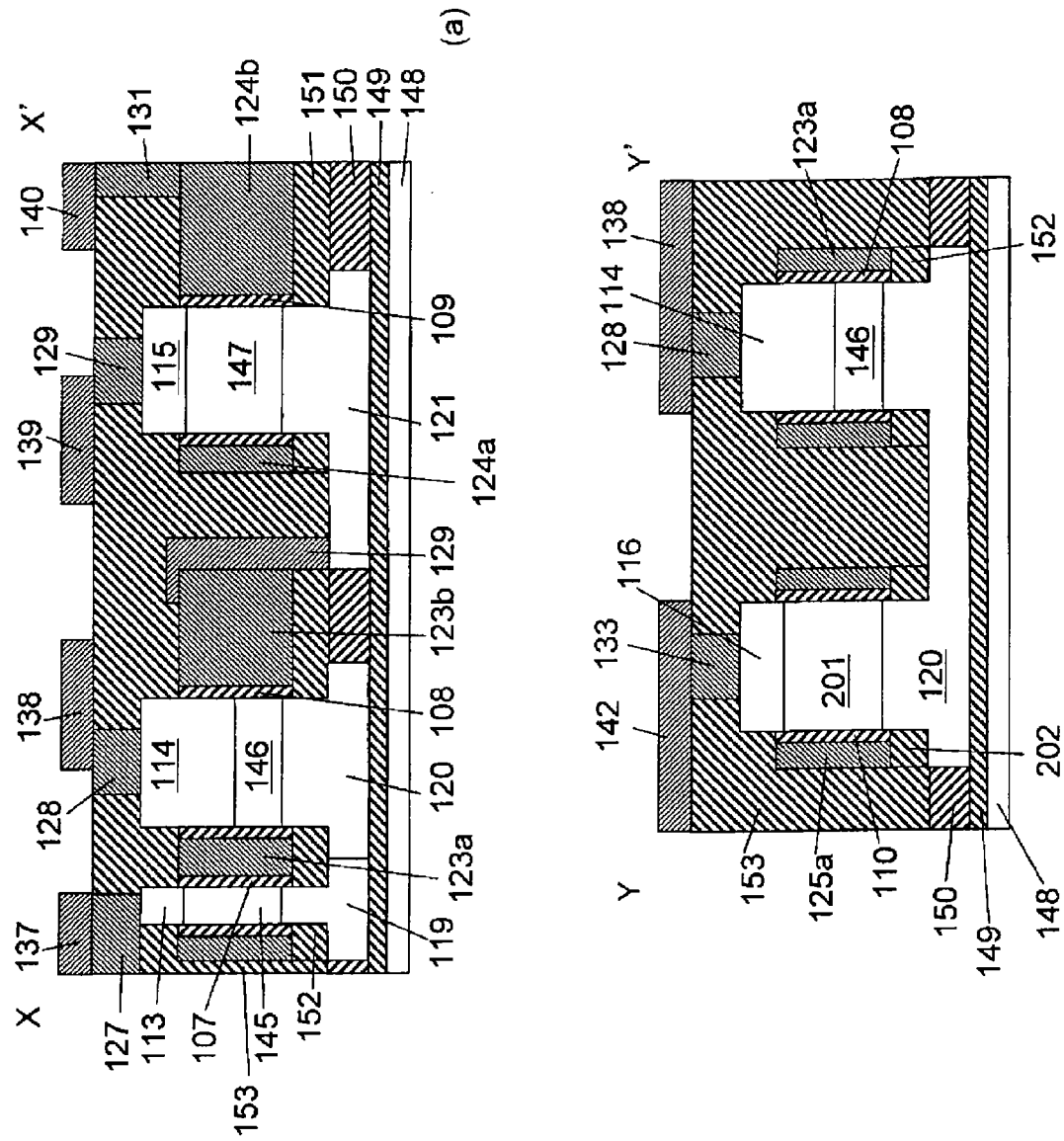
FIG. 14A is a cross-sectional view taken along line X-X' of a static memory cell according to an embodiment of the present invention.
FIG. 14B is a cross-sectional view taken along line Y-Y' of the static memory cell according to the embodiment of the present invention.

FIGS. 14A and 14B are cross-sectional views of a static memory cell according to a fourteenth embodiment of the present invention. Since the plan view of this embodiment is the same as the plan view (FIG. 9A) of the ninth embodiment, the plan view of this embodiment is not illustrated. FIG. 14A is a cross-sectional view taken along line X-X' in the plan view (not illustrated), and FIG. 14B is a cross-sectional view taken along line Y-Y' in the plan view (not illustrated).

The lower end of the n+ silicon layer 114 of the first driver transistor 102 and the lower end of the n+ silicon layer 117 of the second driver transistor 105 are positioned lower than the lower end of the n+ silicon layer 116 of the first access transistor 104 and the lower end of the n+ silicon layer 115 of the second access transistor 103. Also in this embodiment, the physical gate lengths are equal while only the channel length of a driver transistor is reduced. Therefore, the gate capacitance is not reduced although the current driving force of the driver transistor is doubled. Thus, the current driving force of the driver transistor can be made double the current driving force of an access transistor, resulting in operational stability being ensured. Furthermore, the occurrence of soft errors can be avoided to ensure operational stability.

However, further advantages illustrated in FIGS. 13A and 13B, that is, the advantages that during the cut-off of a driver transistor, the overlap capacitance between the gate electrode and the n+ silicon layer becomes a parasitic capacitance parasitic to a storage node and that since the overlap capacitance is large, the occurrence of soft errors can further be avoided to ensure operational stability, are not achievable. However, if a storage node is designed to be located above a transistor, the advantage of further avoiding the occurrence of soft errors can be achieved. As described below with respect to a manufacturing method, the production of the shape illustrated in FIGS. 13A and 13B requires a comparatively long heat treatment to be performed after ion implantation for the formation of an n+ silicon layer on the bottom of an island-shaped silicon layer of a driver transistor.

When an n+ silicon layer on the top of an island-shaped silicon layer of a driver transistor is to be formed by ion implantation, the energy of the implantation is increased or phosphorus with a long diffusion length is used, thus enabling the lower end of the n+ silicon layer on the top of the island-shaped silicon layer of the driver transistor to be positioned lower than the lower end of an n+ silicon layer on the top of an island-shaped silicon layer of an access transistor. That is, the duration of heat treatment can be shorter than that in FIGS. 13A and 13B or the temperature of heat treatment can be lower than that in FIGS. 13A and 13B.

Figure 15:
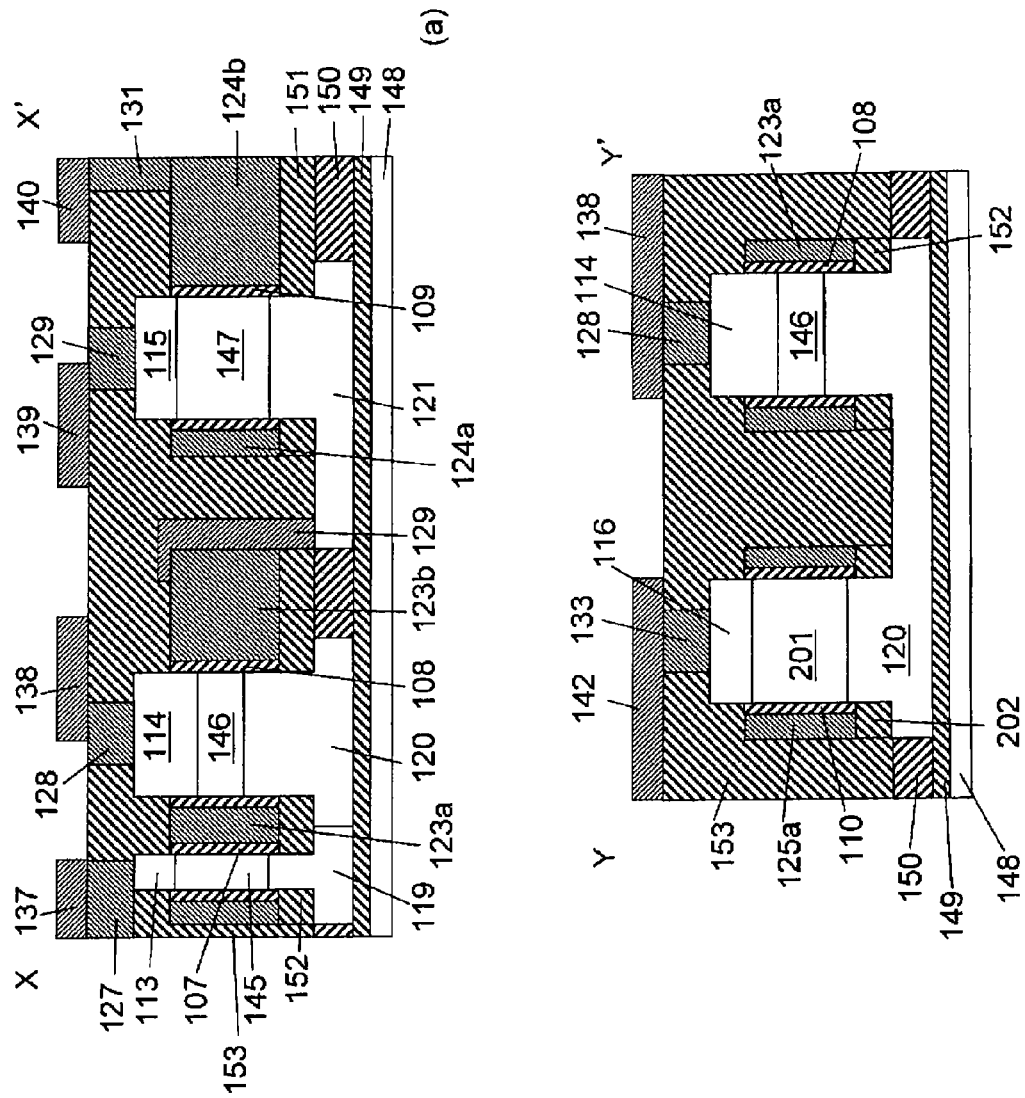
FIG. 15A is a cross-sectional view taken along line X-X' of a static memory cell according to an embodiment of the present invention.
FIG. 15B is a cross-sectional view taken along line Y-Y' of the static memory cell according to the embodiment of the present invention.

FIGS. 15A and 15B are cross-sectional views of a static memory cell according to a fifteenth embodiment of the present invention. Since the plan view of this embodiment is the same as the plan view (FIG. 9A) of the ninth embodiment, the plan view of this embodiment is not illustrated. FIG. 15A is a cross-sectional view taken along line X-X' in the plan view (not illustrated), and FIG. 15B is a cross-sectional view taken along line Y-Y' in the plan view (not illustrated).

The upper end of the n+ silicon layer 120 of the first driver transistor 102 and the upper end of the n+ silicon layer 121 of the second driver transistor 105 are positioned higher than the upper end of the n+ silicon layer 120 of the first access transistor 104 and the upper end of the n+ silicon layer 121 of the second access transistor 103, and the lower end of the n+ silicon layer 114 of the first driver transistor 102 and the lower end of the n+ silicon layer 117 of the second driver transistor 105 are positioned lower than the lower end of the n+ silicon layer 116 of the first access transistor 104 and the lower end of the n+ silicon layer 115 of the second access transistor 103.

Also in this embodiment, the channel length of a driver transistor is made shorter than the channel length of an access transistor, thus enabling operational stability to be ensured. Additionally, the advantage illustrated in FIGS. 13A and 13B, that is, the advantage of avoiding the occurrence of soft errors, can also be achieved. Since the diffusion length of an n+ silicon layer on the bottom of an island-shaped silicon layer of a driver transistor is short, the heat treatment reduced compared to that required to produce the shape illustrated in FIGS. 13A and 13B is required for formation. When an n+ silicon layer on the top of an island-shaped silicon layer of a driver transistor is to be formed by ion implantation, the energy of the implantation is increased or phosphorus with a diffusion length is used, thus enabling the lower end of the n+ silicon layer on the top of the island-shaped silicon layer of the driver transistor to be positioned lower than the lower end of an n+ silicon layer on the top of an island-shaped silicon layer of an access transistor. That is, the duration of heat treatment can be shorter than that required in FIGS. 13A and 13B or the temperature of heat treatment can be lower than that in FIGS. 13A and 13B, and the occurrence of soft errors can also be avoided. However, the number of steps in the manufacturing process is increased compared to that required to produce the shape illustrated in FIGS. 13A and 13B or the shape illustrated in FIGS. 14A and 14B.

Figure 16:
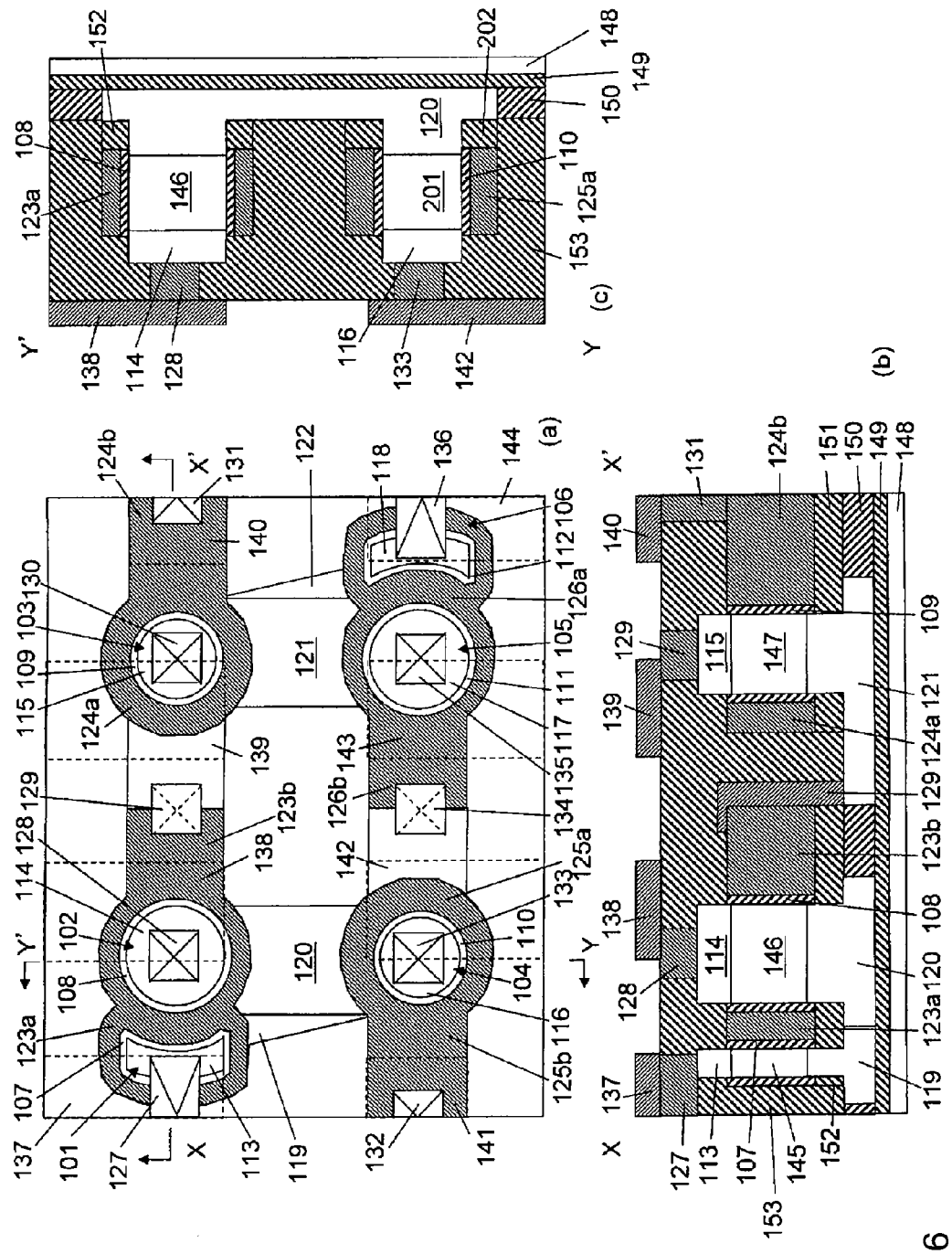
FIG. 16A is a plan view of a static memory cell according to an embodiment of the present invention.
FIG. 16B is a cross-sectional view taken along line X-X' in FIG. 16A.
FIG. 16C is a cross-sectional view taken along line Y-Y' in FIG. 16A.

FIG. 16A is a plan view of a static memory cell according to a sixteenth embodiment of the present invention, FIG. 16B is a cross-sectional view taken along line X-X' in FIG. 16A, and FIG. 16C is a cross-sectional view taken along line Y-Y' in FIG. 16A. The peripheral length of the fourth island-shaped silicon layer 201 of the first access transistor 104 and the peripheral length of the third island-shaped silicon layer 147 of the second access transistor 103 are shorter than the peripheral length of the first island-shaped silicon layer 146 of the first driver transistor 102 and the peripheral length of the second island-shaped silicon layer of the second driver transistor 105. Therefore, the gate width of a driver transistor can be made shorter than the gate width of an access transistor without increasing the area, resulting in an operational stability-secured static memory cell being provided.

Figure 17:
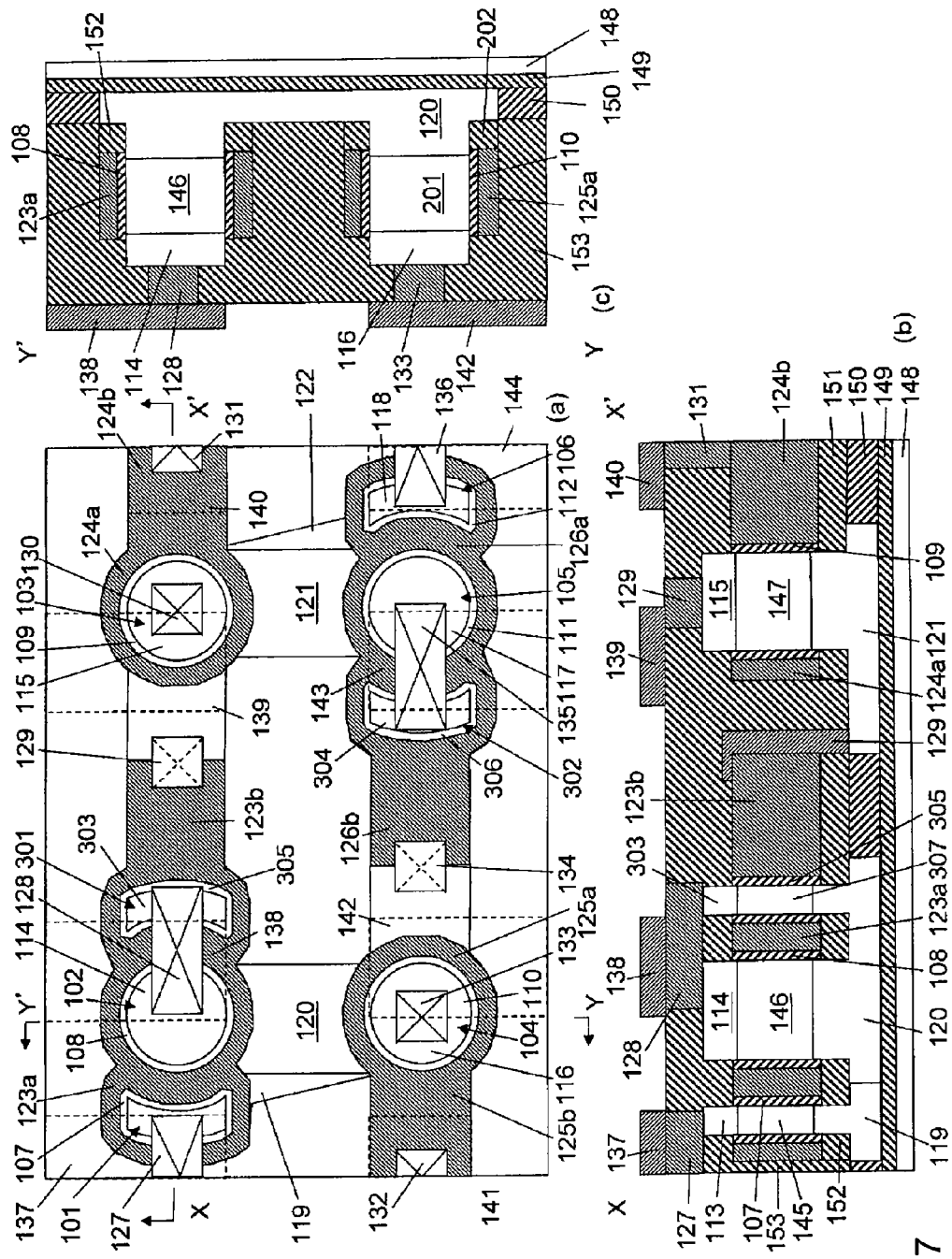
FIG. 17A is a plan view of a static memory cell according to an embodiment of the present invention.
FIG. 17B is a cross-sectional view taken along line X-X' in FIG. 17A.
FIG. 17C is a cross-sectional view taken along line Y-Y' in FIG. 17A.

FIG. 17A is a plan view of a static memory cell according to a seventeenth embodiment of the present invention, FIG. 17B is a cross-sectional view taken along line X-X' in FIG. 17A, and FIG. 17C is a cross-sectional view taken along line Y-Y' in FIG. 17A.

In this embodiment, a third driver transistor 301 having a third arcuate silicon layer 307 that is arcuate when viewed in plan is provided in addition to the first driver transistor 102 having the first island-shaped silicon layer 146, and a fourth driver transistor 302 having a fourth arcuate silicon layer that is arcuate when viewed in plan is provided in addition to the second driver transistor 105 having the second island-shaped silicon layer. The third driver transistor 301 is surrounded by a gate insulating film 305, and an n+ silicon layer 303 is provided on the top of the third arcuate silicon layer 307. Further, the n+ silicon layer 120 is provided on the bottom of the third arcuate silicon layer 307. The fourth driver transistor 302 is surrounded by a gate insulating film 306, and an n+ silicon layer 304 is provided on the top of the arcuate silicon layer. Further, the n+ silicon layer 121 is provided on the bottom of the arcuate silicon layer. Although the area of the arcuate silicon layers are increased, the arcuate silicon layers can be produced using a self-aligning process from the shape of the island-shaped silicon layers, and the arcuate silicon layers and the island-shaped silicon layers can be disposed in close proximity to each other. Therefore, the use of an arcuate silicon layer and an island-shaped silicon layer allows a larger gate width to be obtained with a smaller area.

An example of a manufacturing process for forming the structure (FIGS. 7A and 7B) of the static memory cell according to the seventh embodiment of the present invention will be described hereinafter with reference to FIGS. 18 to 62.

Figure 18:
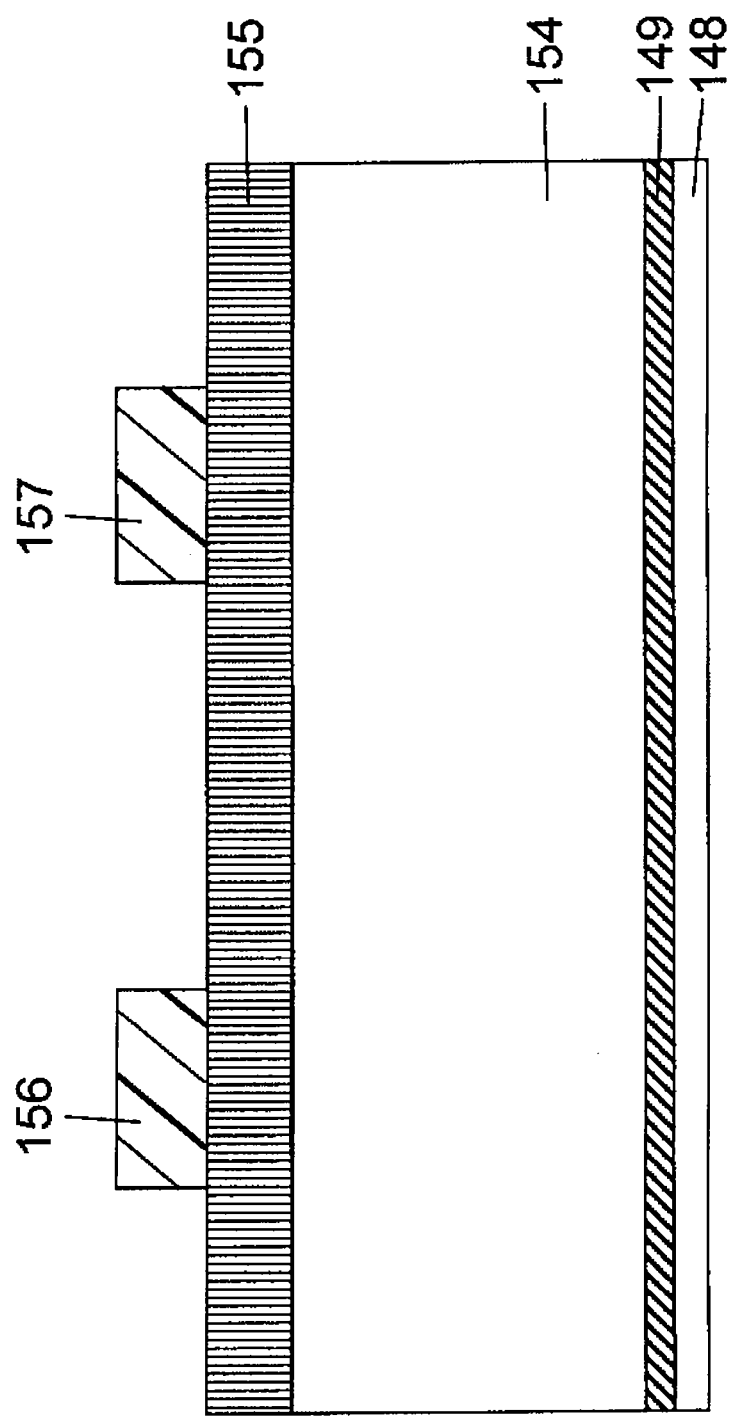
FIG. 18 is a cross-sectional view explaining a method for manufacturing a static memory cell according to an embodiment of the present invention.

FIG. 18 illustrates a state where an oxide film 149 is formed on a silicon layer 148, and a planar silicon layer 154 is formed on the oxide film 149, and a nitride film 155 is formed, and resists 156 and 157 for forming an island-shaped silicon layer are formed.

Figure 19:
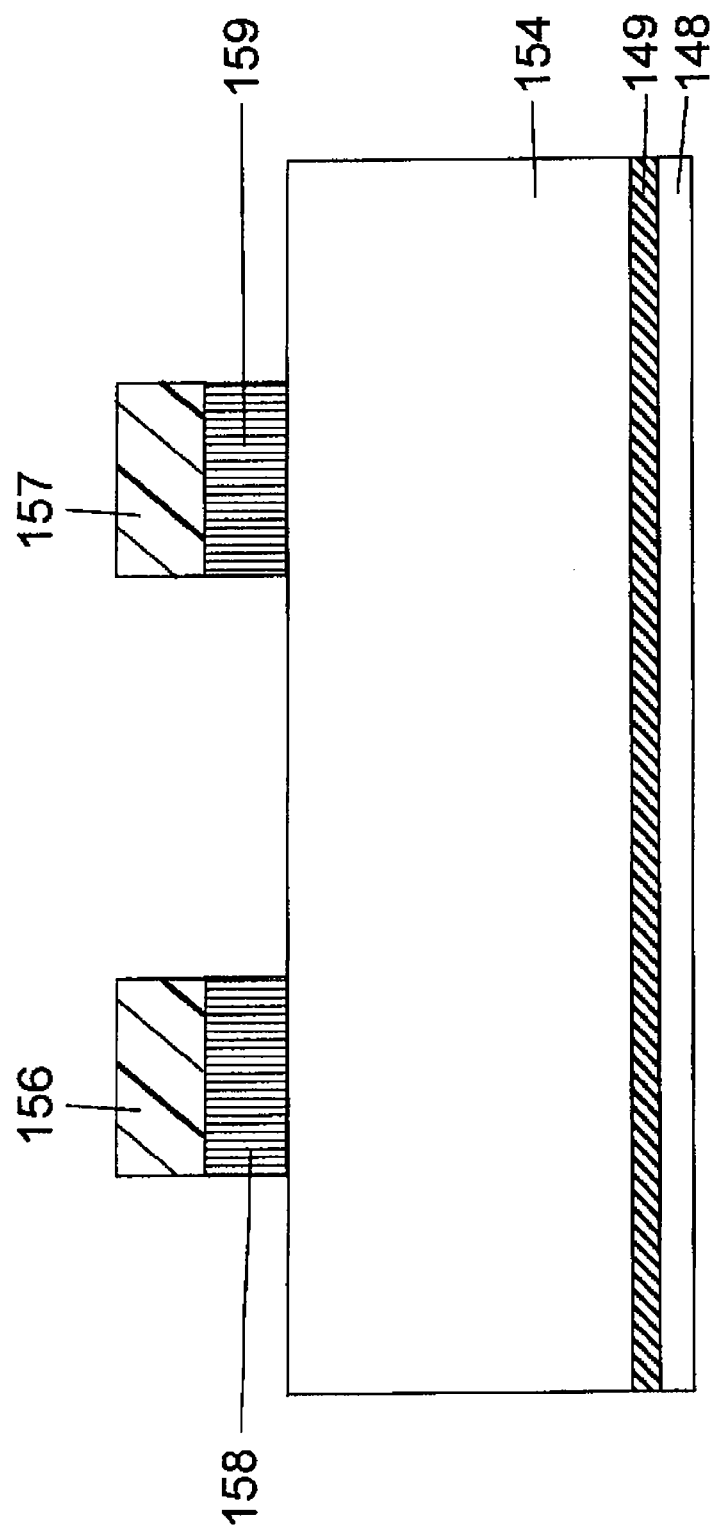
FIG. 19 is a cross-sectional view explaining the method for manufacturing a static memory cell according to the embodiment of the present invention.

In the state, as illustrated in FIG. 19, the nitride film 155 is etched to form nitride film hard masks 158 and 159.

Figure 20:
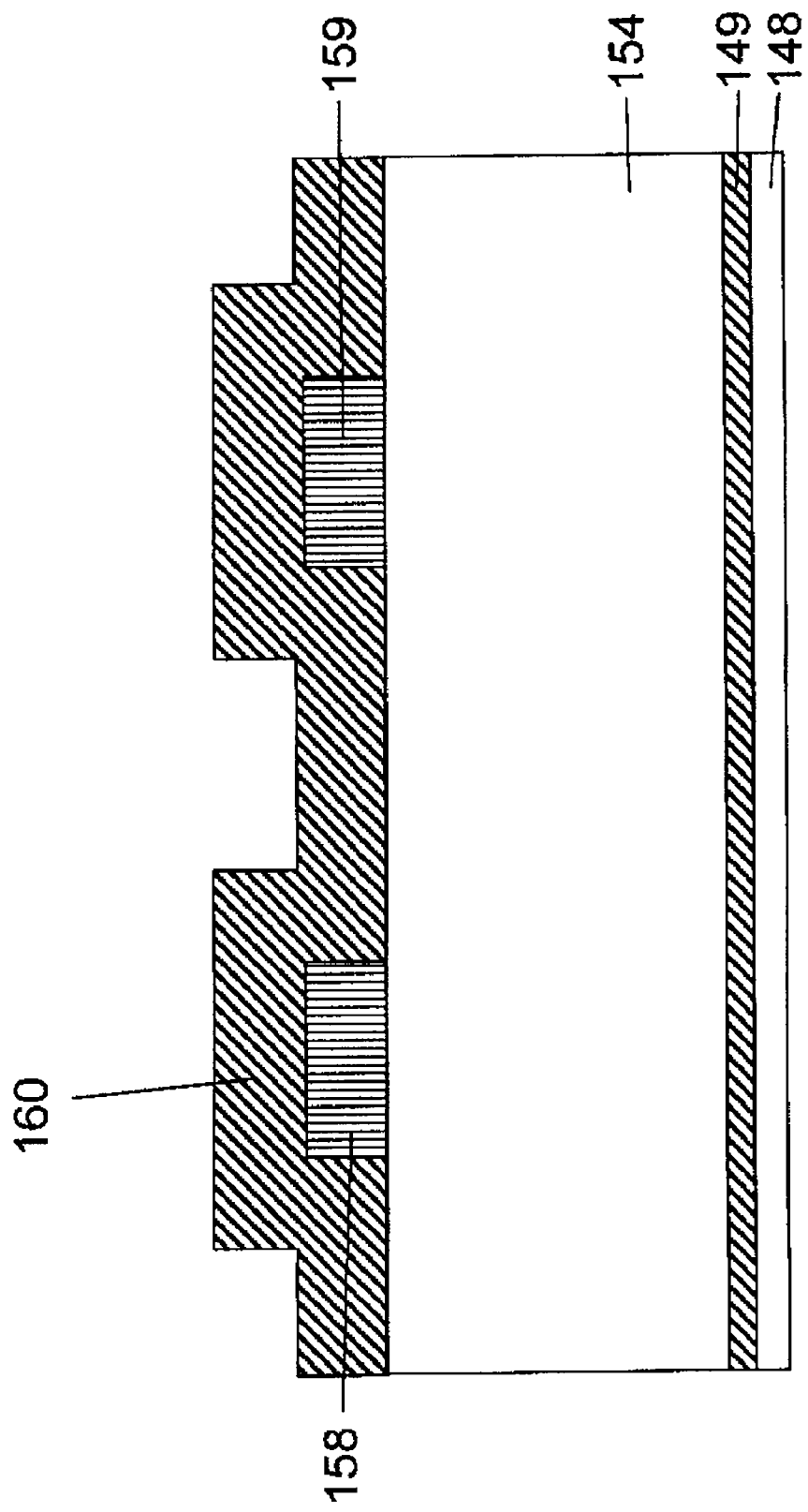
FIG. 20 is a cross-sectional view explaining the method for manufacturing a static memory cell according to the embodiment of the present invention.

Subsequently, as illustrated in FIG. 20, an oxide film 160 is deposited.

Figure 21:
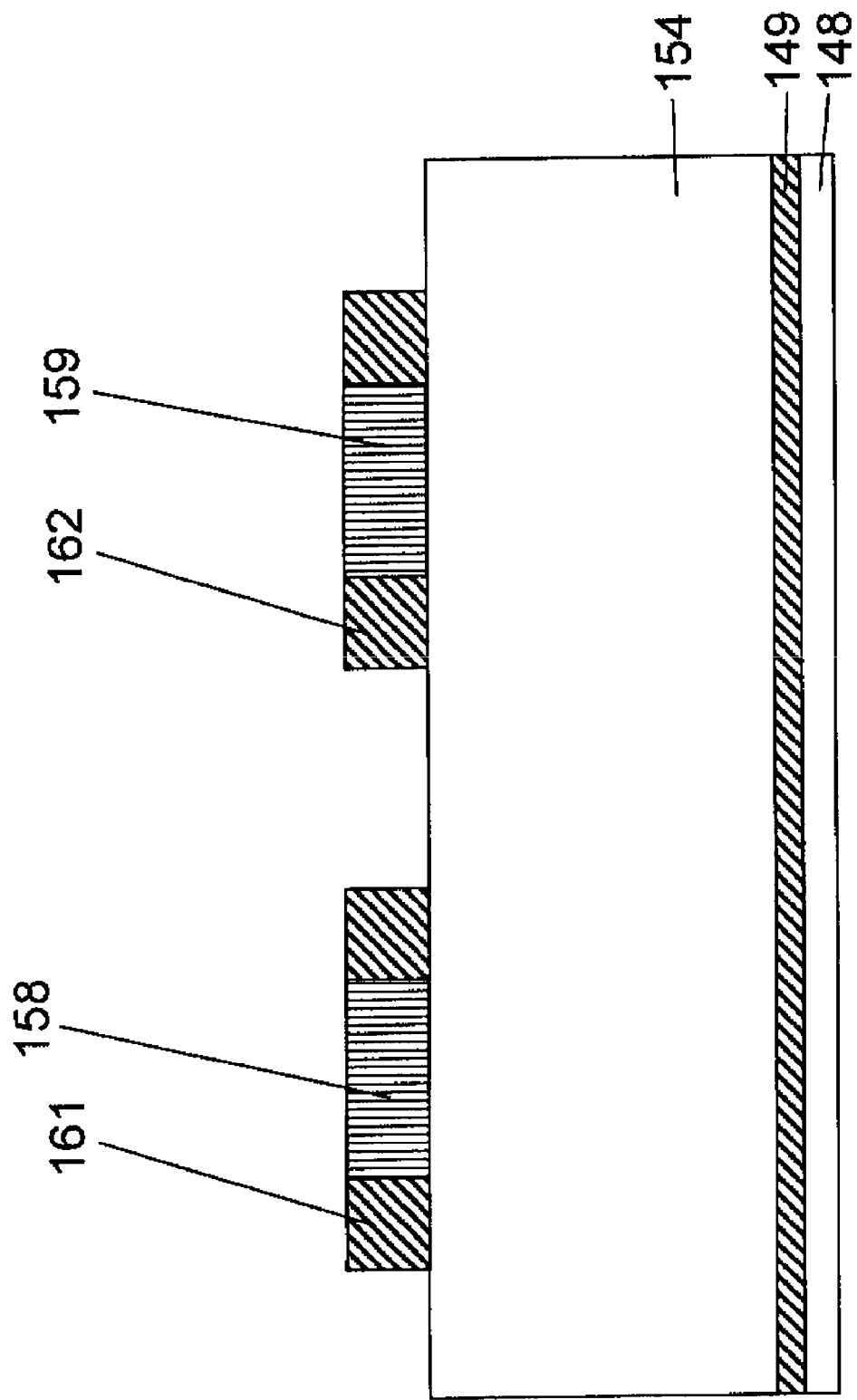
FIG. 21 is a cross-sectional view explaining the method for manufacturing a static memory cell according to the embodiment of the present invention.

Subsequently, as illustrated in FIG. 21, the oxide film 160 is etched to form oxide film sidewalls 161 and 162. The width of each of the oxide film sidewalls 161 and 162 corresponds to the width of an island-shaped silicon layer and an arcuate silicon layer which will be formed layer.

Figure 22:
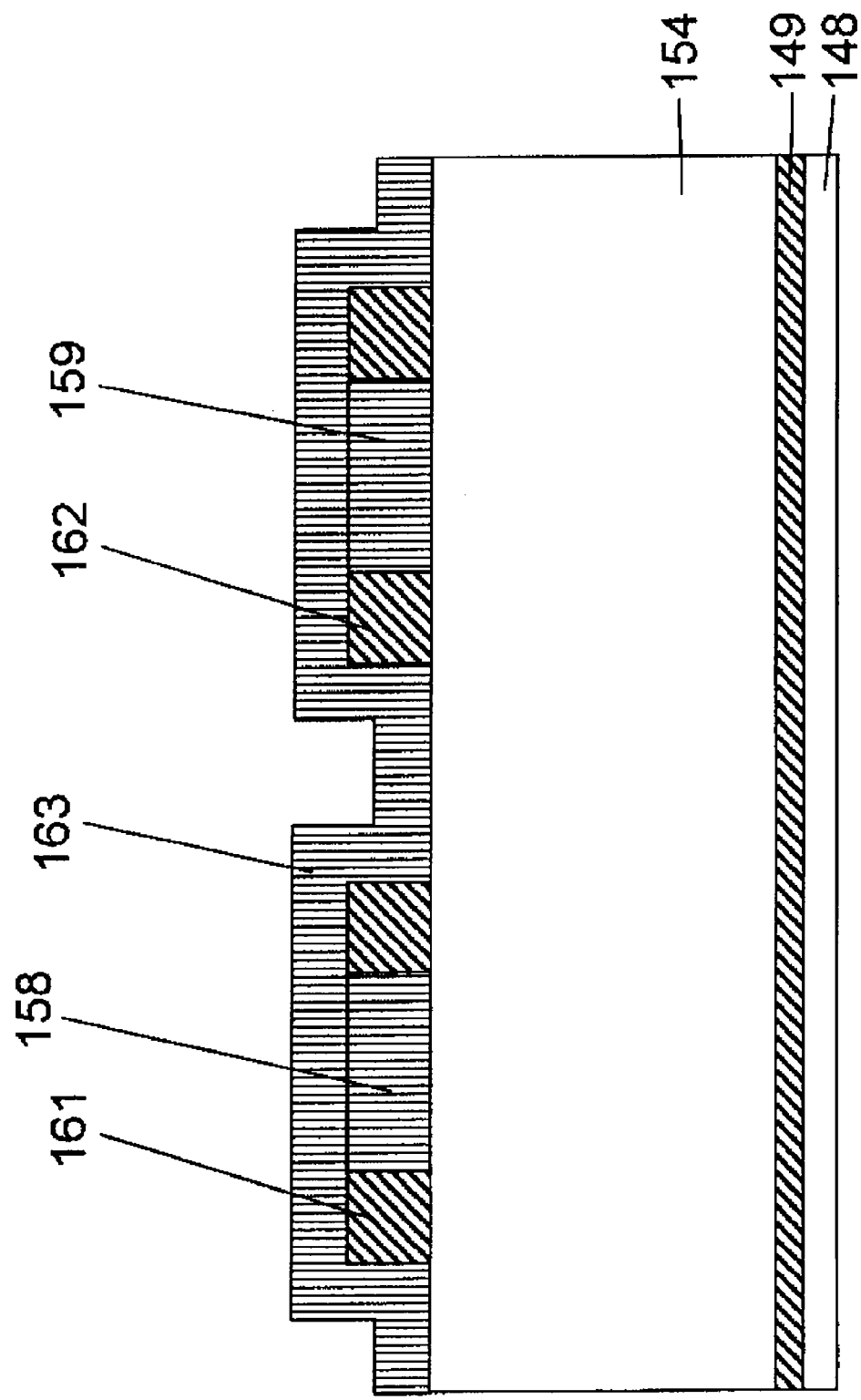
FIG. 22 is a cross-sectional view explaining the method for manufacturing a static memory cell according to the embodiment of the present invention.

Subsequently, as illustrated in FIG. 22, a nitride film 163 is deposited.

Figure 23:
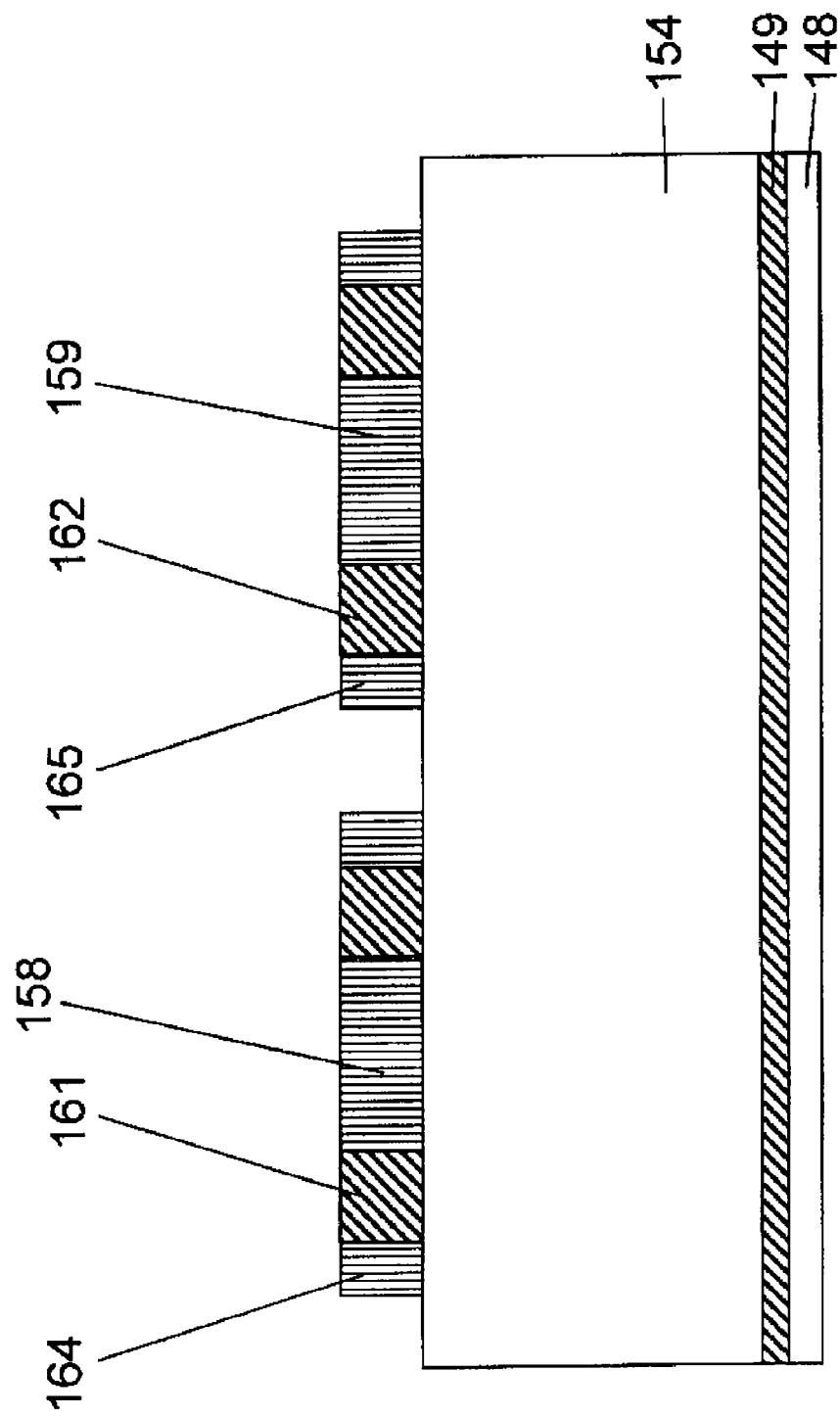
FIG. 23 is a cross-sectional view explaining the method for manufacturing a static memory cell according to the embodiment of the present invention.

Subsequently, as illustrated in FIG. 23, the nitride film 163 is etched to form nitride film sidewalls 164 and 165. The nitride film sidewalls 164 and 165 are in cylindrical form.

Figure 24:
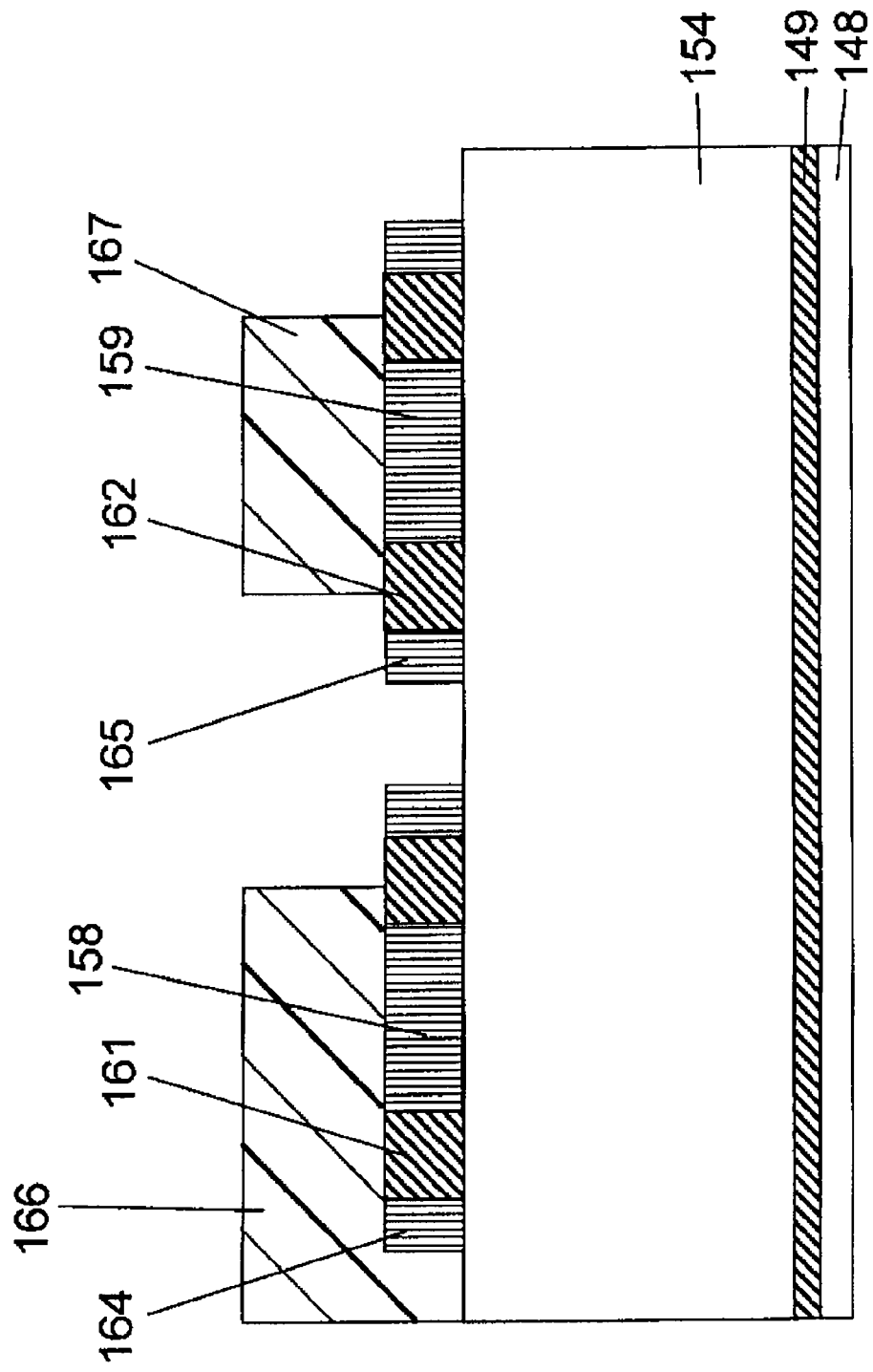
FIG. 24 is a cross-sectional view explaining the method for manufacturing a static memory cell according to the embodiment of the present invention.

Subsequently, as illustrated in FIG. 24, resists 166 and 167 for forming the cylindrical nitride film sidewalls 164 and 165 into an arcuate shape are formed.

Figure 25:
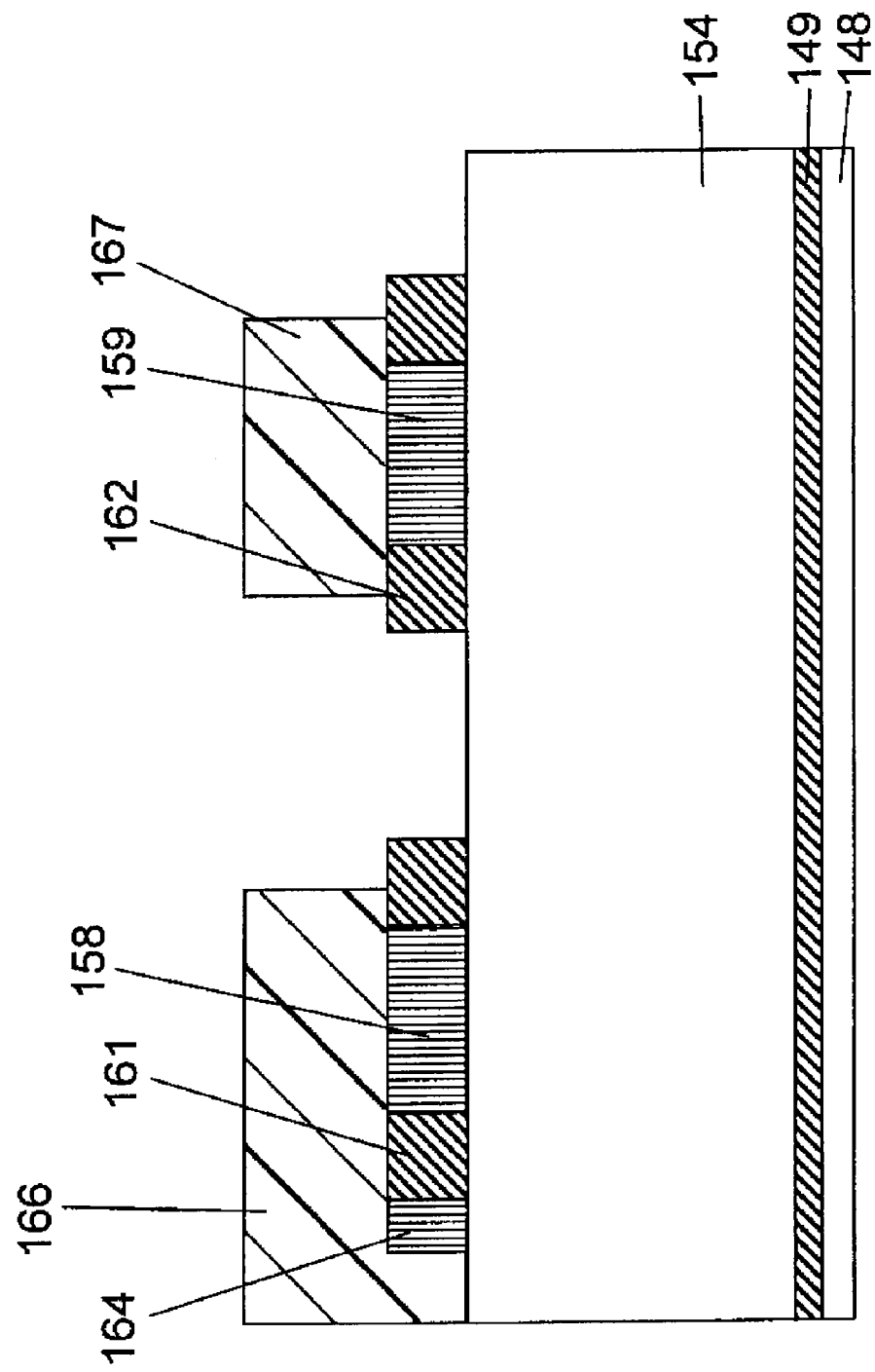
FIG. 25 is a cross-sectional view explaining the method for manufacturing a static memory cell according to the embodiment of the present invention.

Subsequently, as illustrated in FIG. 25, the nitride film sidewalls 164 and 165 are etched to form an arcuate nitride film sidewall 164.

Figure 26:
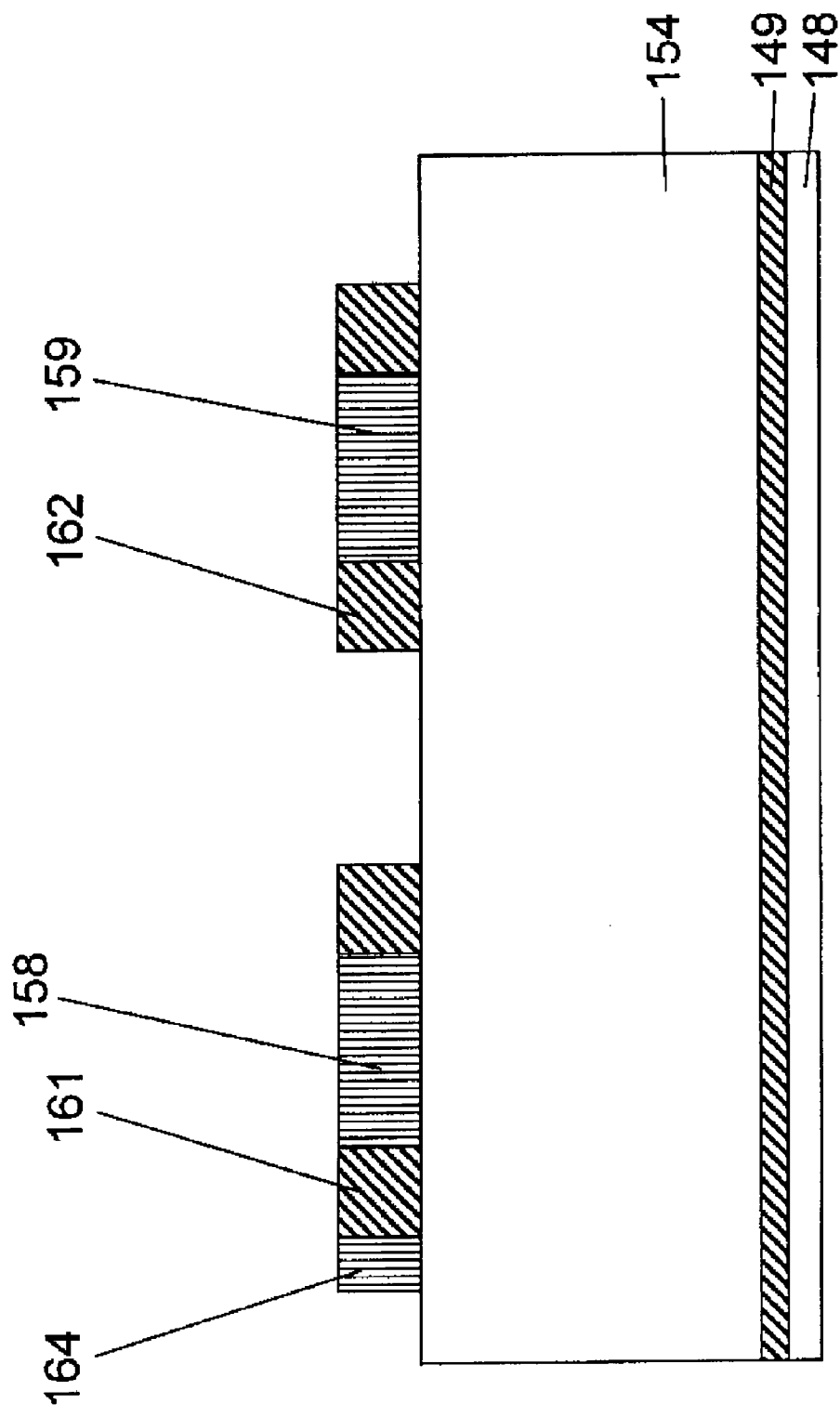
FIG. 26 is a cross-sectional view explaining the method for manufacturing a static memory cell according to the embodiment of the present invention.

Subsequently, as illustrated in FIG. 26, the resists 166 and 167 are stripped.

Figure 27:
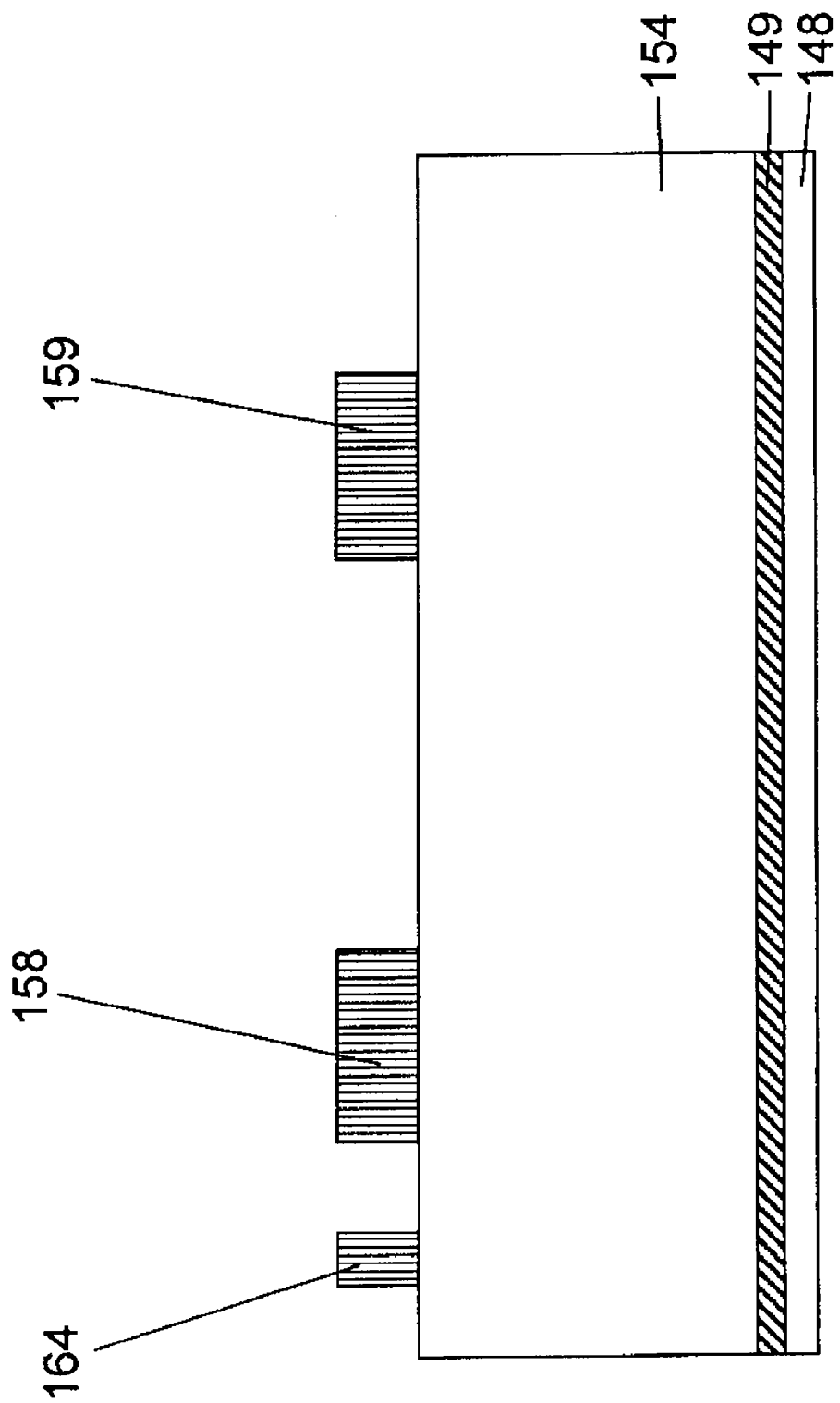
FIG. 27 is a cross-sectional view explaining the method for manufacturing a static memory cell according to the embodiment of the present invention.

Subsequently, as illustrated in FIG. 27, the oxide film sidewalls 161 and 162 are etched. The nitride film hard masks 158 and 159, which are used for forming an island-shaped silicon layer, and the nitride film sidewall 164, which is used for forming an arcuate silicon layer, remain.

Figure 28:
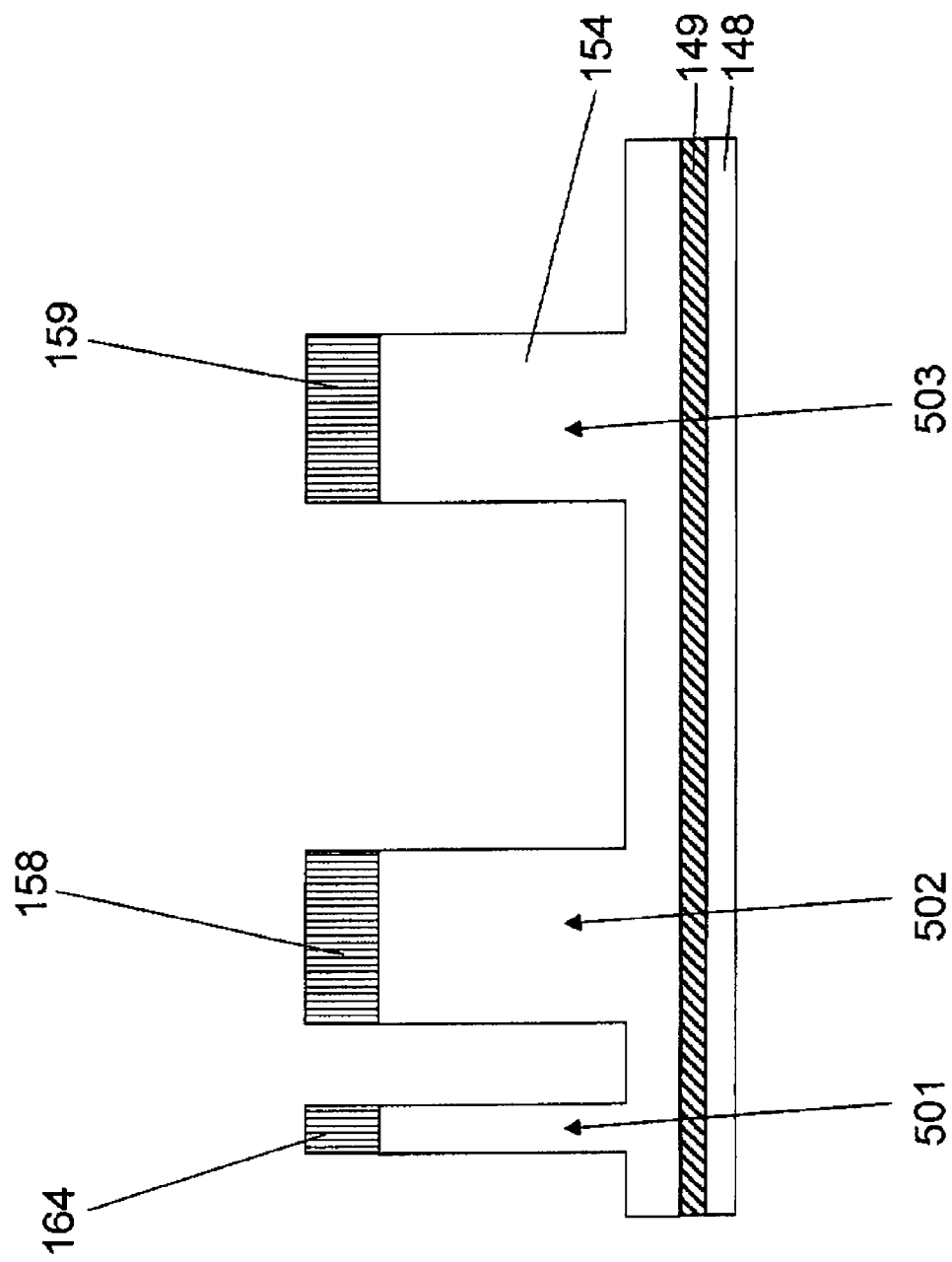
FIG. 28 is a cross-sectional view explaining the method for manufacturing a static memory cell according to the embodiment of the present invention.

Subsequently, as illustrated in FIG. 28, the planar silicon layer 154 is etched to form an arcuate silicon layer 501 for a load transistor, an island-shaped silicon layer 502 for a driver transistor, and an island-shaped silicon layer 503 for an access transistor.

Figure 29:
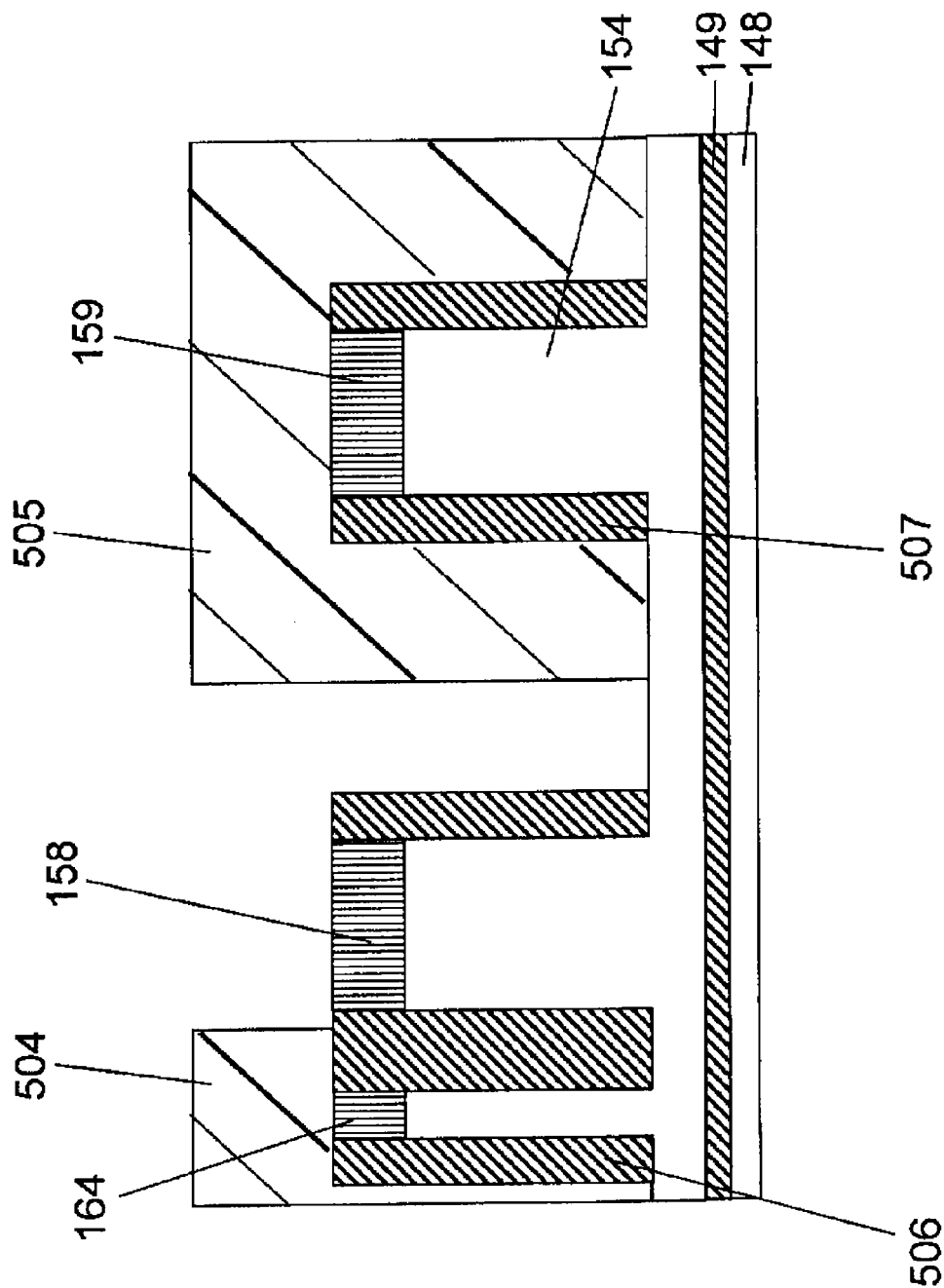
FIG. 29 is a cross-sectional view explaining the method for manufacturing a static memory cell according to the embodiment of the present invention.

Subsequently, as illustrated in FIG. 29, oxide film sidewalls 506 and 507 are formed, and resists 504 and 505 for forming an n+ silicon layer on the bottom of the island-shaped silicon layer of the driver transistor are formed.

Figure 30:
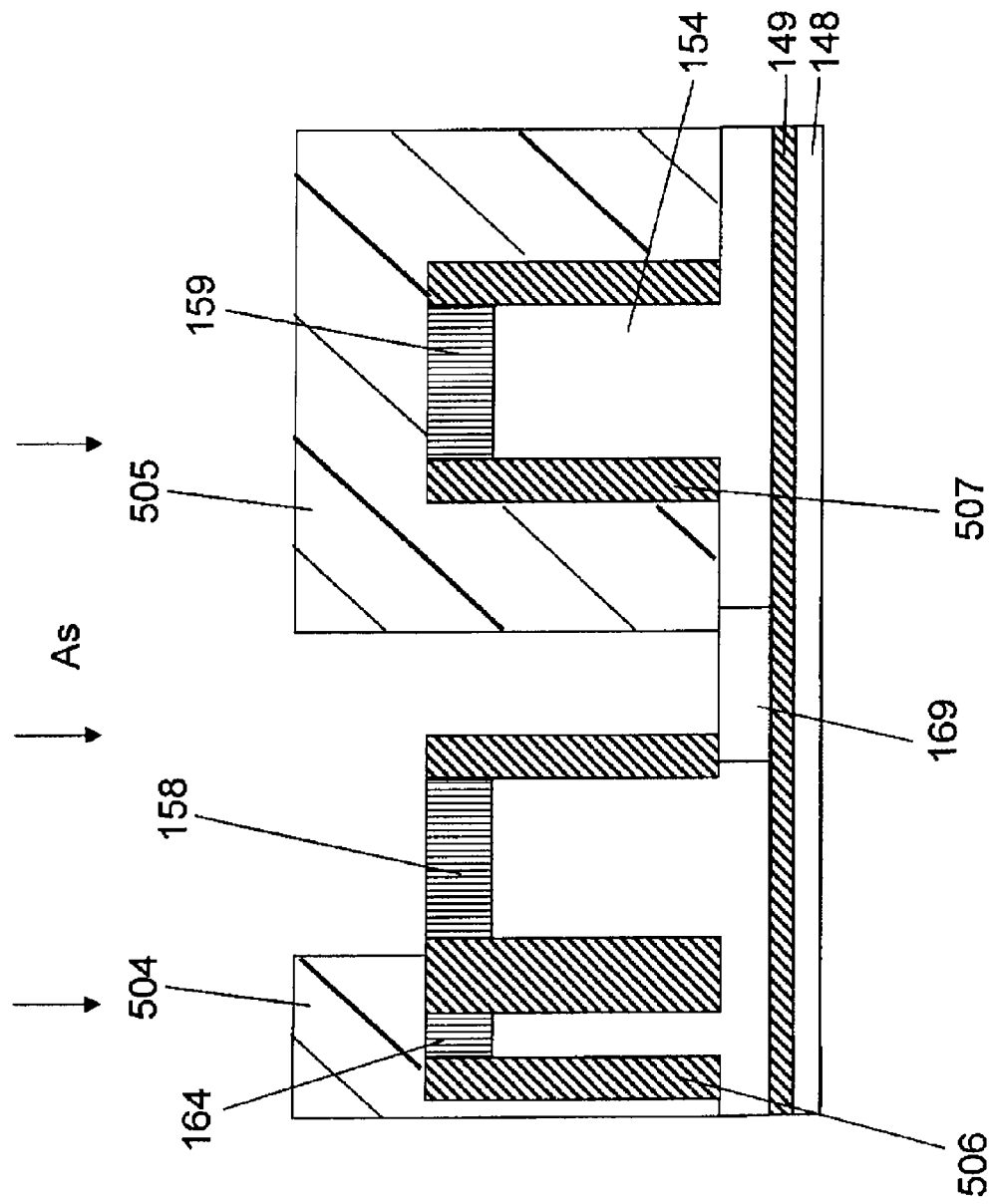
FIG. 30 is a cross-sectional view explaining the method for manufacturing a static memory cell according to the embodiment of the present invention.

Subsequently, as illustrated in FIG. 30, arsenic is implanted to form an n+ silicon layer 169.

Figure 31:
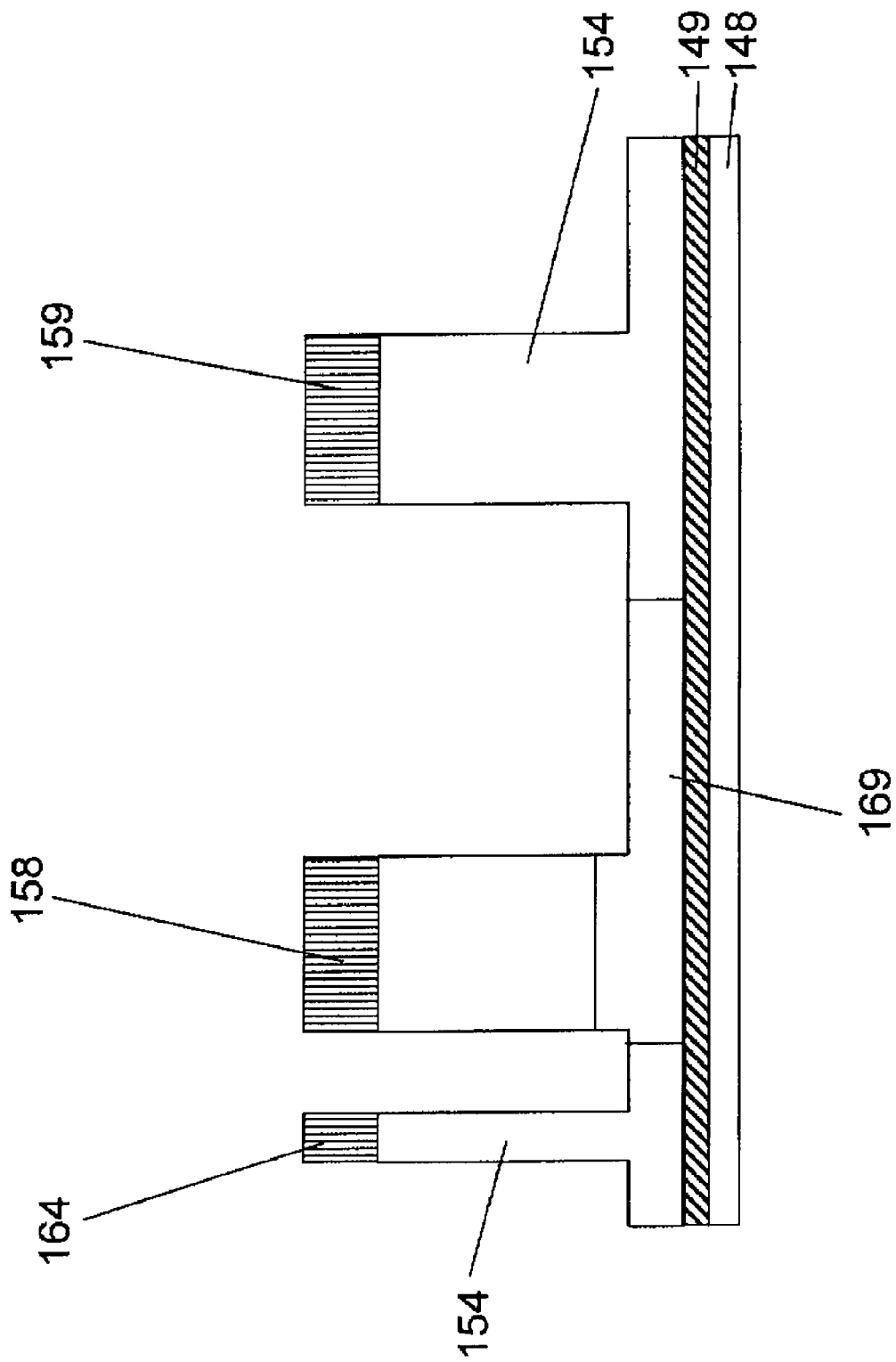
FIG. 31 is a cross-sectional view explaining the method for manufacturing a static memory cell according to the embodiment of the present invention.

Subsequently, as illustrated in FIG. 31, the resists 504 and 505 are stripped, and the oxide film sidewalls 506 and 507 are stripped. Then, the first heat treatment is carried out.

Figure 32:
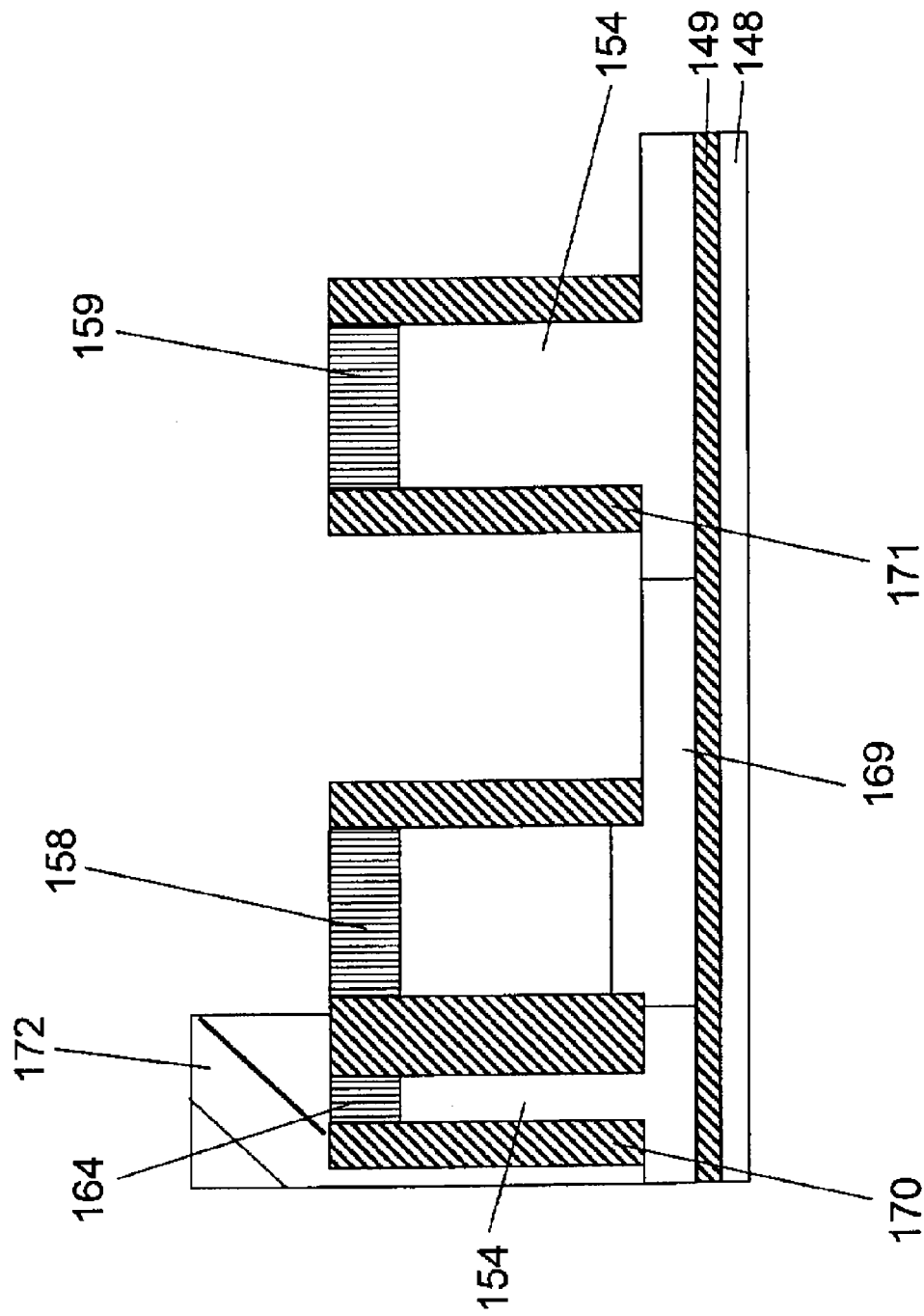
FIG. 32 is a cross-sectional view explaining the method for manufacturing a static memory cell according to the embodiment of the present invention.

Subsequently, as illustrated in FIG. 32, oxide film sidewalls 170 and 171 are formed, and a resist 172 for forming an n+ silicon layer on the bottom of the island-shaped silicon layer of the access transistor is formed.

Figure 33:
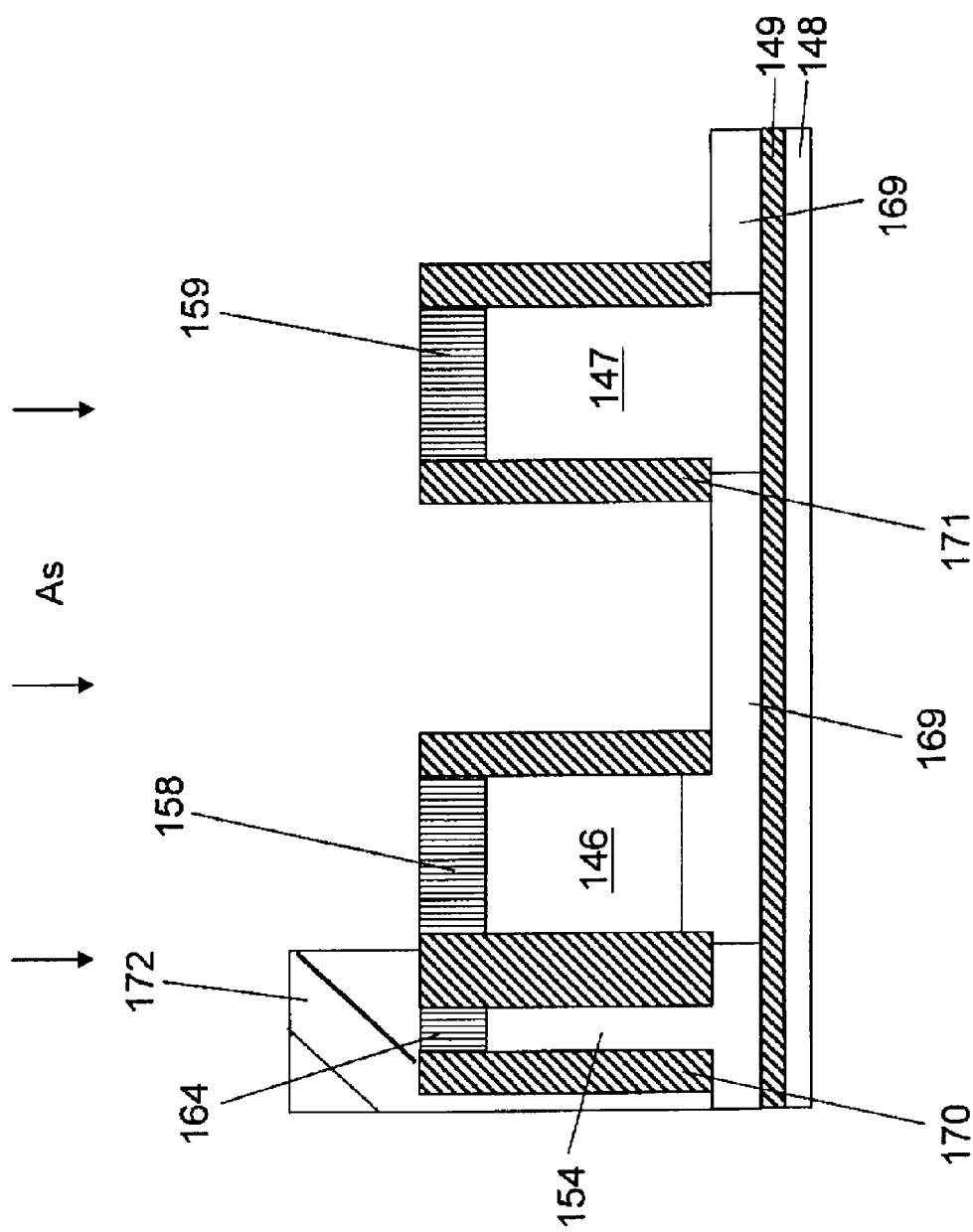
FIG. 33 is a cross-sectional view explaining the method for manufacturing a static memory cell according to the embodiment of the present invention.

Subsequently, as illustrated in FIG. 33, arsenic is implanted to form an n+ silicon layer 169 on the bottom of the island-shaped silicon layer of the access transistor.

Figure 34:
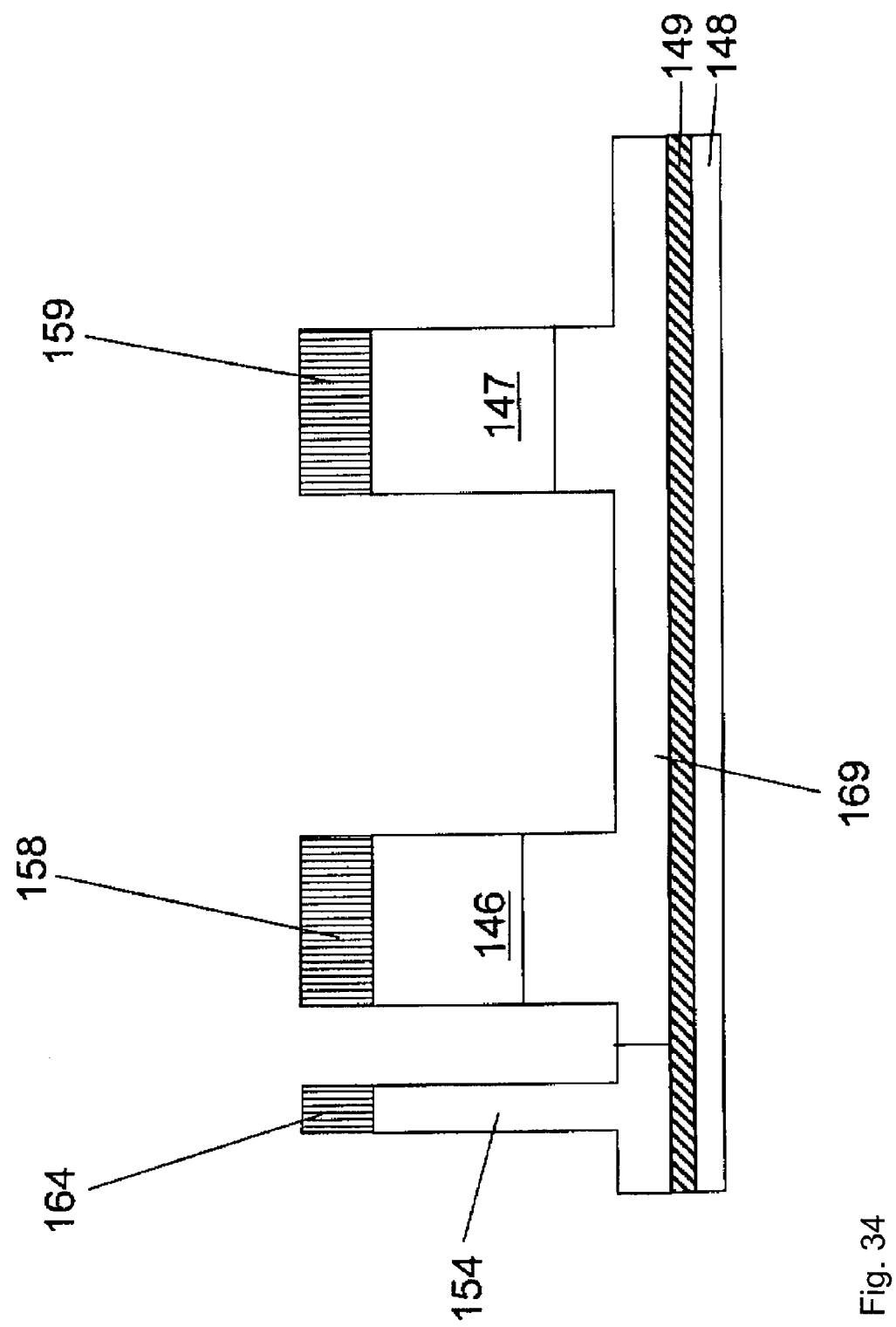
FIG. 34 is a cross-sectional view explaining the method for manufacturing a static memory cell according to the embodiment of the present invention.

Subsequently, as illustrated in FIG. 34, the resist 172 is stripped, and the oxide film sidewalls 170 and 171 are stripped. Then, the second heat treatment is carried out. Since the n+ silicon layer on the bottom of the island-shaped silicon layer of the driver transistor undergoes heat treatment twice, the upper end of the n+ silicon layer on the bottom of the island-shaped silicon layer of the driver transistor is positioned higher than the upper end of the n+ silicon layer on the bottom of the island-shaped silicon layer of the access transistor. Therefore, the channel length of the driver transistor is shorter than the channel length of the access transistor, and operational stability can be ensured.

Figure 35:
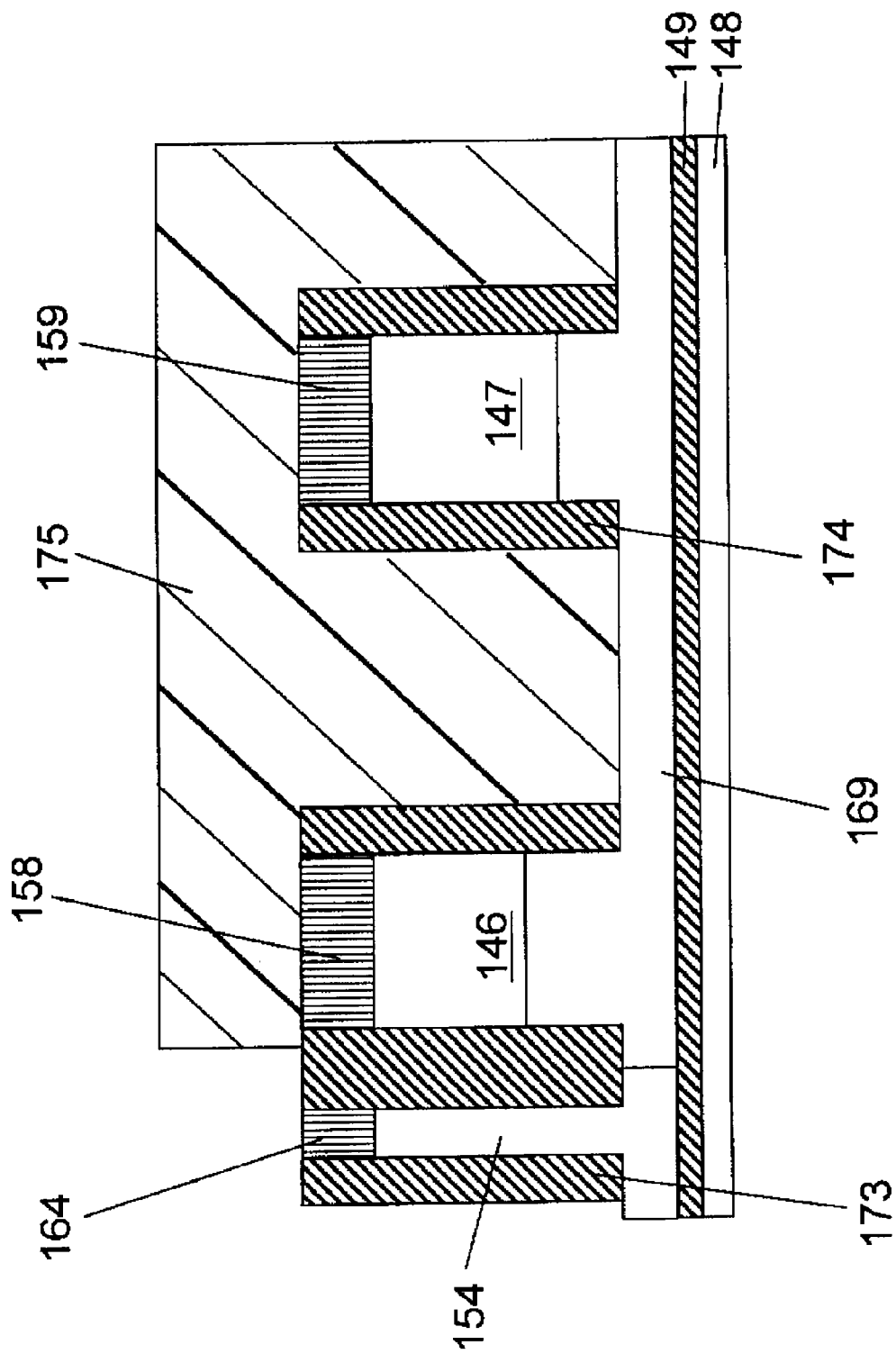
FIG. 35 is a cross-sectional view explaining the method for manufacturing a static memory cell according to the embodiment of the present invention.

Subsequently, as illustrated in FIG. 35, oxide film sidewalls 173 and 174 are formed, and a resist 175 for forming a p+ silicon layer on the bottom of the arcuate silicon layer of the load transistor is formed.

Figure 36:
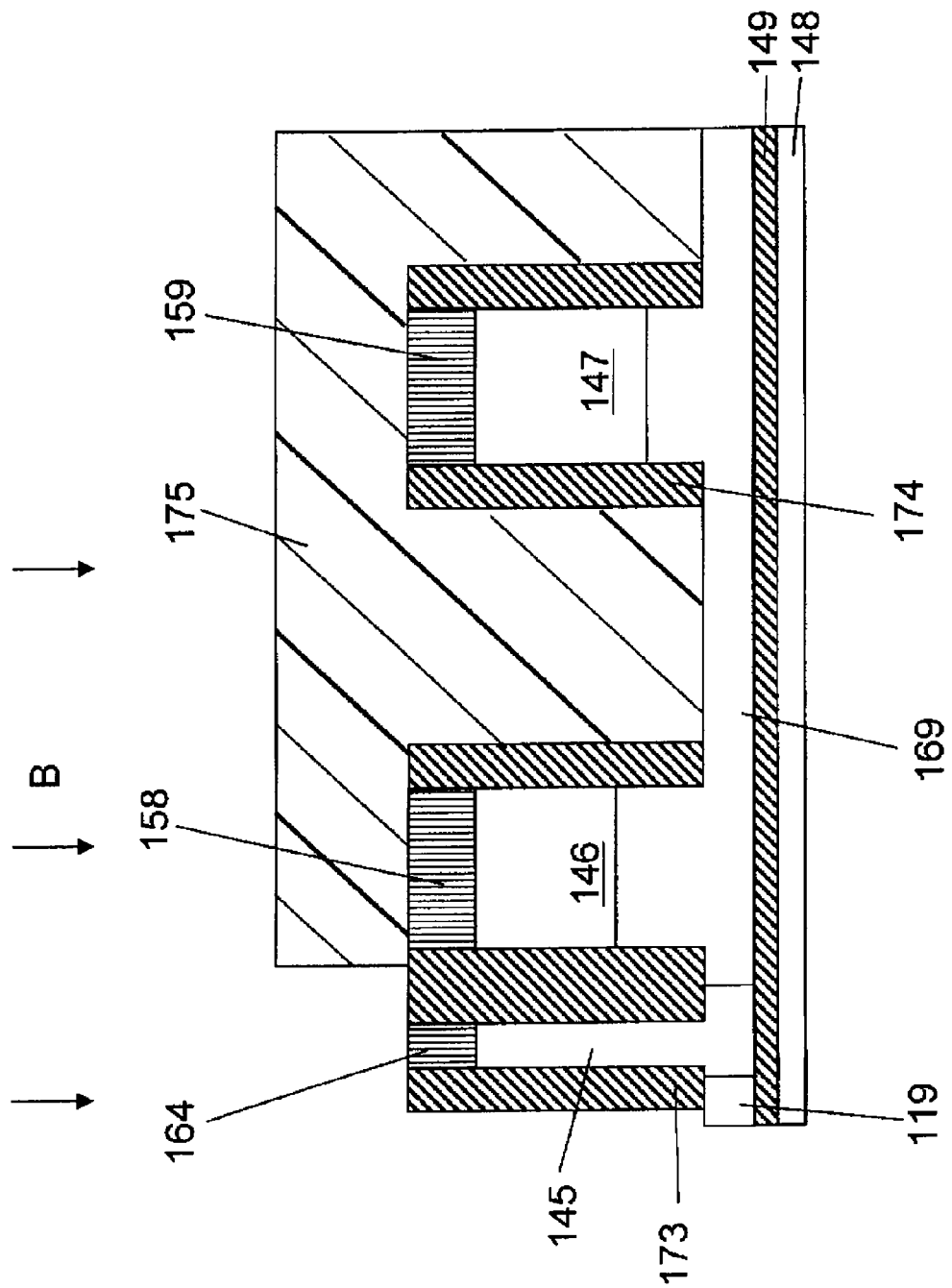
FIG. 36 is a cross-sectional view explaining the method for manufacturing a static memory cell according to the embodiment of the present invention.

Subsequently, as illustrated in FIG. 36, boron is implanted to form a p+ silicon layer 119 on the bottom of the arcuate silicon layer.

Figure 37:
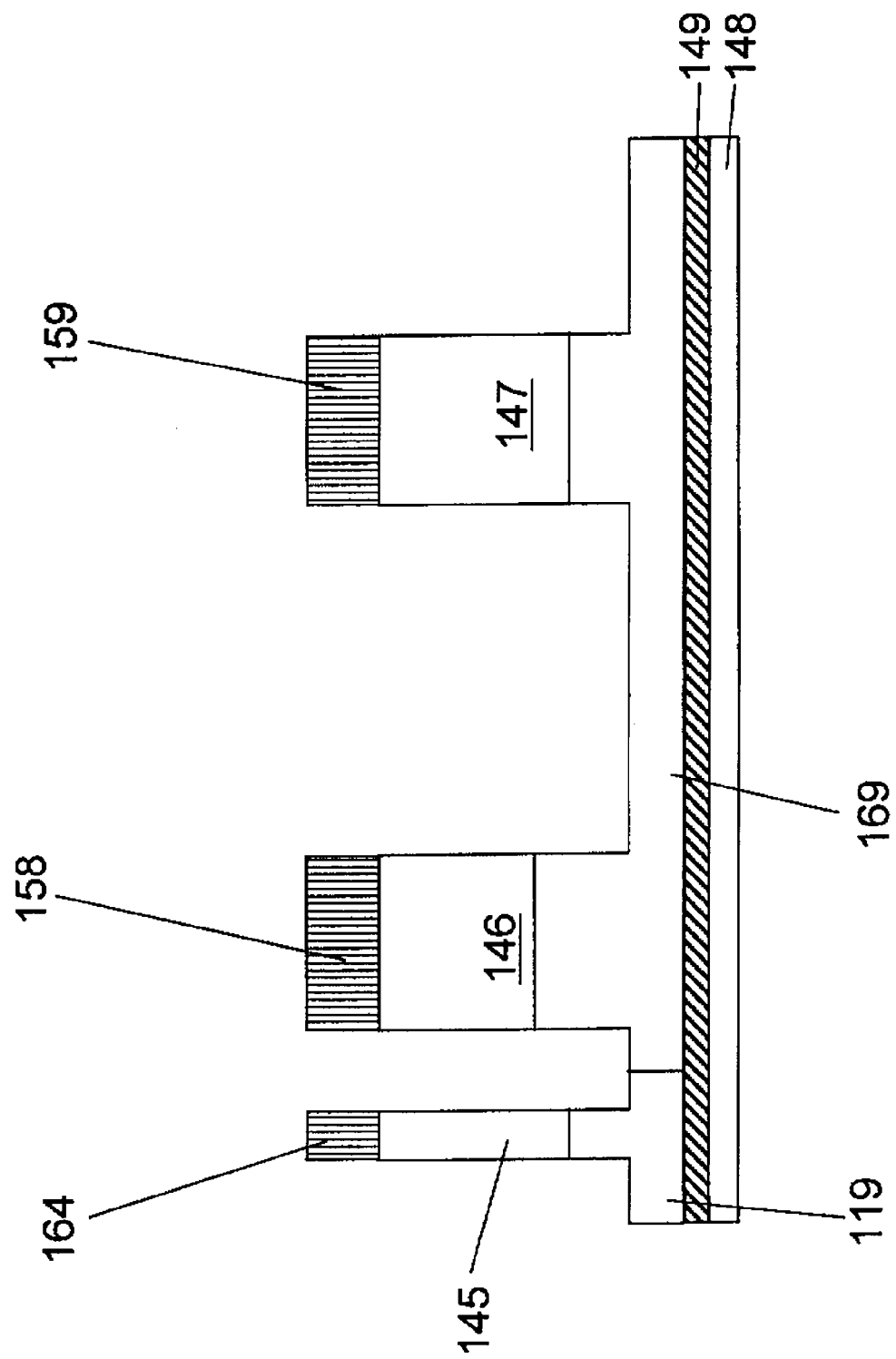
FIG. 37 is a cross-sectional view explaining the method for manufacturing a static memory cell according to the embodiment of the present invention.

Subsequently, as illustrated in FIG. 37, the resist 175 is stripped, and the oxide film sidewalls 173 and 174 are stripped. Then, heat treatment is carried out.

Figure 38:
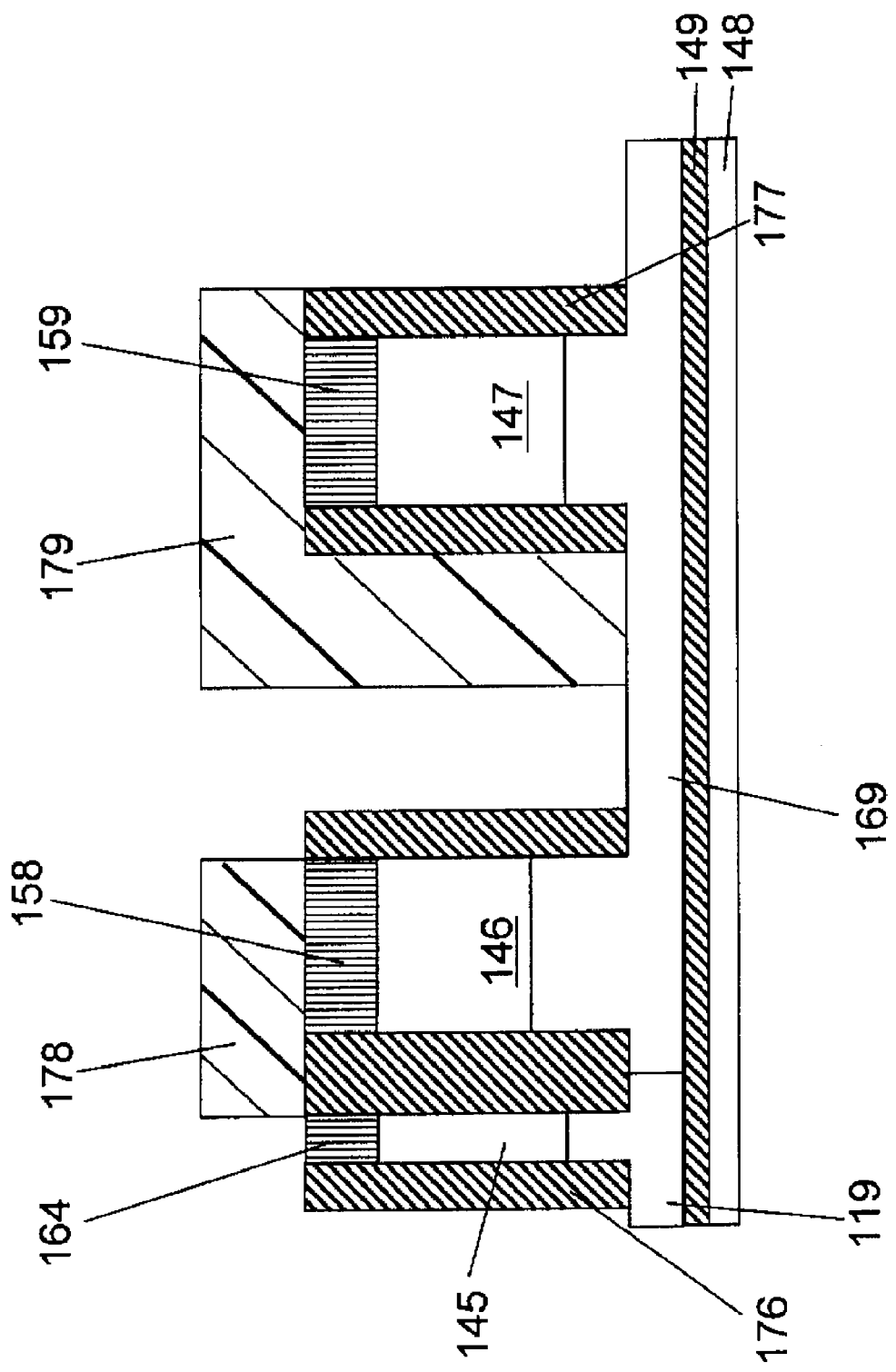
FIG. 38 is a cross-sectional view explaining the method for manufacturing a static memory cell according to the embodiment of the present invention.

Subsequently, as illustrated in FIG. 38, oxide film sidewalls 176 and 177 are formed, and resists 178 and 179 for forming a storage node are formed. The oxide film sidewalls 176 and 177 allow a storage node to be formed around the arcuate silicon layer and the island-shaped silicon layer by self-alignment.

Figure 39:
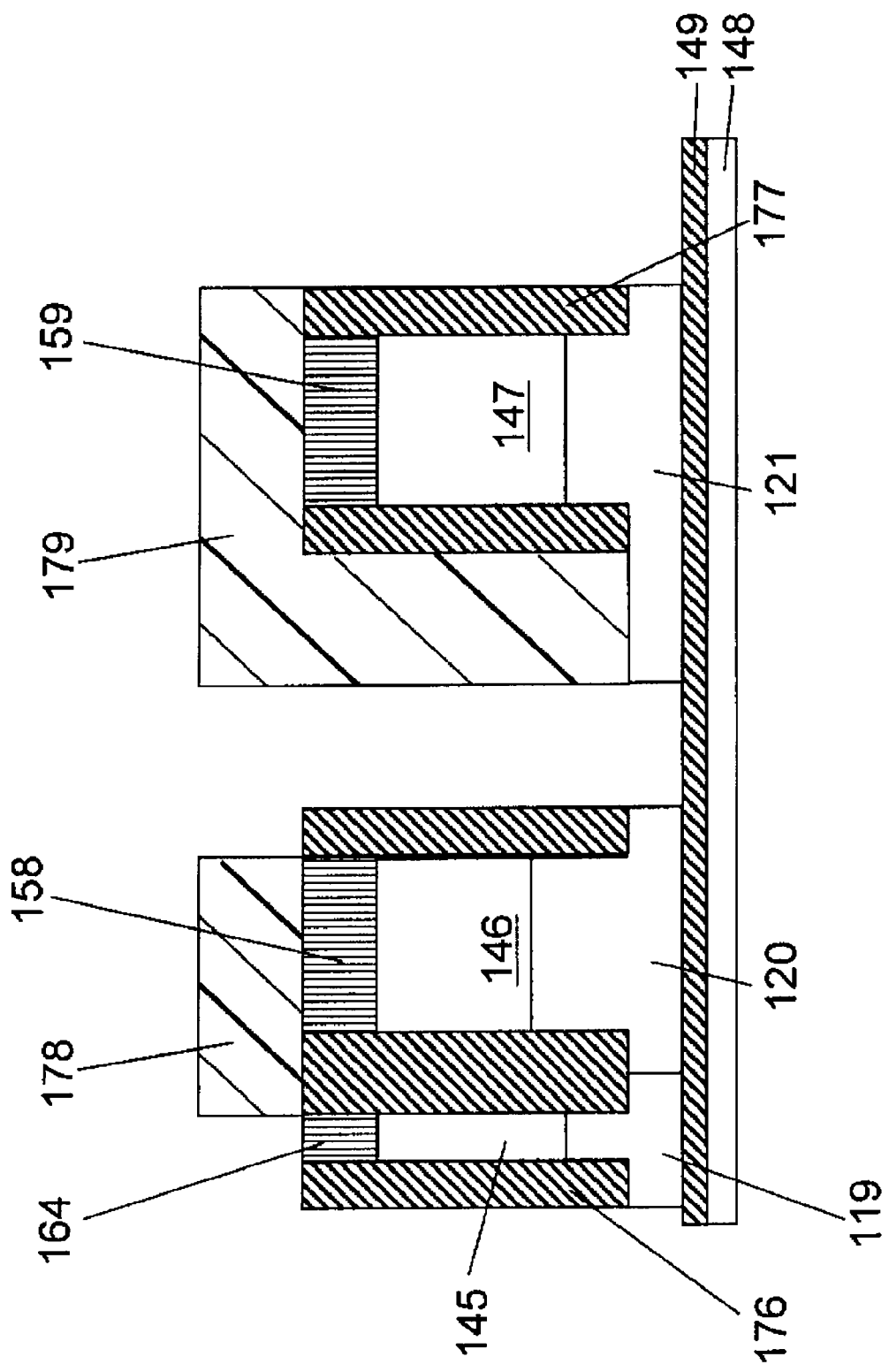
FIG. 39 is a cross-sectional view explaining the method for manufacturing a static memory cell according to the embodiment of the present invention.

Subsequently, as illustrated in FIG. 39, the n+ silicon layer 169 and the p+ silicon layer 119 are etched to form n+ silicon layers 120 and 121 and a p+ silicon layer 119.

Figure 40:
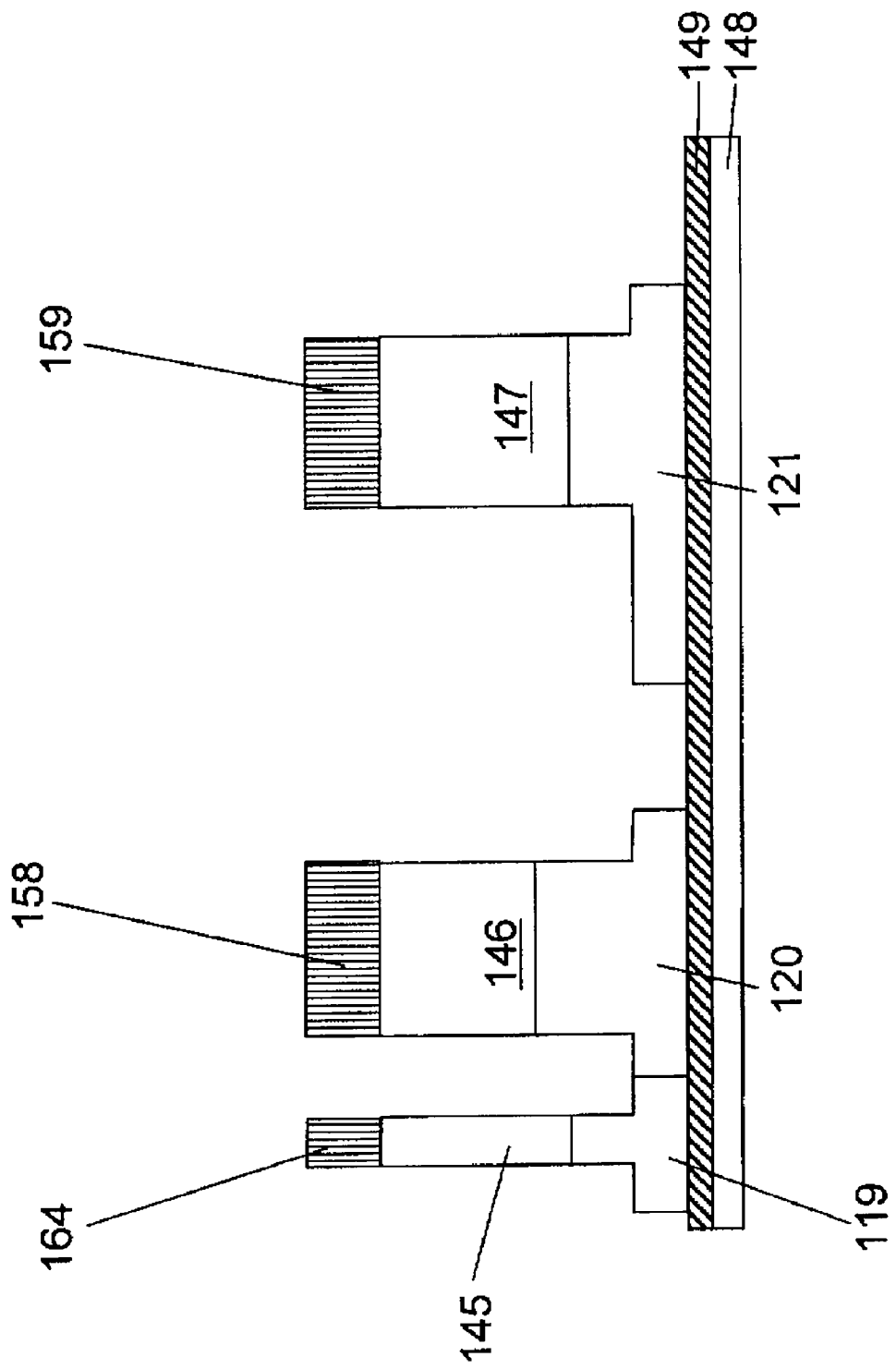
FIG. 40 is a cross-sectional view explaining the method for manufacturing a static memory cell according to the embodiment of the present invention.

Subsequently, as illustrated in FIG. 40, the resists 178 and 179 are stripped, and the oxide film sidewalls 176 and 177 are stripped.

Figure 41:
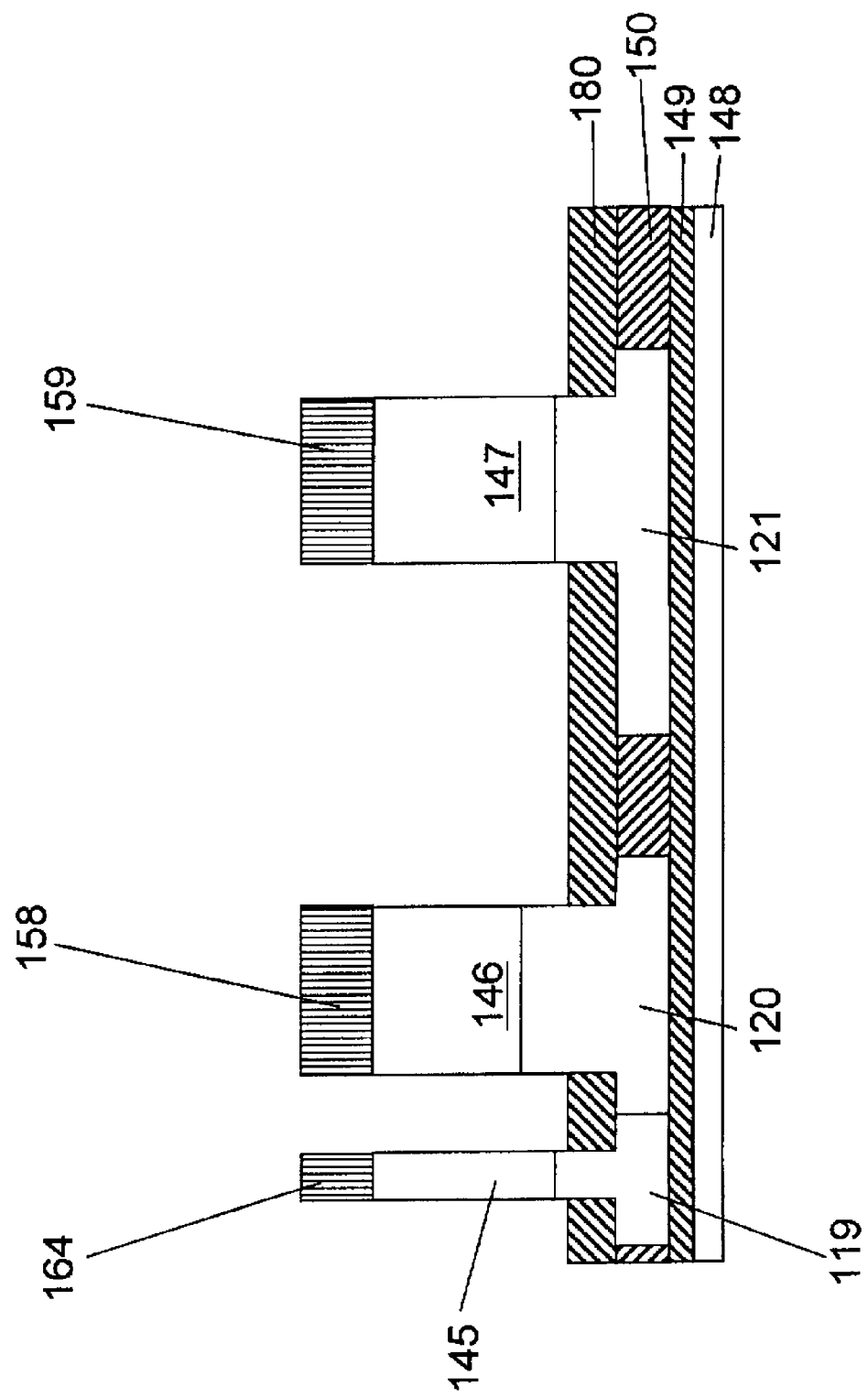
FIG. 41 is a cross-sectional view explaining the method for manufacturing a static memory cell according to the embodiment of the present invention.

Subsequently, as illustrated in FIG. 41, an element separation film 150 is formed, and an oxide film 180 is formed.

Figure 42:
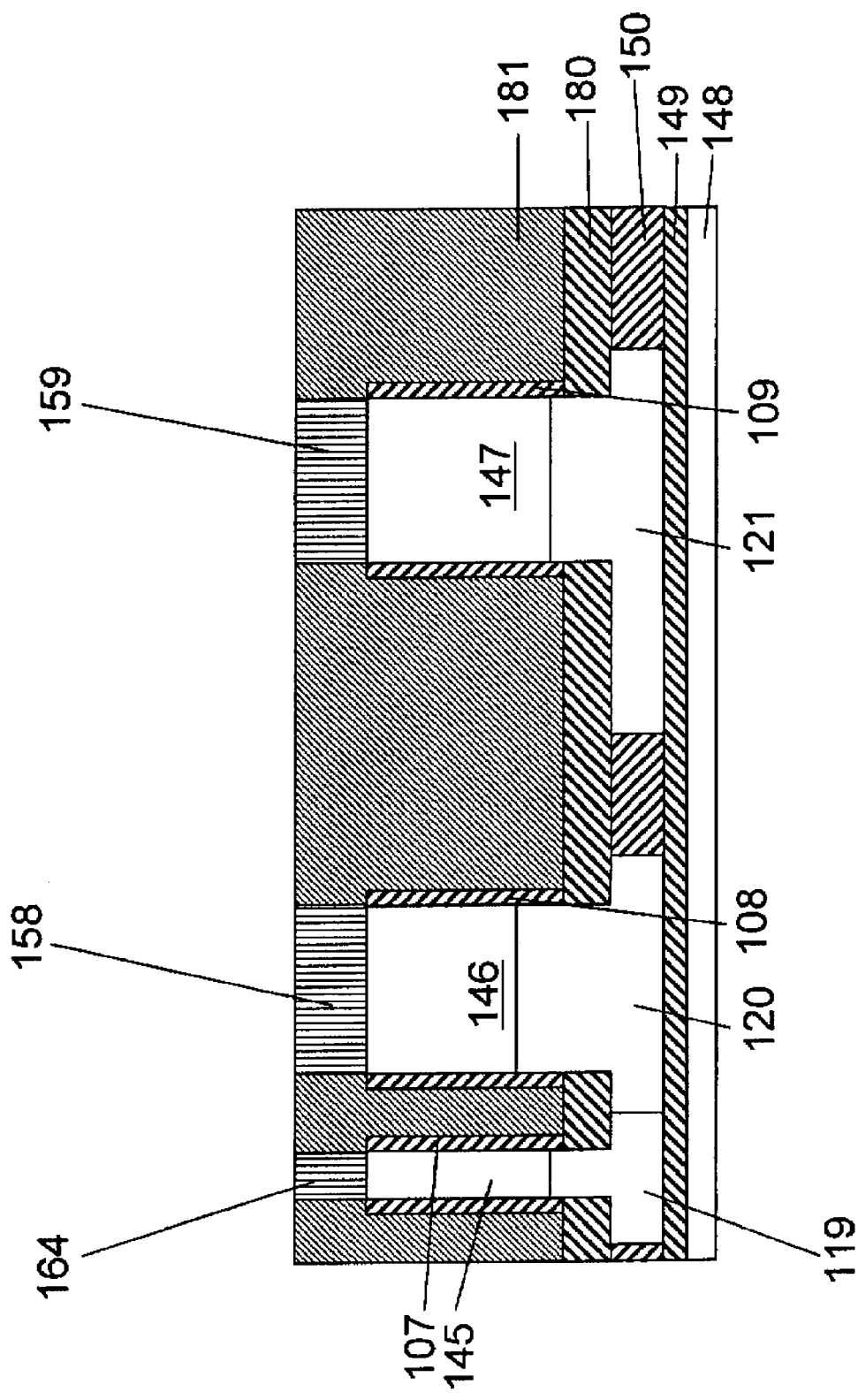
FIG. 42 is a cross-sectional view explaining the method for manufacturing a static memory cell according to the embodiment of the present invention.

Subsequently, as illustrated in FIG. 42, gate insulating films 107, 108, and 109 are formed, and a gate conductive film 181 is deposited. Then, the gate conductive film 181 is planarized using the nitride film hard masks 158 and 159 as stoppers. Since a hard mask is used as a planarization stopper, the gate length can be made uniform across a wafer surface.

Figure 43:
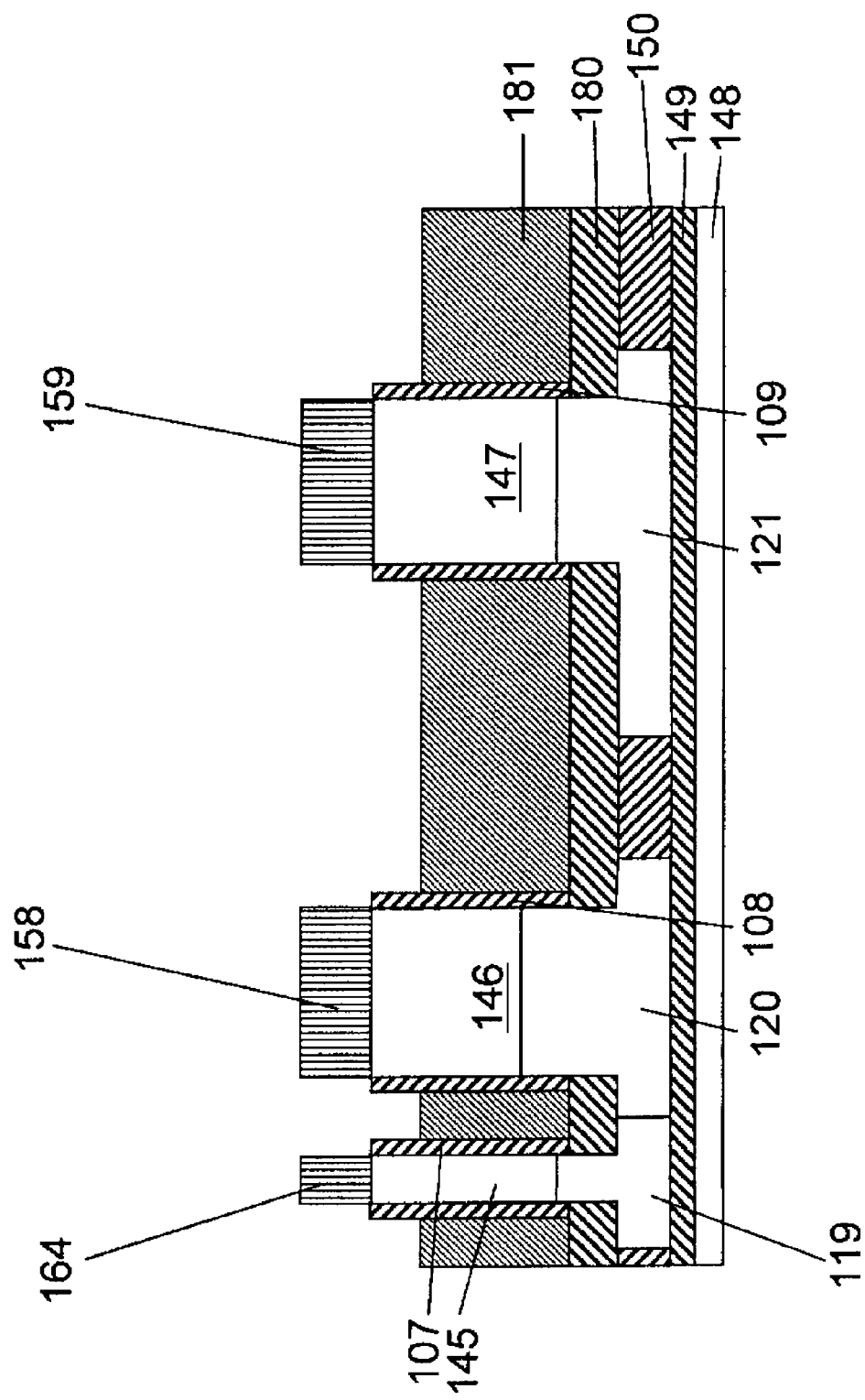
FIG. 43 is a cross-sectional view explaining the method for manufacturing a static memory cell according to the embodiment of the present invention.

Subsequently, as illustrated in FIG. 43, the gate conductive film 181 is etched back to a desired length.

Figure 44:
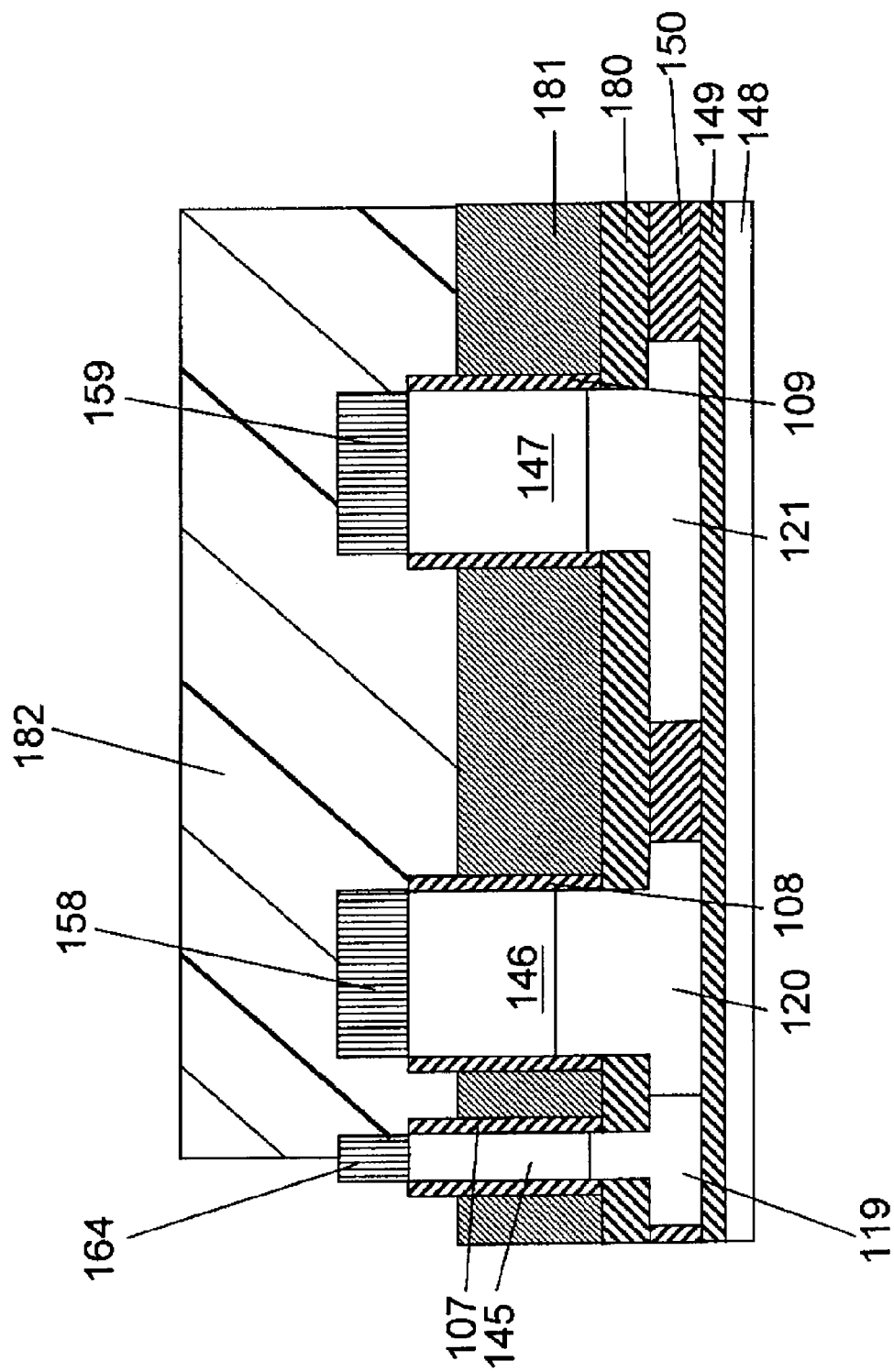
FIG. 44 is a cross-sectional view explaining the method for manufacturing a static memory cell according to the embodiment of the present invention.

Subsequently, as illustrated in FIG. 44, a resist 182 for removing a portion of the gate conductive film 181 is formed.

Figure 45:
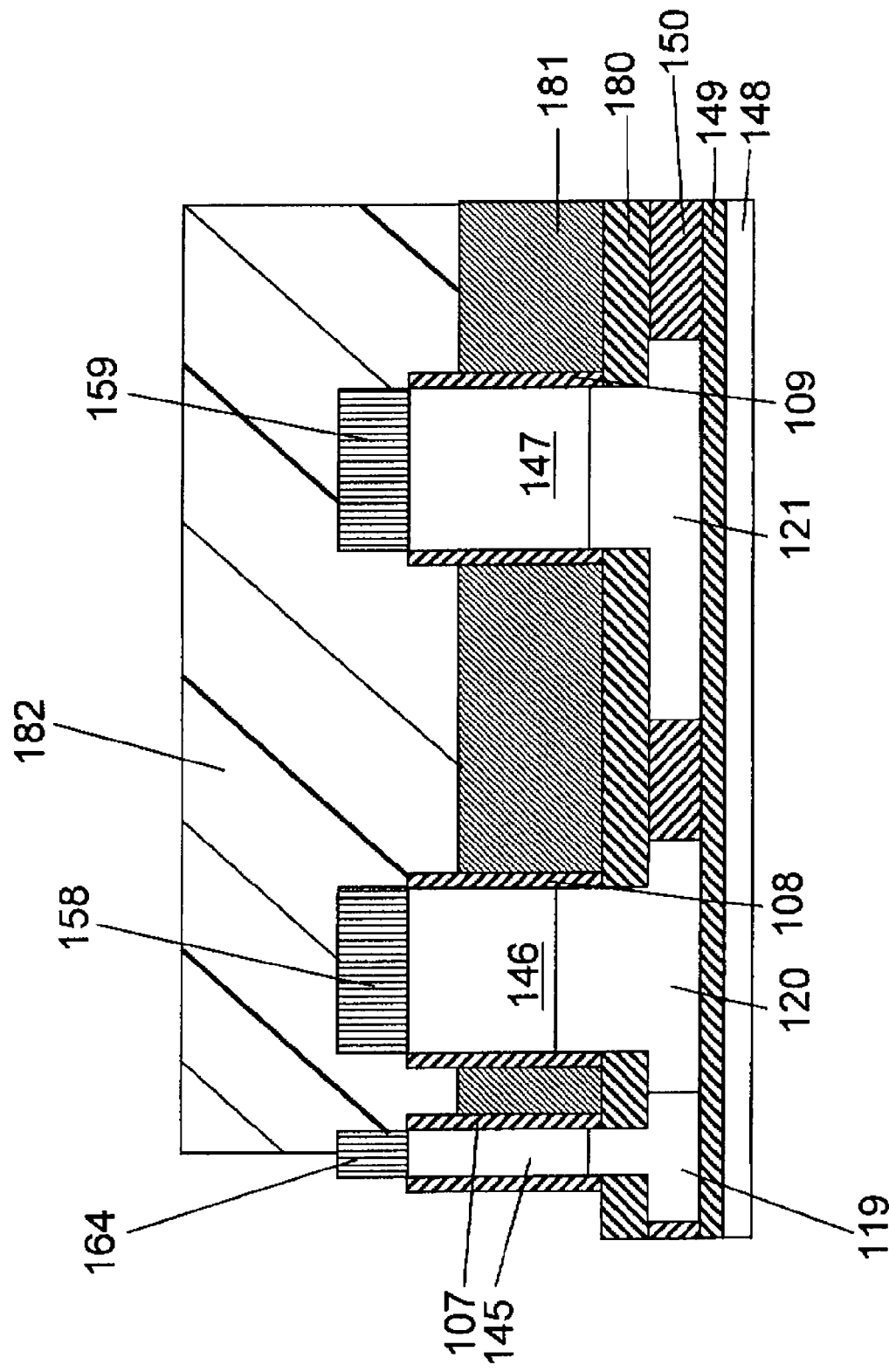
FIG. 45 is a cross-sectional view explaining the method for manufacturing a static memory cell according to the embodiment of the present invention.

Subsequently, as illustrated in FIG. 45, a portion of the gate conductive film 181 is removed by etching.

Figure 46:
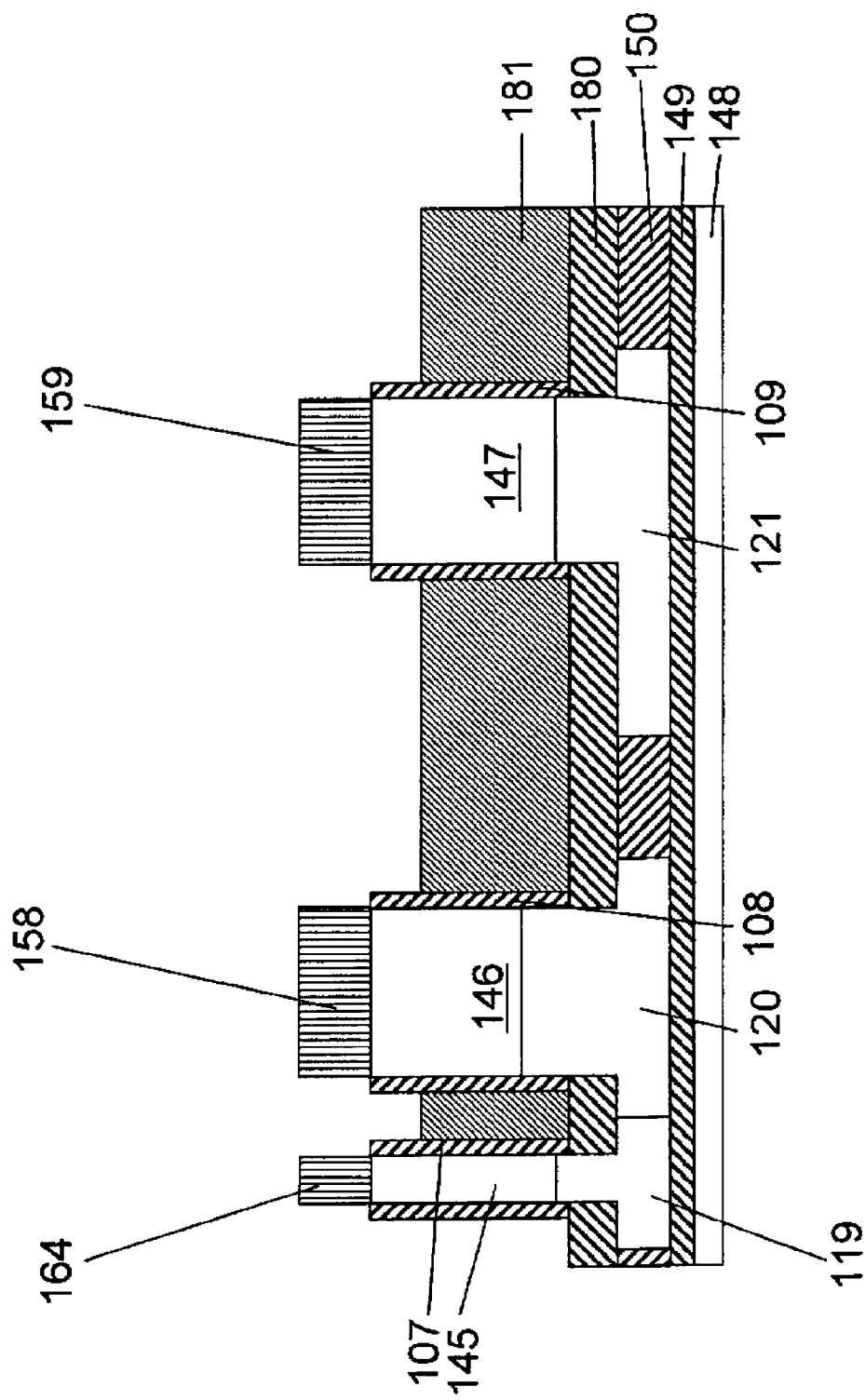
FIG. 46 is a cross-sectional view explaining the method for manufacturing a static memory cell according to the embodiment of the present invention.

Subsequently, as illustrated in FIG. 46, the resist 182 is stripped.

Figure 47:
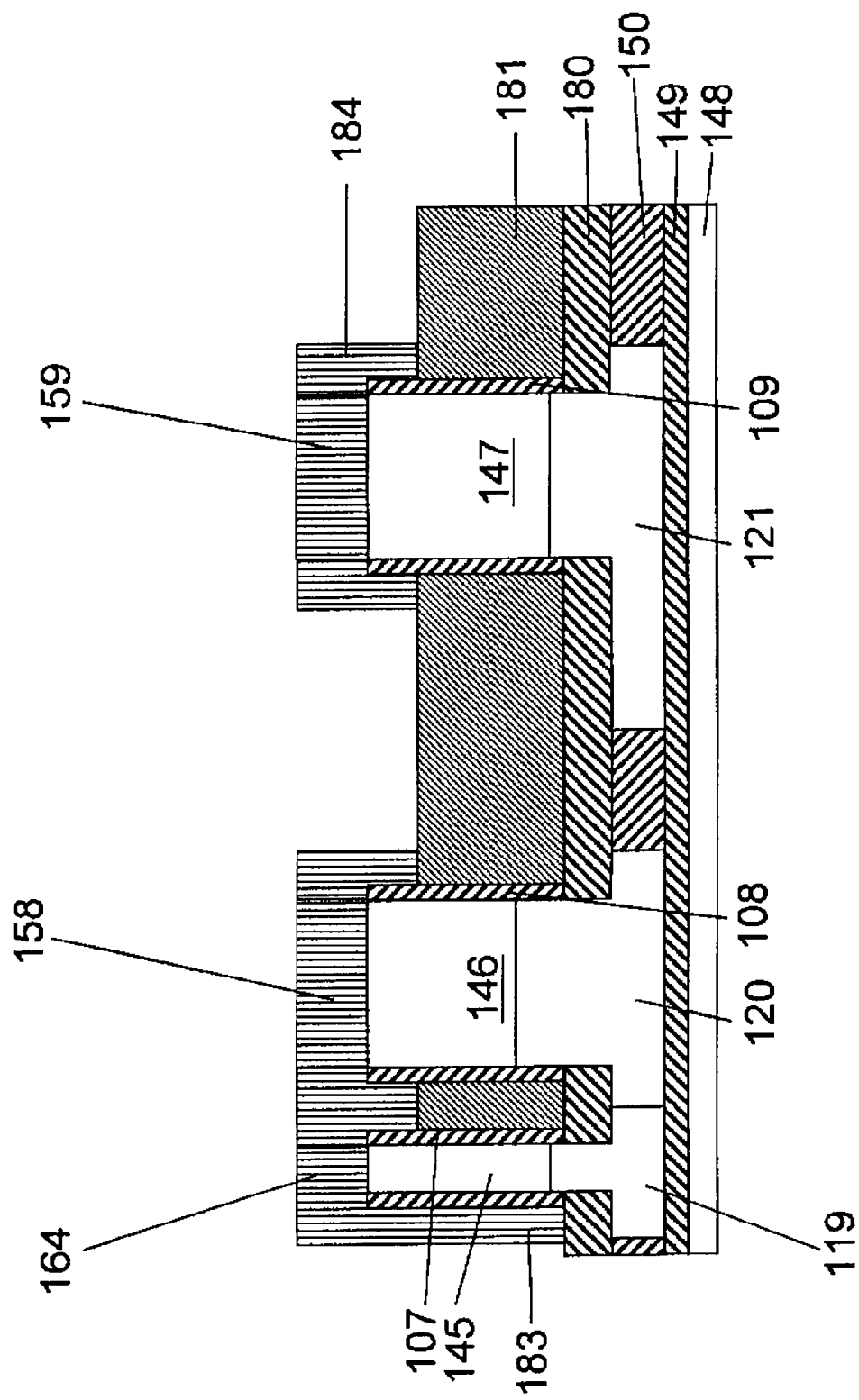
FIG. 47 is a cross-sectional view explaining the method for manufacturing a static memory cell according to the embodiment of the present invention.

Subsequently, as illustrated in FIG. 47, nitride film sidewalls 183 and 184 are formed. The nitride film sidewalls 183 and 184 may be oxide film sidewalls or sidewalls formed by laminating a nitride film and an oxide film.

Figure 48:
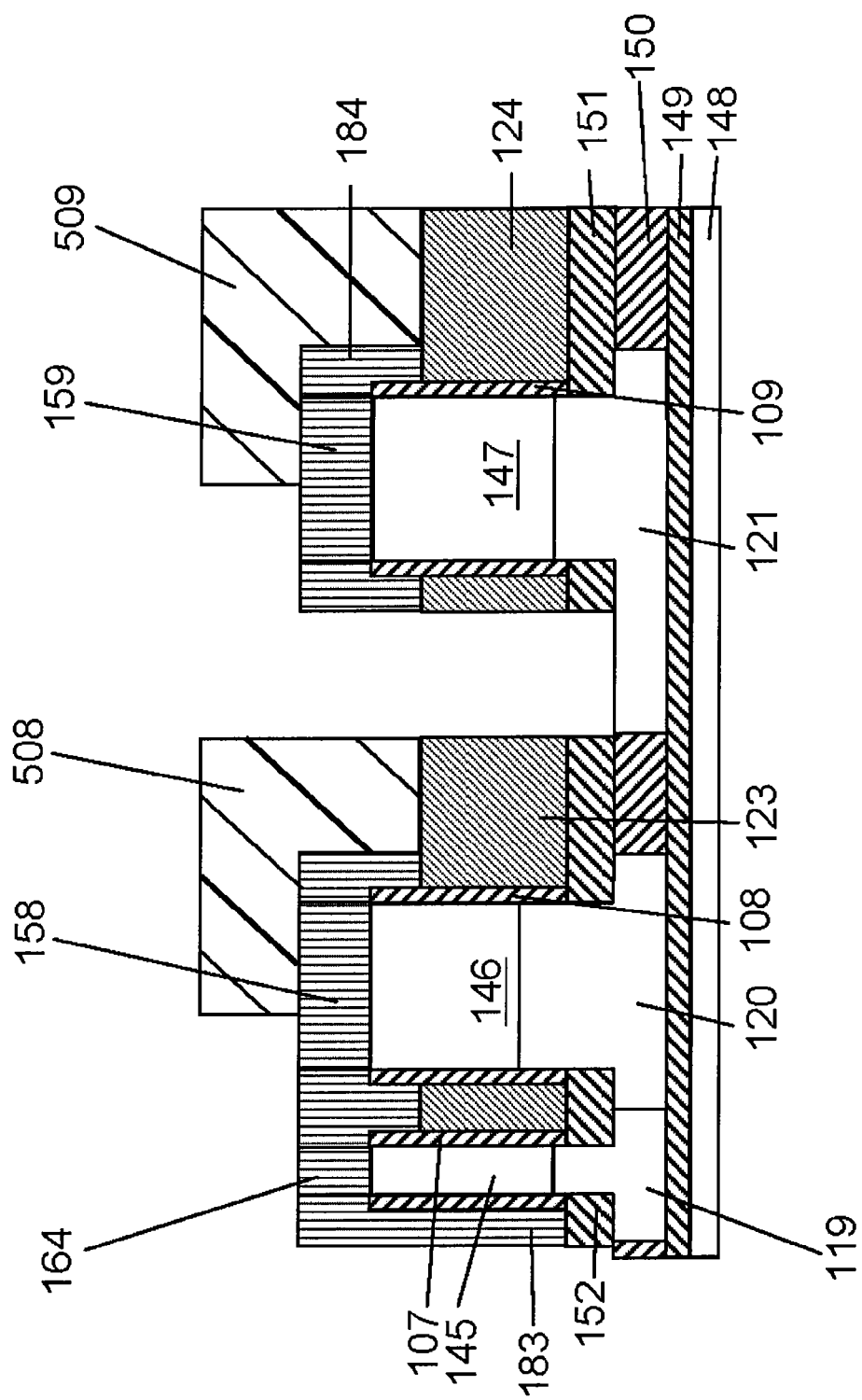
FIG. 48 is a cross-sectional view explaining the method for manufacturing a static memory cell according to the embodiment of the present invention.

Subsequently, as illustrated in FIG. 48, resists 508 and 509 for forming a gate line are formed, and the gate conductive film 181 is etched to form gates 123 and 124. Further, the oxide film 180 is etched to form insulating films 152 and 151.

Figure 49:
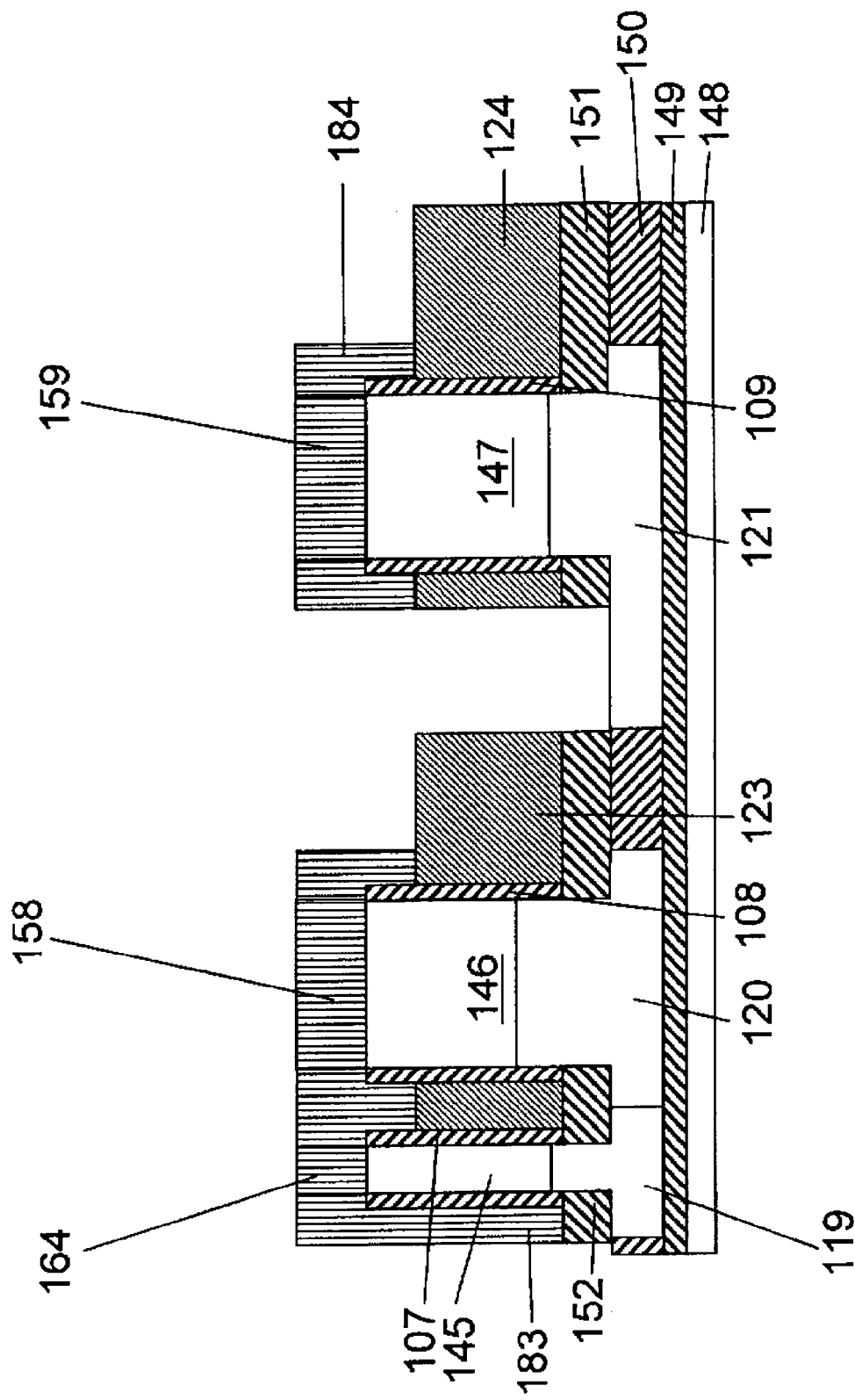
FIG. 49 is a cross-sectional view explaining the method for manufacturing a static memory cell according to the embodiment of the present invention.

Subsequently, as illustrated in FIG. 49, the resists 508 and 509 are stripped.

Figure 50:
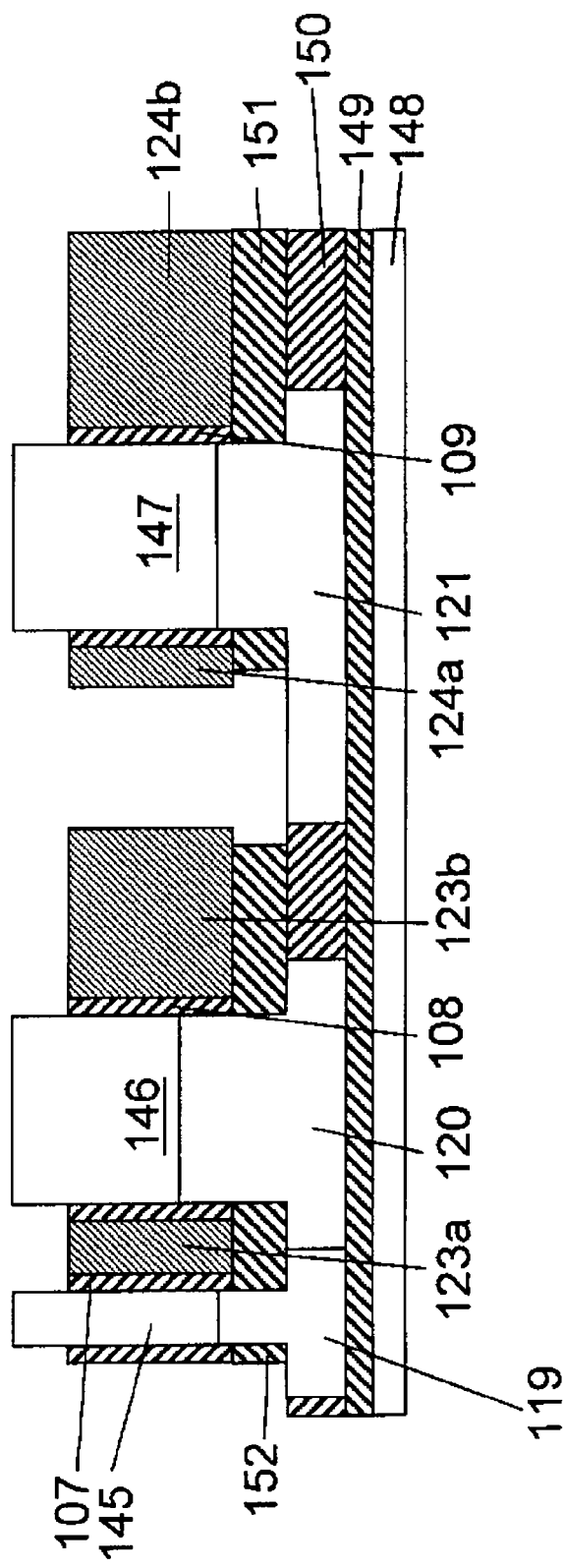
FIG. 50 is a cross-sectional view explaining the method for manufacturing a static memory cell according to the embodiment of the present invention.

Subsequently, as illustrated in FIG. 50, the nitride film hard masks 158 and 159, the nitride film sidewall 164, and the nitride film sidewalls 183 and 184 are removed by etching.

Figure 51:
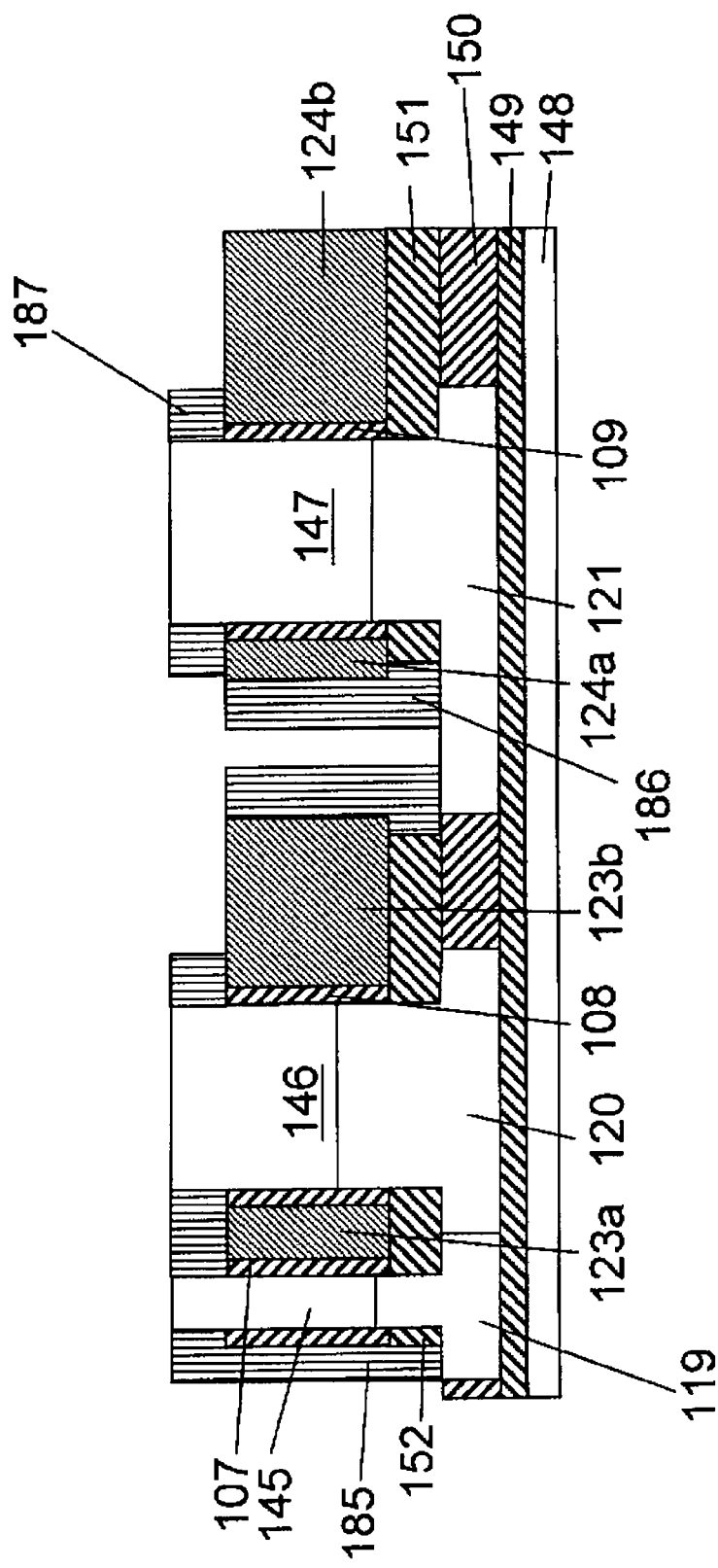
FIG. 51 is a cross-sectional view explaining the method for manufacturing a static memory cell according to the embodiment of the present invention.

Subsequently, as illustrated in FIG. 51, a nitride film is deposited and is then etched to form nitride film sidewalls 185, 186, and 187.

Figure 52:
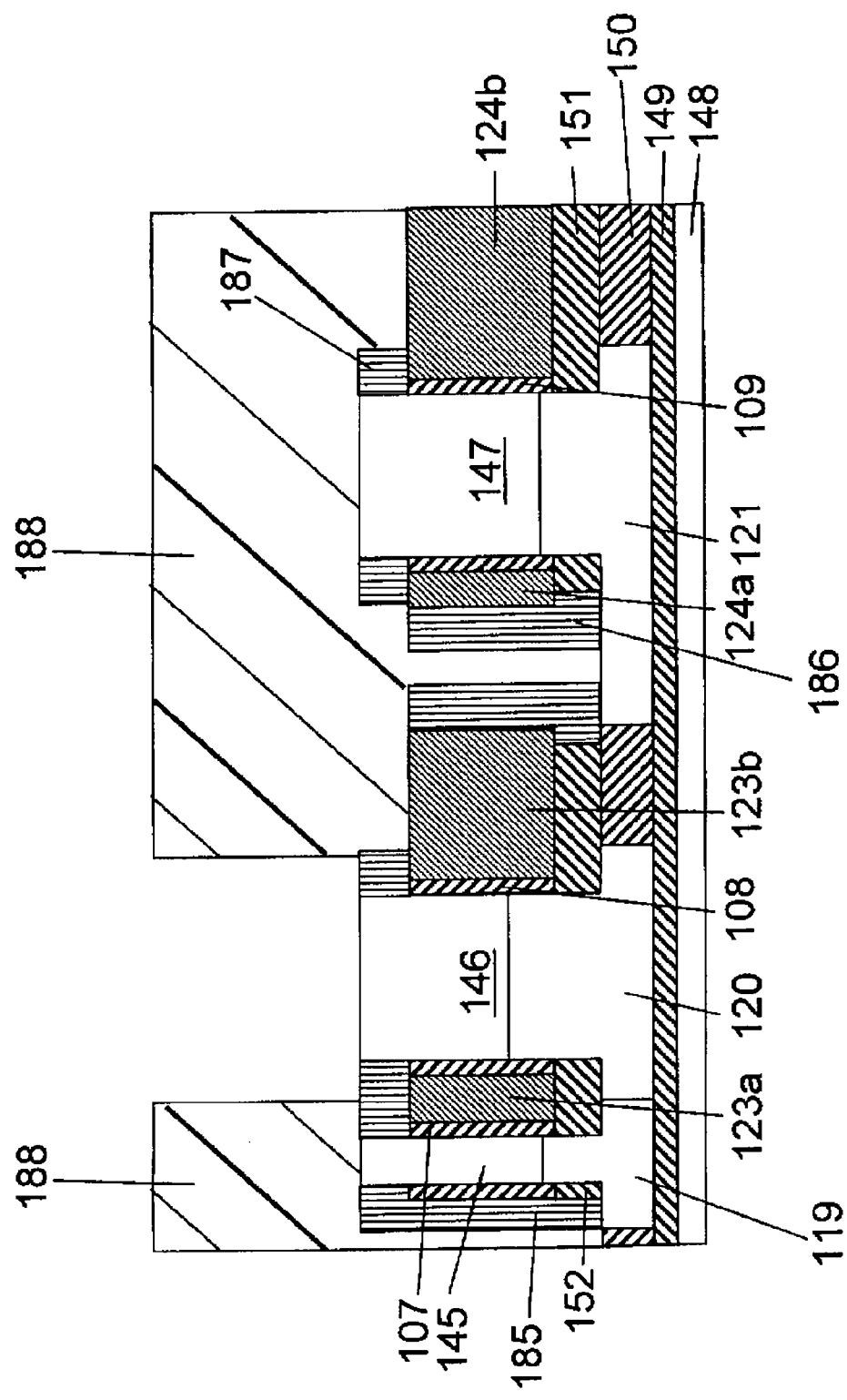
FIG. 52 is a cross-sectional view explaining the method for manufacturing a static memory cell according to the embodiment of the present invention.

Subsequently, as illustrated in FIG. 52, a resist 188 for forming an n+ silicon layer on the top of the island-shaped silicon layer of the driver transistor is formed.

Figure 53:
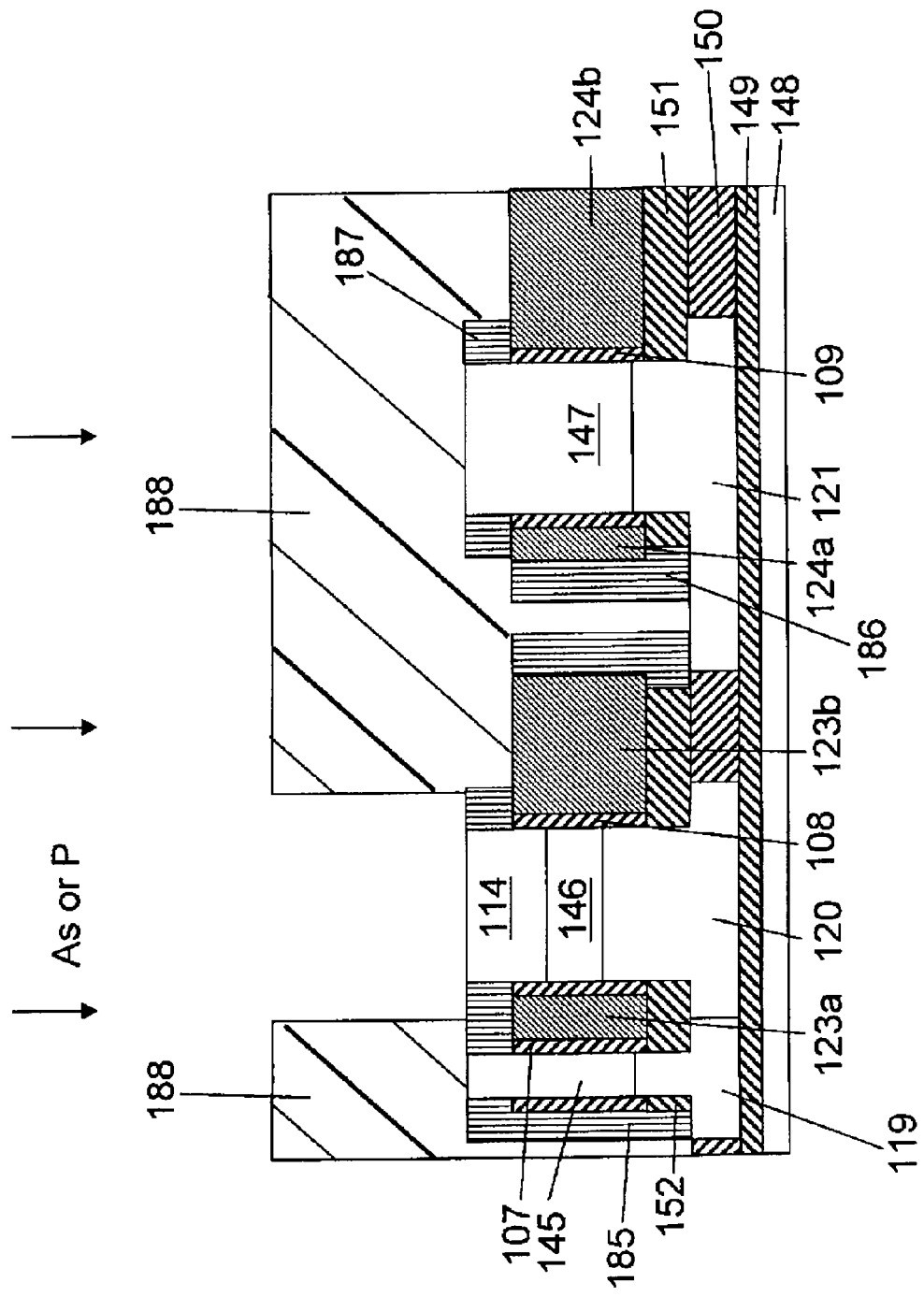
FIG. 53 is a cross-sectional view explaining the method for manufacturing a static memory cell according to the embodiment of the present invention.

Subsequently, as illustrated in FIG. 53, arsenic or phosphorus is implanted to form an n+ silicon layer 114 on the top of the island-shaped silicon layer of the driver transistor. When arsenic is to be used, the energy of the ion implantation may be increased. Phosphorus having a long diffusion length is used, thus enabling the lower end of the n+ silicon layer on the top of the island-shaped silicon layer of the driver transistor to be positioned lower than the lower end of the n+ silicon layer on the top of the island-shaped silicon layer of the access transistor. Whether to use arsenic or phosphorus may be selected as desired.

Figure 54:
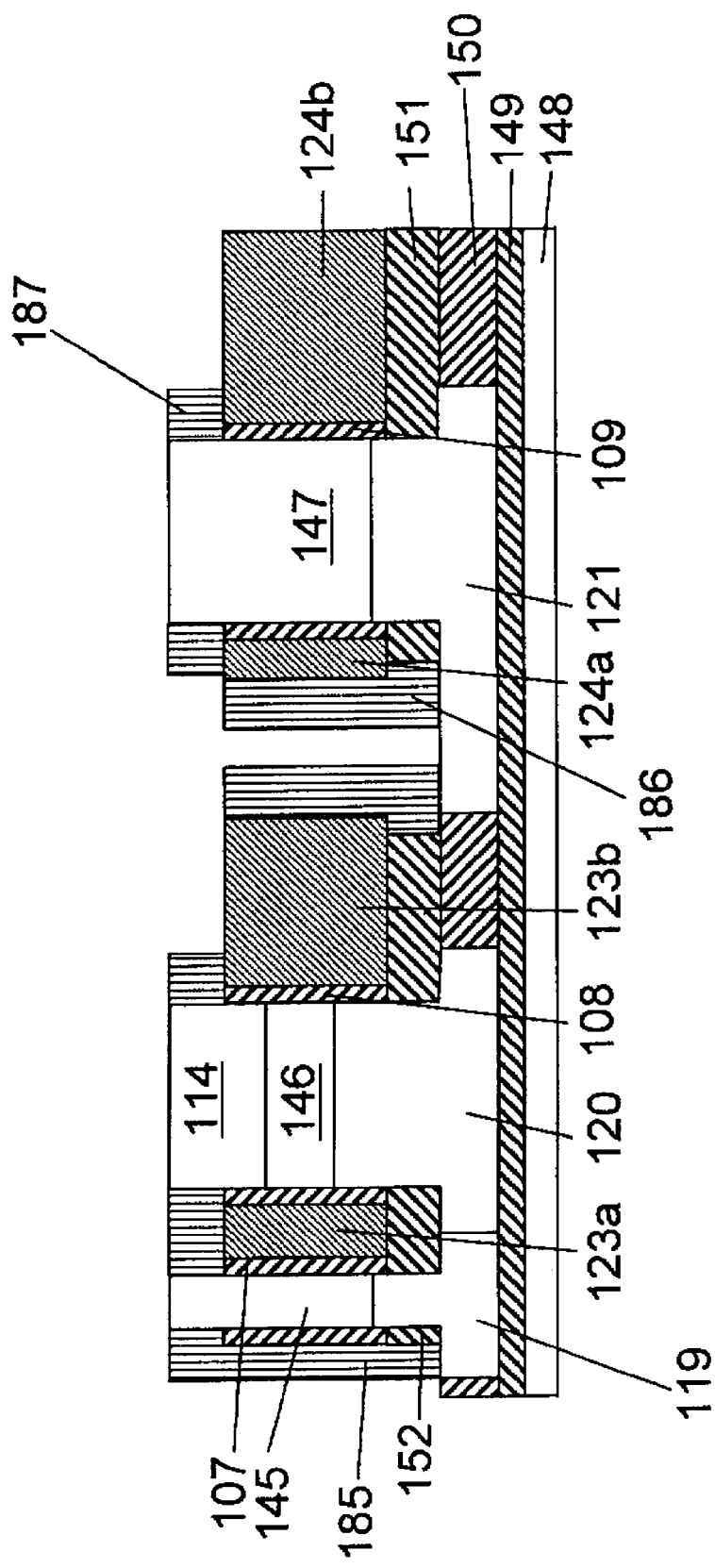
FIG. 54 is a cross-sectional view explaining the method for manufacturing a static memory cell according to the embodiment of the present invention.

Subsequently, as illustrated in FIG. 54, the resist 188 is stripped, and heat treatment is carried out.

Figure 55:
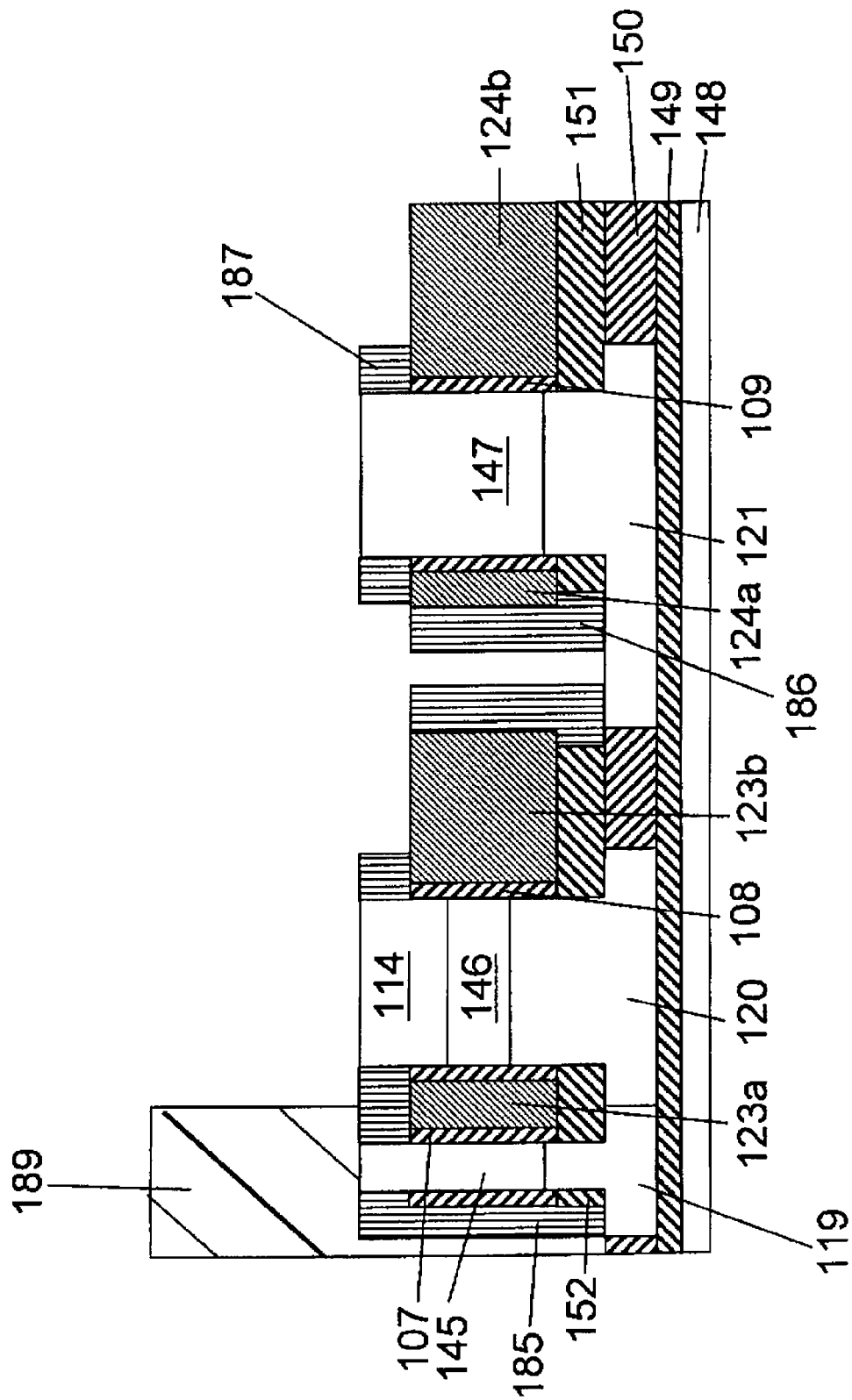
FIG. 55 is a cross-sectional view explaining the method for manufacturing a static memory cell according to the embodiment of the present invention.

Subsequently, as illustrated in FIG. 55, a resist 189 for forming an n+ silicon layer on the top of the island-shaped silicon layer of the access transistor is formed.

Figure 56:
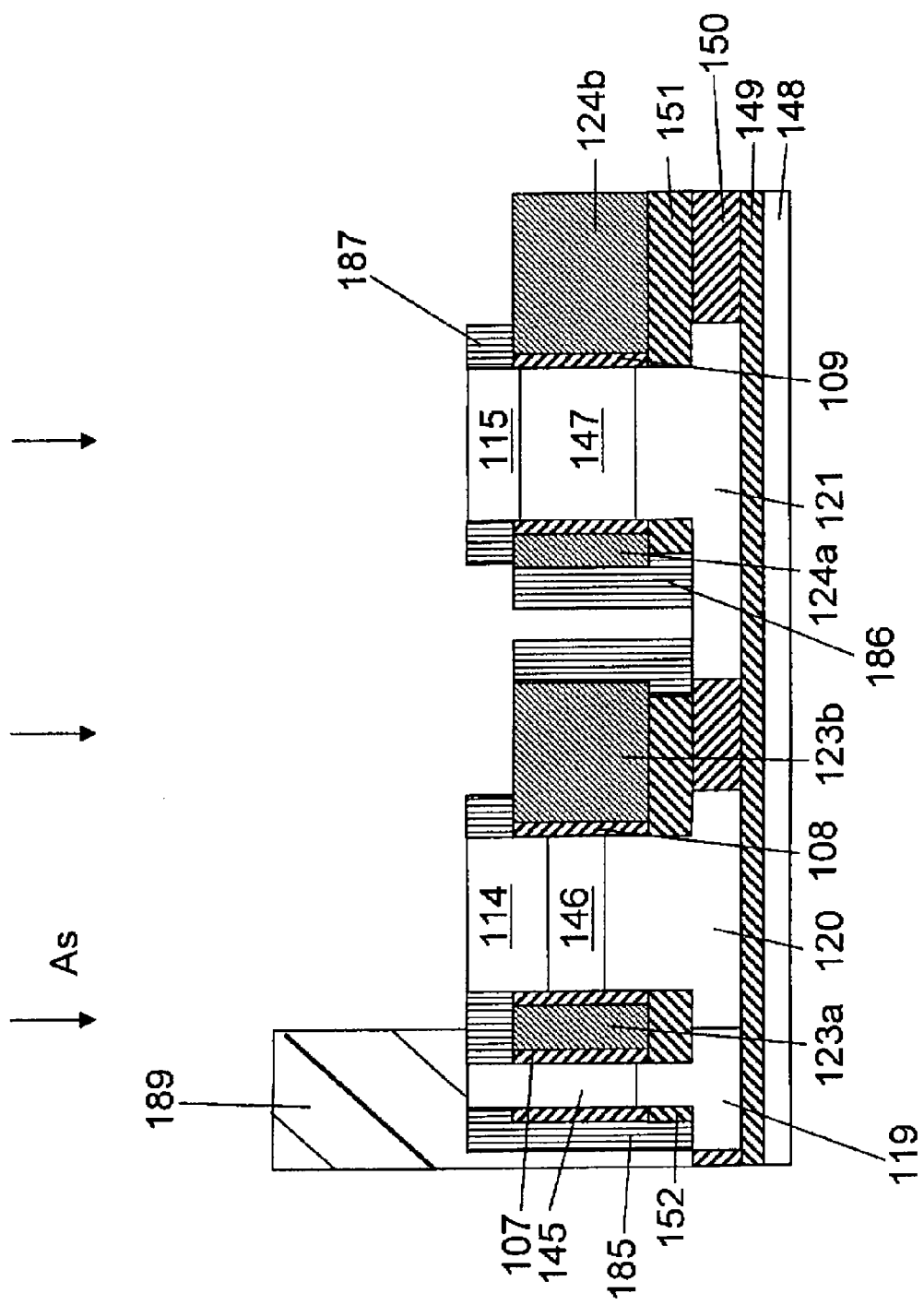
FIG. 56 is a cross-sectional view explaining the method for manufacturing a static memory cell according to the embodiment of the present invention.

Subsequently, as illustrated in FIG. 56, arsenic is implanted to form an n+ silicon layer 115 on the top of the island-shaped silicon layer of the access transistor.

Figure 57:
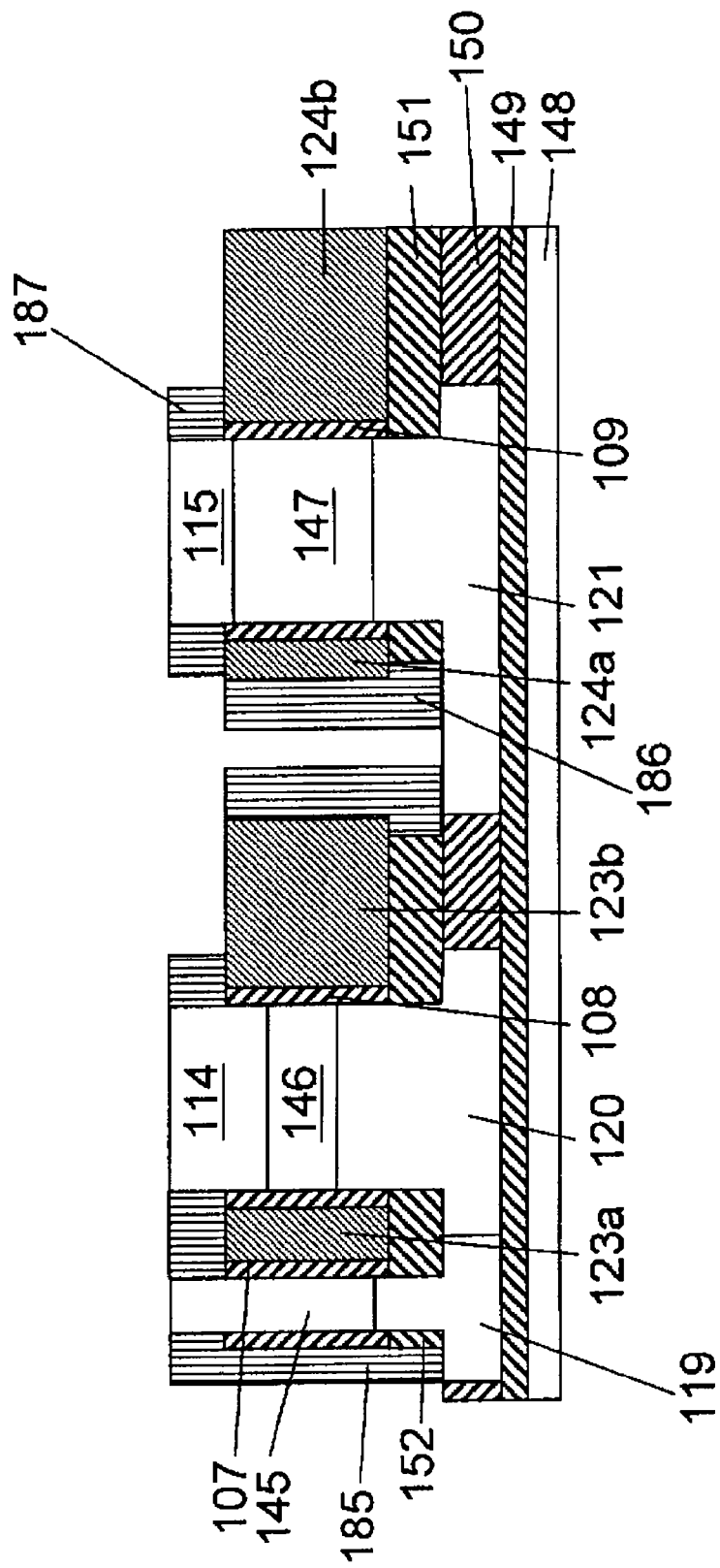
FIG. 57 is a cross-sectional view explaining the method for manufacturing a static memory cell according to the embodiment of the present invention.

Subsequently, as illustrated in FIG. 57, the resist 189 is stripped, and heat treatment is carried out.

Figure 58:
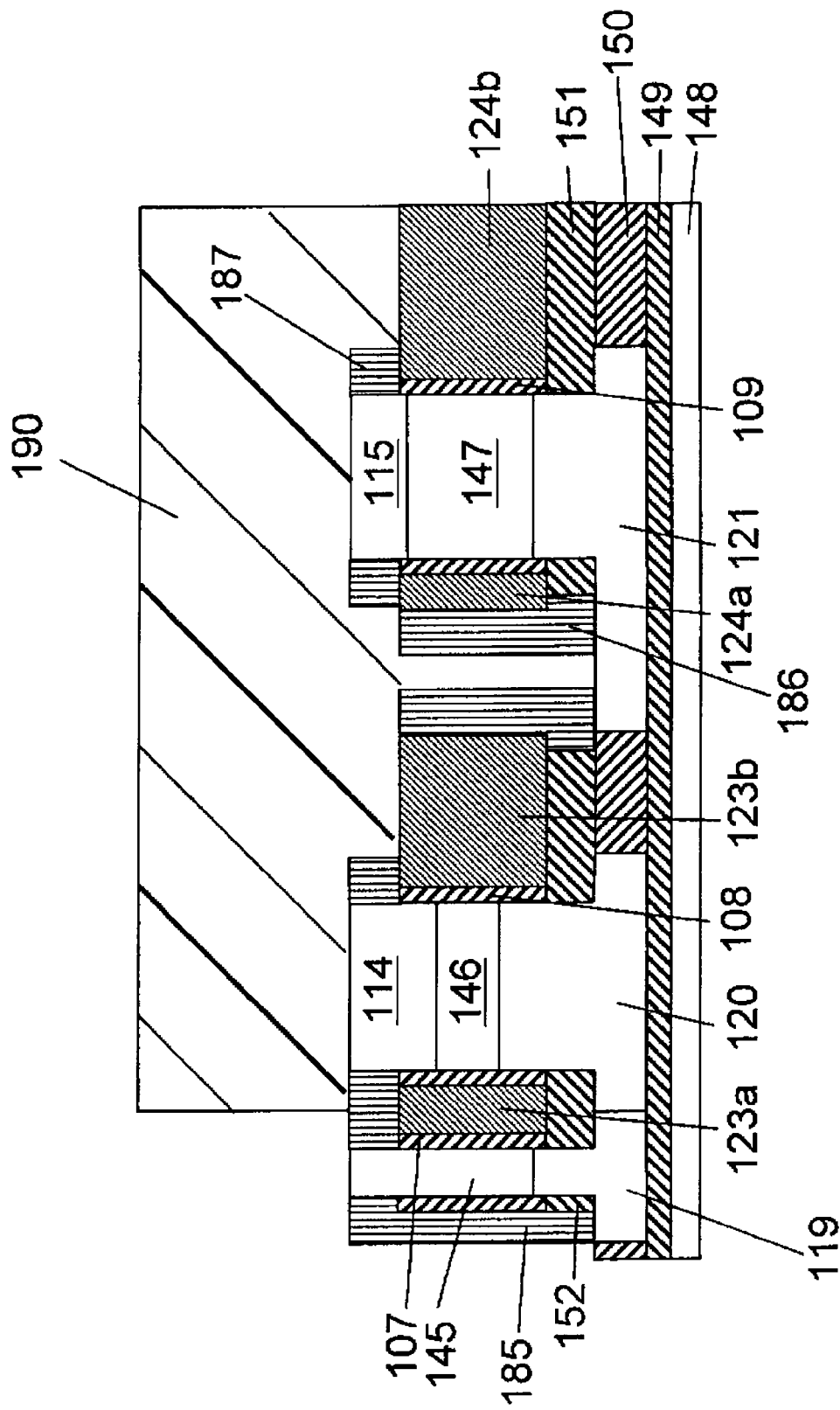
FIG. 58 is a cross-sectional view explaining the method for manufacturing a static memory cell according to the embodiment of the present invention.

Subsequently, as illustrated in FIG. 58, a resist 190 for forming a p+ silicon layer on the top of the arcuate silicon layer of the load transistor is formed.

Figure 59:
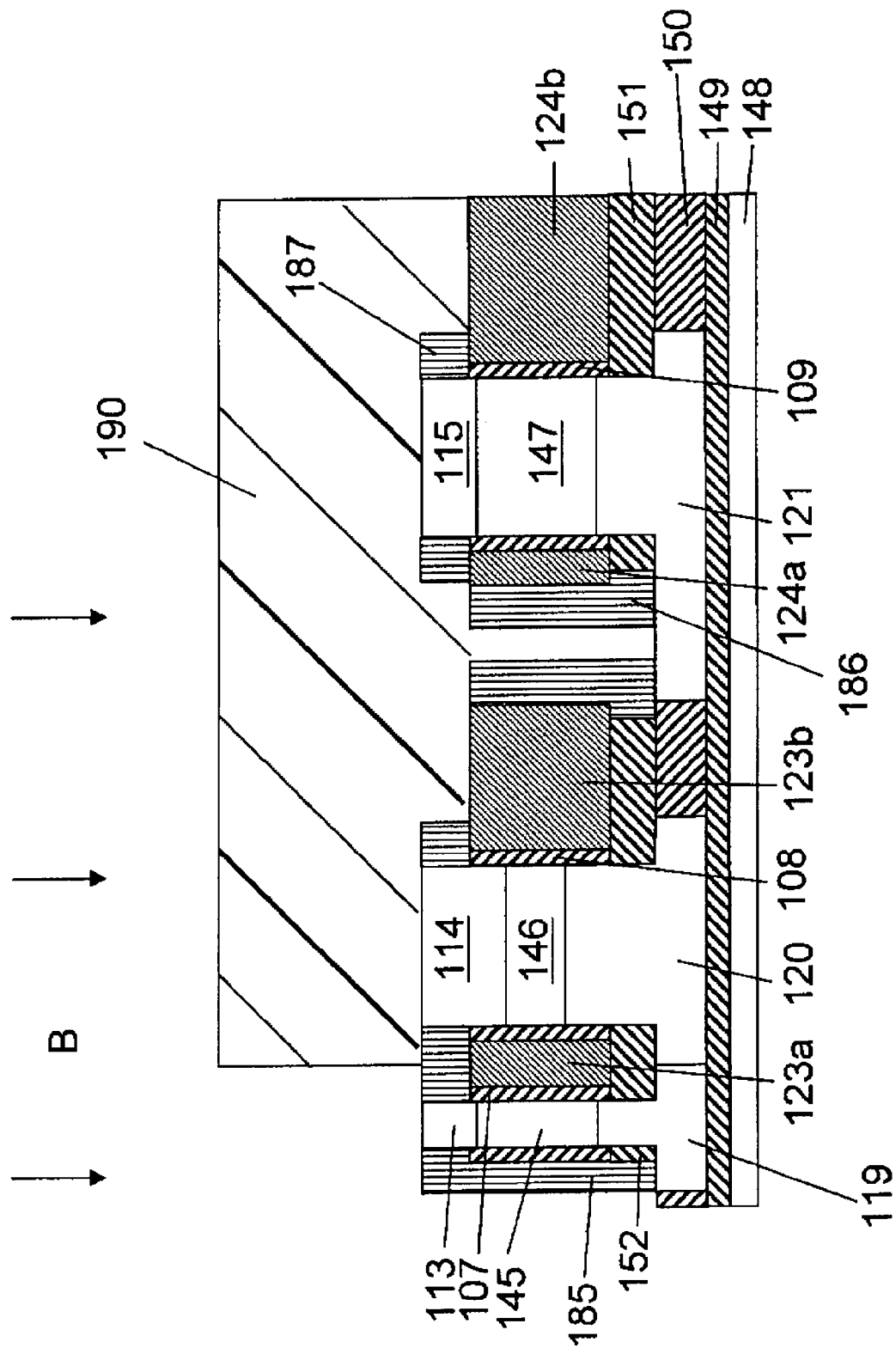
FIG. 59 is a cross-sectional view explaining the method for manufacturing a static memory cell according to the embodiment of the present invention.

Subsequently, as illustrated in FIG. 59, boron is implanted to form a p+ silicon layer 113 on the top of the arcuate silicon layer of the load transistor.

Figure 60:
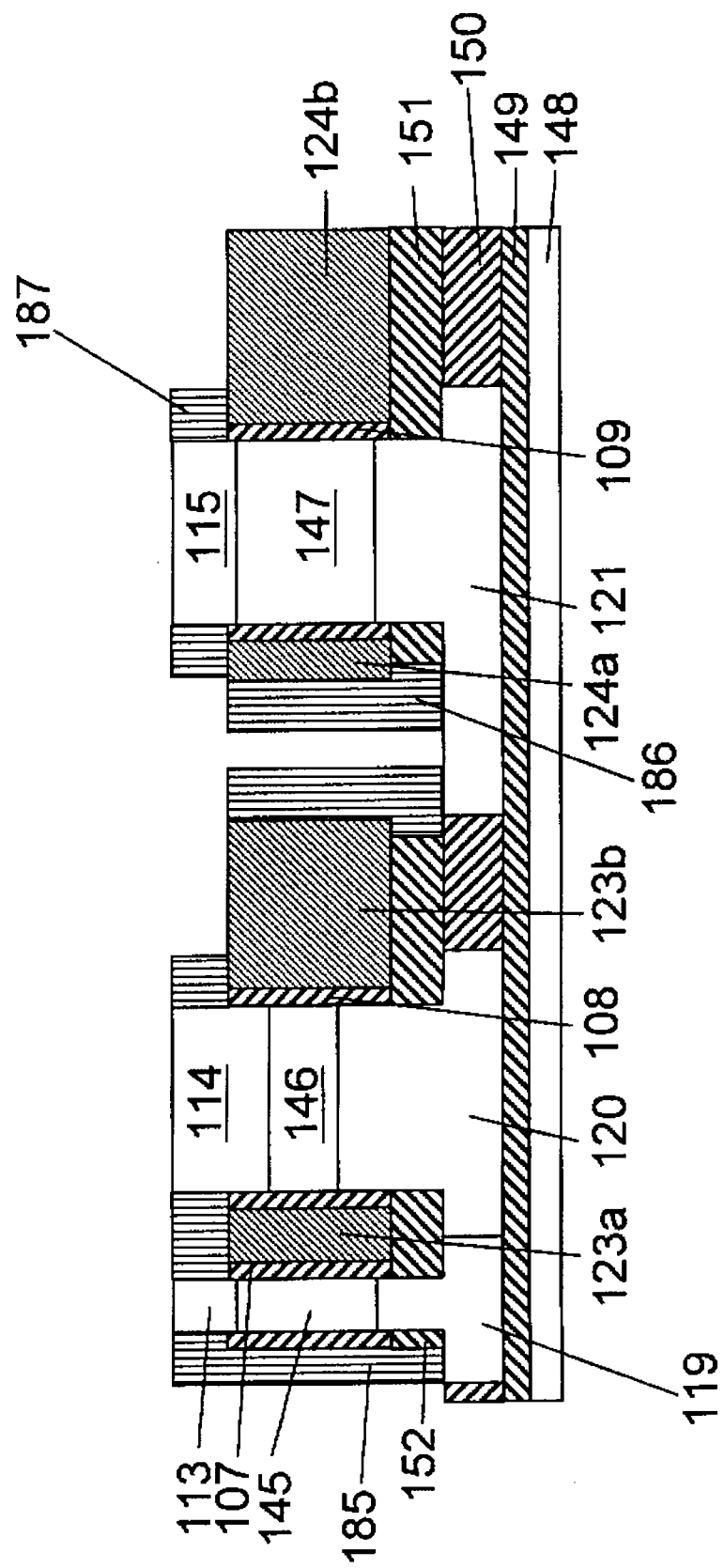
FIG. 60 is a cross-sectional view explaining the method for manufacturing a static memory cell according to the embodiment of the present invention.

Subsequently, as illustrated in FIG. 60, the resist 190 is stripped, and heat treatment is carried out.

Figure 61:
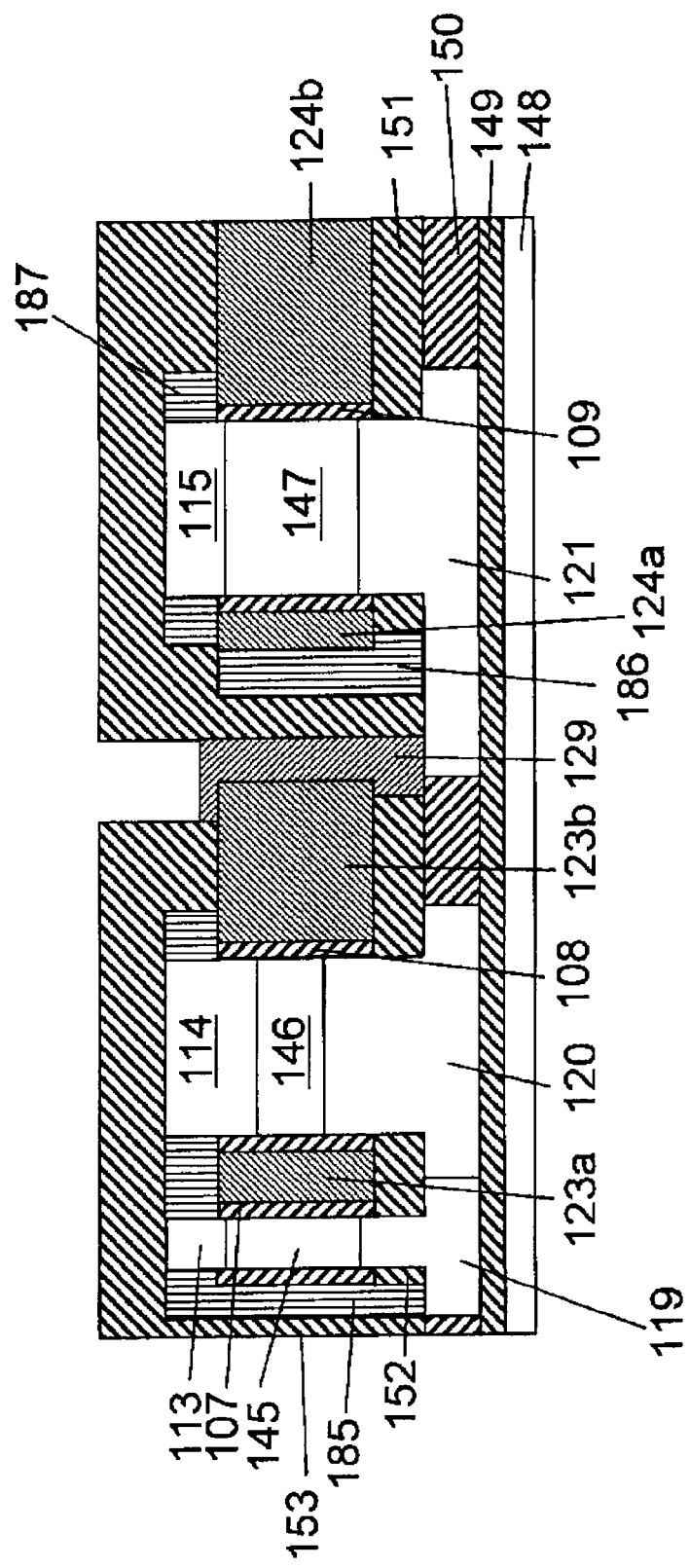
FIG. 61 is a cross-sectional view explaining the method for manufacturing a static memory cell according to the embodiment of the present invention.

Subsequently, although not illustrated in the drawings, a silicide layer is formed. As illustrated in FIG. 61, an interlayer film 153 is deposited, planarized, and etched, and a metal is deposited and etched back to form a contact 129 through which the gate line 123b and the n+ silicon layer 121 are connected to each other.

Figure 62:
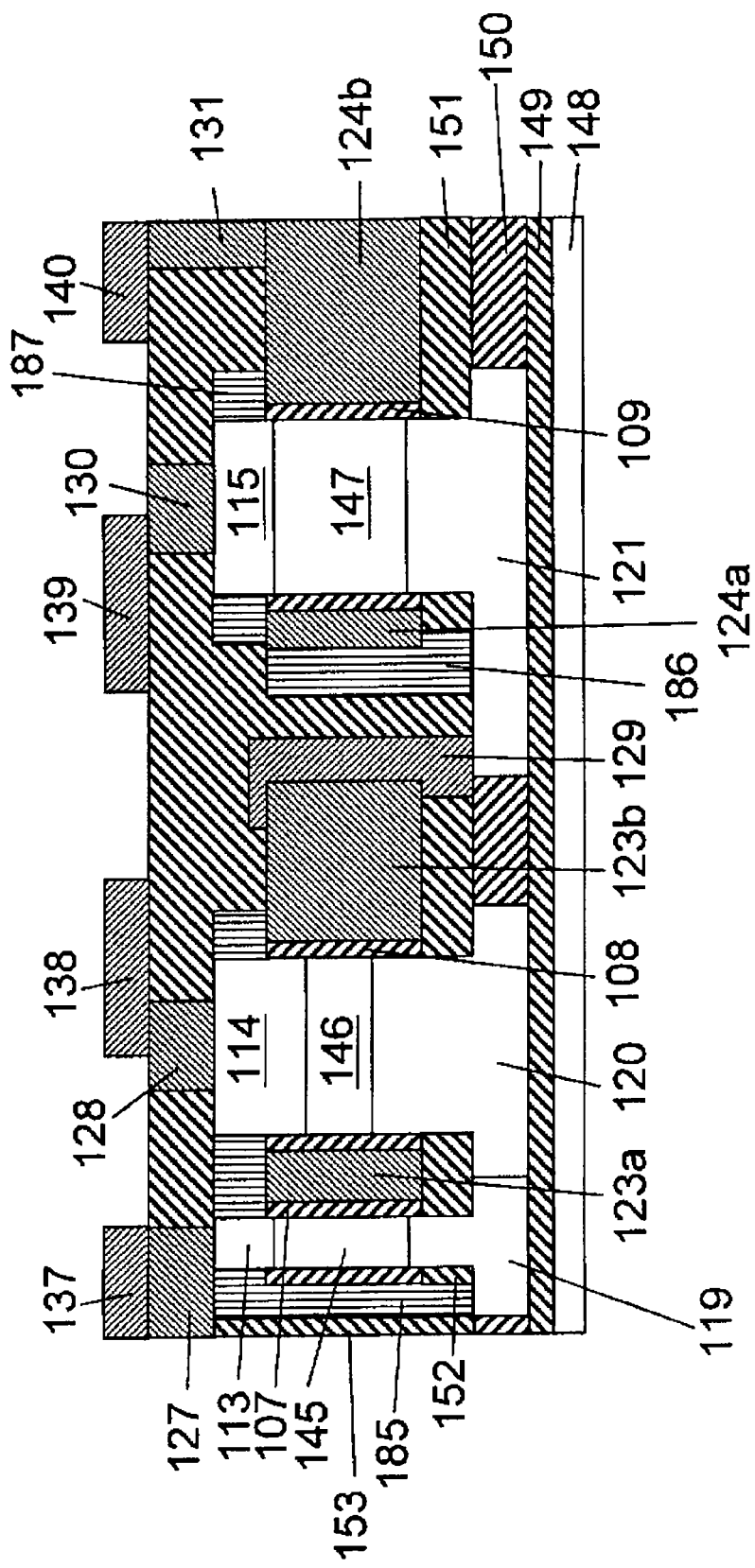
FIG. 62 is a cross-sectional view explaining the method for manufacturing a static memory cell according to the embodiment of the present invention.

Subsequently, as illustrated in FIG. 62, an interlayer film is deposited and planarized, and contacts 127, 128, 130, and 131 are formed. Then, metal lines 137, 138, 139, and 140 are formed.

Accordingly, a manufacturing method for ensuring operational stability by making the channel length of a driver transistor shorter than the channel length of an access transistor has been discussed.

It is to be understood that a variety of embodiments and modifications can be made to the present invention without departing from the broad spirit and scope of the present invention. The foregoing embodiments serve to explain exemplary embodiments of the present invention, and do not limit the technical scope of the present invention.

The invention claimed is:
1. A semiconductor device comprising:
a first inverter disposed in a first row and a first column, including
a first driver transistor which includes
a first gate insulating film that surrounds a periphery of a first island-shaped semiconductor,
a first gate electrode having a first surface that is in contact with the first gate insulating film,
a first first-conductivity-type high-concentration semiconductor disposed on a top of the first island-shaped semiconductor, and
a second first-conductivity-type high-concentration semiconductor disposed on a bottom of the first island-shaped semiconductor,
a first load transistor which includes a second gate insulating film having a first surface that is in contact with a second surface of the first gate electrode, a first arcuate semiconductor which is arcuate when viewed in plan and which is formed so as to be in contact with a portion of a second surface of the second gate insulating film, a first second-conductivity-type high-concentration semiconductor disposed on a top of the first arcuate semiconductor, and a second second-conductivity-type high-concentration semiconductor disposed on a bottom of the first arcuate semiconductor, and a first gate line extending from the first gate electrode and made of a material that is the same as a material of the first gate electrode;

a second inverter disposed in a second row and a second column, including a second driver transistor which includes a third gate insulating film that surrounds a periphery of a second island-shaped semiconductor, a second gate electrode having a first surface that is in contact with the third gate insulating film, a third first-conductivity-type high-concentration semiconductor disposed on a top of the second island-shaped semiconductor, and a fourth first-conductivity-type high-concentration semiconductor disposed on the-a bottom of the second island-shaped semiconductor, a second load transistor which includes a second arcuate semiconductor which is arcuate when viewed in plan and which is formed so as to be in contact with a portion of a second surface of a fourth gate insulating film having a first surface that is in contact with a second surface of the second gate electrode, a third second-conductivity-type high-concentration semiconductor disposed on a top of the second arcuate semiconductor, and a fourth second-conductivity-type high-concentration semiconductor disposed on a bottom of the second arcuate semiconductor, and a second gate line extending from the second gate electrode and made of a material that is the same as a material of the second gate electrode;

a second access transistor disposed in the first row and the second column, including a fifth gate insulating film provided around a periphery of a third island-shaped semiconductor, the fifth gate insulating film being in contact with at least a portion of the periphery of the third island-shaped semiconductor, a third gate electrode, a portion of which is in contact with the fifth gate insulating film, a fifth first-conductivity-type high-concentration semiconductor disposed on a top of the third island-shaped semiconductor, and a sixth first-conductivity-type high-concentration semiconductor disposed on a bottom of the third island-shaped semiconductor; and a first access transistor disposed in the second row and the first column, including a sixth gate insulating film provided around a periphery of a fourth island-shaped semiconductor, the sixth gate insulating film being in contact with at least a portion of the periphery of the fourth island-shaped semiconductor, a fourth gate electrode, a portion of which is in contact with the sixth gate insulating film, a seventh first-conductivity-type high-concentration semiconductor disposed on a top of the fourth island-shaped semiconductor, and an eighth first-conductivity-type high-concentration semiconductor disposed on a bottom of the fourth island-shaped semiconductor, wherein an upper surface of the first gate line is positioned lower than an upper end of the first second-conductivity-type high-concentration semiconductor, an upper surface of the second gate line is positioned lower than an upper end of the third second-conductivity-type high-concentration semiconductor, and a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor.

2. The semiconductor device according to claim 1, wherein a chord of the first arcuate semiconductor has a length equal to or shorter than a diameter of the first gate electrode, and
a chord of the second arcuate semiconductor has a length equal to or shorter than a diameter of the second gate electrode.

3. The semiconductor device according to claim 1, wherein a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor.

4. The semiconductor device according to claim 1, wherein a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

5. The semiconductor device according to claim 1, wherein a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

6. The semiconductor device according to claim 1, wherein the first, second, third, and fourth gate electrodes are of equal length from upper ends to lower ends thereof.

7. The semiconductor device according to claim 6, wherein an upper end of the second first-conductivity-type high-concentration semiconductor of the first driver transistor and an upper end of the fourth first-conductivity-type high-concentration semiconductor of the second driver transistor are positioned higher than an upper end of the eighth first-conductivity-type high-concentration semiconductor of the first access transistor and an upper end of the sixth first-conductivity-type high-concentration semiconductor of the second access transistor.

8. The semiconductor device according to claim 6, wherein a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

9. The semiconductor device according to claim 6, wherein an upper end of the second first-conductivity-type high-concentration semiconductor of the first driver transistor and an upper end of the fourth first-conductivity-type high-concentration semiconductor of the second driver transistor are positioned higher than an upper end of the eighth first-conductivity-type high-concentration semiconductor of the first access transistor and an upper end of the sixth first-conductivity-type high-concentration semiconductor of the second access transistor, and a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

10. The semiconductor device according to claim 1, wherein a peripheral length of the fourth island-shaped semiconductor of the first access transistor and a peripheral length of the third island-shaped semiconductor of the second access transistor are shorter than a peripheral length of the first island-shaped semiconductor of the first driver transistor and a peripheral length of the second island-shaped semiconductor of the second driver transistor.

11. The semiconductor device according to claim 1, wherein
the second gate insulating film surrounds the first arcuate semiconductor,
the first gate electrode surrounds the second gate insulating film,
the fourth gate insulating film surrounds the second arcuate semiconductor, and
the second gate electrode surrounds the fourth gate insulating film.

12. The semiconductor device according to claim 11, wherein
a chord of the first arcuate semiconductor has a length equal to or shorter than a diameter of the first gate electrode, and
a chord of the second arcuate semiconductor has a length equal to or shorter than a diameter of the second gate electrode.

13. The semiconductor device according to claim 11, wherein
a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor.

14. The semiconductor device according to claim 11, wherein
a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor are shorter than a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor.

15. The semiconductor device according to claim 11, wherein
a length of a portion between the seventh first-conductivity-type high-concentration semiconductor and the eighth first-conductivity-type high-concentration semiconductor of the first access transistor and a length of a portion between the fifth first-conductivity-type high-concentration semiconductor and the sixth first-conductivity-type high-concentration semiconductor of the second access transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

16. The semiconductor device according to claim 11, wherein
a length of a portion between the first second-conductivity-type high-concentration semiconductor and the second second-conductivity-type high-concentration semiconductor of the first load transistor and a length of a portion between the third second-conductivity-type high-concentration semiconductor and the fourth second-conductivity-type high-concentration semiconductor of the second load transistor are in a range of 1.3 times to three times a length of a portion between the first first-conductivity-type high-concentration semiconductor and the second first-conductivity-type high-concentration semiconductor of the first driver transistor and a length of a portion between the third first-conductivity-type high-concentration semiconductor and the fourth first-conductivity-type high-concentration semiconductor of the second driver transistor.

17. The semiconductor device according to claim 11, wherein
the first, second, third, and fourth gate electrodes are of equal length from upper ends to lower ends thereof.

18. The semiconductor device according to claim 17, wherein
an upper end of the second first-conductivity-type high-concentration semiconductor of the first driver transistor and an upper end of the fourth first-conductivity-type high-concentration semiconductor of the second driver transistor are positioned higher than an upper end of the eighth first-conductivity-type high-concentration semiconductor of the first access transistor and an upper end of the sixth first-conductivity-type high-concentration semiconductor of the second access transistor.

19. The semiconductor device according to claim 17, wherein
a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

20. The semiconductor device according to claim 17, wherein
an upper end of the second first-conductivity-type high-concentration semiconductor of the first driver transistor and an upper end of the fourth first-conductivity-type high-concentration semiconductor of the second driver transistor is positioned higher than an upper end of the eighth first-conductivity-type high-concentration semiconductor of the first access transistor and an upper end of the sixth first-conductivity-type high-concentration semiconductor of the second access transistor, and
a lower end of the first first-conductivity-type high-concentration semiconductor of the first driver transistor and a lower end of the third first-conductivity-type high-concentration semiconductor of the second driver transistor are positioned lower than a lower end of the seventh first-conductivity-type high-concentration semiconductor of the first access transistor and a lower end of the fifth first-conductivity-type high-concentration semiconductor of the second access transistor.

21. The semiconductor device according to claim 11, wherein
a peripheral length of the fourth island-shaped semiconductor of the first access transistor and a peripheral length of the third island-shaped semiconductor of the second access transistor are shorter than a peripheral length of the first island-shaped semiconductor of the first driver transistor and a peripheral length of the second island-shaped semiconductor of the second driver transistor.

22. The semiconductor device according to claim 11, wherein
the first inverter further includes, in addition to the first driver transistor including the first island-shaped semiconductor, a third driver transistor including a third arcuate semiconductor which is arcuate when viewed in plan, and
the second inverter further includes, in addition to the second driver transistor including the second island-shaped semiconductor, a fourth driver transistor including a fourth arcuate semiconductor which is arcuate when viewed in plan.

23. A method for manufacturing the semiconductor device according to claim 7, comprising in sequence:
forming the second first-conductivity-type high-concentration semiconductor of the first driver transistor and the fourth first-conductivity-type high-concentration semiconductor of the second driver transistor; and
forming the eighth first-conductivity-type high-concentration semiconductor of the first access transistor and the sixth first-conductivity-type high-concentration semiconductor of the second access transistor.

24. A method for manufacturing the semiconductor device according to claim 8, comprising:
forming the first first-conductivity-type high-concentration semiconductor of the first driver transistor, the third first-conductivity-type high-concentration semiconductor of the second driver transistor, the seventh first-conductivity-type high-concentration semiconductor of the first access transistor, and the fifth first-conductivity-type high-concentration semiconductor of the second access transistor so that energy of ion implantation for forming the first first-conductivity-type high-concentration semiconductor of the first driver transistor and the third first-conductivity-type high-concentration semiconductor of the second driver transistor is higher than energy of ion implantation for forming the seventh first-conductivity-type high-concentration semiconductor of the first access transistor and the fifth first-conductivity-type high-concentration semiconductor of the second access transistor.

* * * * *